(12) United States Patent
Kesler et al.

(10) Patent No.: US 8,521,480 B2
(45) Date of Patent: Aug. 27, 2013

(54) MANAGING NON-DESTRUCTIVE EVALUATION DATA

(75) Inventors: Joseph M. Kesler, Cincinnati, OH (US); Uriah M. Liggett, Independence, KY (US); Richard A. Roth, II, Cincinnati, OH (US); Thomas D. Sharp, Terrace Park, OH (US)

(73) Assignee: Etegent Technologies, Ltd., Cincinnati, OH (US)

( * ) Notice: Subject to any disclaimer, the term of this patent is extended or adjusted under 35 U.S.C. 154(b) by 714 days.

(21) Appl. No.: 12/617,315

(22) Filed: Nov. 12, 2009

(65) Prior Publication Data
US 2010/0235112 A1    Sep. 16, 2010

Related U.S. Application Data

(63) Continuation-in-part of application No. 12/403,274, filed on Mar. 12, 2009, now Pat. No. 8,108,168.

(51) Int. Cl.
*G06F 17/50*    (2006.01)

(52) U.S. Cl.
USPC .................................. 703/1; 702/34; 382/141

(58) Field of Classification Search
USPC .................................................. 703/1, 7, 14
See application file for complete search history.

(56) References Cited

U.S. PATENT DOCUMENTS

| | | | |
|---|---|---|---|
| 4,141,347 A | 2/1979 | Green et al. | |
| 4,649,380 A | 3/1987 | Penna | |
| 4,872,130 A | 10/1989 | Pagano | |
| 4,876,728 A | 10/1989 | Roth | |
| 5,027,110 A | 6/1991 | Chang et al. | |
| 5,028,100 A | 7/1991 | Valleau et al. | |
| 5,042,305 A | 8/1991 | Takishita | |
| 5,088,045 A | 2/1992 | Shimanaka et al. | |
| 5,146,556 A | 9/1992 | Hullot et al. | |
| 5,168,530 A | 12/1992 | Peregrim et al. | |

(Continued)

OTHER PUBLICATIONS

International Searching Authority, International Search Report and Written Opinion of the International Searching Aughority, or the Declaration, Mar. 10, 2010, 20 pgs.

(Continued)

*Primary Examiner* — Mary C Jacob
(74) *Attorney, Agent, or Firm* — Wood Herron & Evans LLP

(57) ABSTRACT

Embodiments of the invention include methods to manage non-destructive evaluation ("NDE") data. The method includes receiving NDE data for at least a portion of an asset along with inspection information associated with the at least a portion of the asset, and determining at least one alignment algorithm to align the NDE data to a simulated model of the at least a portion of the asset based on at least one of the NDE data or the inspection information. The method further includes automatically aligning The NDE data to the simulated model with the at least one alignment algorithm and analyzing the aligned NDE data on the simulated model to determine coverage of the simulated model by the NDE data. Additional methods include retrieving NDE data that has previously been aligned to the simulated model and determining coverage or determining trends associated with indications thereof.

37 Claims, 28 Drawing Sheets

(56) References Cited

U.S. PATENT DOCUMENTS

| | | | |
|---|---|---|---|
| 5,293,326 A | | 3/1994 | Arima et al. |
| 5,371,462 A | * | 12/1994 | Hedengren et al. ........... 324/225 |
| 5,459,410 A | | 10/1995 | Henley |
| 5,475,613 A | | 12/1995 | Itoga et al. |
| 5,541,846 A | | 7/1996 | Secrest |
| 5,550,376 A | | 8/1996 | Gupta et al. |
| 5,568,263 A | | 10/1996 | Hanna |
| 5,608,814 A | | 3/1997 | Gilmore et al. |
| 5,619,429 A | | 4/1997 | Aloni et al. |
| 5,640,199 A | | 6/1997 | Garakani et al. |
| 5,655,084 A | | 8/1997 | Pinsky et al. |
| 5,706,213 A | | 1/1998 | Takakura et al. |
| 5,734,742 A | | 3/1998 | Asaeda et al. |
| 5,848,115 A | | 12/1998 | Little |
| 6,064,759 A | | 5/2000 | Buckley et al. |
| 6,259,960 B1 | | 7/2001 | Inokuchi |
| 6,314,379 B1 | | 11/2001 | Hu et al. |
| 6,378,387 B1 | * | 4/2002 | Froom ......................... 73/865.8 |
| 6,508,403 B2 | | 1/2003 | Arsenault |
| 6,546,137 B1 | | 4/2003 | Lai |
| 6,549,820 B1 | | 4/2003 | Barrett et al. |
| 6,714,679 B1 | | 3/2004 | Scola |
| 6,760,639 B2 | | 7/2004 | Kallela et al. |
| 6,820,023 B1 | | 11/2004 | Klassen et al. |
| 6,848,081 B1 | | 1/2005 | Yoda et al. |
| 6,882,745 B2 | | 4/2005 | Brankner |
| 6,985,238 B2 | | 1/2006 | Isaacs et al. |
| 7,024,032 B2 | | 4/2006 | Kidd et al. |
| 7,027,642 B2 | * | 4/2006 | Rubbert et al. ............... 382/154 |
| 7,069,263 B1 | | 6/2006 | Yee |
| 7,116,825 B2 | | 10/2006 | Lee |
| 7,149,342 B2 | | 12/2006 | Biazik et al. |
| 7,162,373 B1 | | 1/2007 | Kadioglu et al. |
| 7,327,869 B2 | | 2/2008 | Boyer |
| 7,409,081 B2 | | 8/2008 | Ogi |
| 7,801,353 B2 | * | 9/2010 | Almogy et al. ............... 382/141 |
| 7,865,316 B2 | * | 1/2011 | Turner et al. .................... 702/39 |
| 2002/0088282 A1 | | 7/2002 | Zayicek et al. |
| 2004/0073411 A1 | | 4/2004 | Alston et al. |
| 2004/0117133 A1 | | 6/2004 | Burkhardt |
| 2004/0121496 A1 | | 6/2004 | Brankner et al. |
| 2007/0112539 A1 | | 5/2007 | Kirchner |
| 2007/0280527 A1 | | 12/2007 | Almogy et al. |
| 2008/0263469 A1 | | 10/2008 | Nasle et al. |
| 2008/0306709 A1 | * | 12/2008 | Fisker et al. ................... 702/167 |
| 2009/0048789 A1 | | 2/2009 | Yu et al. |
| 2009/0287427 A1 | * | 11/2009 | Dubois et al. .................... 702/39 |

OTHER PUBLICATIONS

Roth, D.J., Tokars, R.P., Martin, R.E., Rauser, R.W., Aldrin, J.C., "Ultrasonic Phased Array Inspection Simulations of Welded Components at NASA," Mar. 3, 2009, retrieved from the Internet Feb. 22, 2010, 19 pgs.

Buckley, J., Servent, R., "Improvements in Ultrasonic Inspection of Resistance Spot Welds," The British Institute of Non-Destructive Testing, Feb. 2009, retrieved from the Internet Feb. 22, 2010, 11 pgs.

Deng, W., Matuszewski, B.J., Shark,L-K., Smith, J.P. and Cavaccini, G., Multi-Modality NDT Image Fusion and It's Mapping on Curved 3D CAD Surface, World Conference NDT, 2004. (8 pages).

Matuszewski, B.J., Shark, L-K, Smith, J.P. and Varley, M.R., Automatic Fusion of Multiple Non-Destructive Testing Images and CAD Models, Image Processing and it's Applications, Conference Publication No. 465, 1999. (5 pages).

Deng, W., Shark, L-K, Matuszewski, B.J., Smith J.P. and Cavaccini, G., CAD Model-Based Inspection and Visualisation for 3D Non-Destructive Testing of Complex Aerostructures, Insight vol. 46, Mar. 2004, pp. 157-161. (5 pages).

Noble, A., Gupta, R., Mundy, J., Schmitz, A., Hartley, R. and Hoffman, W., CAD-Based Inspection Using X-Ray Stereo, IEEE International Conference on Robotics and Automation 0-7803-1965-6195, 1995. (6 pages).

Power INSPECT, downloaded from www.delcam.com on Sep. 2008. (2 pages).

Kesler, Joseph M., Automated Alignment of Aircraft Wing Radiography Images Using a Modified Rotation, Scale, and Translation Invariant Phase Correlation Algorithm Employing Local Entropy for Peak Detection, Thesis submitted to Department of Electrical and Computer Engineering, University of Cincinnati, College of Engineering, Division of Graduate Studies, Aug. 12, 2008. (79 pages).

U.S. Patent and Trademark Office, Office Action issued in related U.S. Appl. No. 12/403,274, dated Aug. 23, 2011.

U.S. Patent and Trademark Office, Notice of Allowance issued in related U.S. Appl. No. 12/403,274, dated Nov. 30, 2010.

U.S. Patent and Trademark Office, Office Action issued in related U.S. Appl. No. 12/557,136 dated Aug. 31, 2012.

F. Lu, Globally consistent range scan alignment for environment mapping, Apr. 17, 1997, p. 1-31.

U.S. Patent and Trademark Office, Office Action issued in related U.S. Appl. No. 12/557,136, dated Dec. 13, 2012.

U.S. Patent and Trademark Office, Notice of Allowance issued in related U.S. Appl. No. 12/557,136, dated Feb. 25, 2013.

Supplementary European Search Report, European Search Report and Written Opinion of the European Patent Office, Dec. 13, 2012.

* cited by examiner

US 8,521,480 B2

MANAGING NON-DESTRUCTIVE EVALUATION DATA

CROSS-REFERENCE TO RELATED APPLICATION

This application is a continuation-in-part of U.S. application Ser. No. 12/403,274 to Joseph M. Kesler et al., entitled "MANAGING NON-DESTRUCTIVE EVALUATION DATA," filed Mar. 12, 2009 (SDL/08). This application is also related to U.S. application Ser. No. 12/557,136 to Joseph M. Kesler et al., entitled "MANAGING NON-DESTRUCTIVE EVALUATION DATA," filed Sep. 10, 2009 (SDL/08A), which is a continuation of the aforementioned '274 application. The disclosures of both of these applications are hereby incorporated by reference herein.

GOVERNMENT RIGHTS

Certain aspects of this invention were made with government support under Grant/Contract No. FA8650-07-C-5210 awarded by the United States Air Force/Air Force Material Command DET 1 Air Force Research Laboratory/PKMM. The U.S. Government may have certain rights in the invention.

FIELD OF THE INVENTION

The present invention relates to computing systems, and more particularly to the management and automatic alignment of non-destructive evaluation ("NDE") data.

BACKGROUND OF THE INVENTION

Non-destructive Evaluation and Inspection ("NDE/I") technologies generally provide ways to nondestructively scan, image, sense or otherwise evaluate characteristics of materials and/or components. In particular, NDE/I technologies may be used to detect minute flaws and defects in those materials and/or component parts. As such, NDE/I technologies have become increasingly used to help assure structural and functional integrity, safety, and cost effective sustainment of various assets, during both initial manufacture and operational service. More specifically, NDE/I technologies have been increasingly used in determining the wear and tear of assets that are pushed to their physical limits, such as military vehicles. As the average age of the various assets increases, particularly beyond the originally contemplated design life, the importance of using NDE/I technologies to detect structural damage before that damage advances to structural failure is paramount.

Non-destructive evaluation ("NDE") data is often gathered from NDE data collection devices and may include x-ray images of at least a portion of an asset, such as the wing of an aircraft. By analyzing a dataset of NDE data, defects or other structural irregularities of the asset at the location associated with that dataset of NDE data can be detected. However, this NDE data is typically difficult to manage and handle. For example, the NDE data is often large in size, associated with merely a portion of the asset, and also must be matched with a particular location on the asset. To determine wear and tear, structural damage and/or other irregularities of an entire component of an asset may require the analysis of tens (if not hundreds) of individual datasets of NDE data. This results in numerous datasets of NDE data for each asset, and thus even more datasets of NDE data for a fleet of assets. As each dataset of NDE data is often inspected, this results in large amounts of data that are difficult to categorize and otherwise analyze in whole. Moreover, the NDE data may be discarded after it has been analyzed, and thus there is often little NDE data for an asset over time. Thus, when a potential problem is indicated, it is often difficult to track that indication on an asset through time, analyze that indication in relation to other indications of the asset, and analyze that indication in relation to indications of a plurality of similar assets.

As the amount of NDE data increases, so do associated costs and needs for users trained to perform inspections. Although NDE data collection devices may produce digital data, the digital data is being generated without systems in place to manage and archive the collected information. Moreover, the analysis of NDE data is often laborious and crude. Some conventional systems receive NDE data and align it to a simulated model of a portion of an asset through the use of manual tools. However, these manual tools require human interaction and generally require a user experienced with that NDE data and/or asset to align and analyze that NDE data. Although some conventional systems have used automatic alignment of the NDE data, these methods often fail as a method of alignment for one dataset of NDE data is typically not useful for another dataset of NDE data. Thus, conventional systems are typically unable to align datasets of NDE data that are in turn associated multiple modalities (e.g., datasets of NDE data captured with various NDE data collection devices). This often has the effect of tying particular method of alignments to particular NDE data collection devices, and thus increases the cost of NDE data capture and analysis.

Consequently, there is a continuing need to manage datasets of NDE data of an asset or fleet of assets over time, as well as a continuing need to support the alignment of multiple modalities of NDE data in an extensible platform that supports NDE data fusion.

SUMMARY OF THE INVENTION

Embodiments of the invention provide for a method, apparatus, and program product to manage non-destructive evaluation ("NDE") data associated with at least a portion of an asset. In some embodiments, a method of managing NDE data comprises receiving NDE data for at least a portion of an asset, including receiving inspection information associated with the at least a portion of the asset. The method further comprises determining at least one alignment algorithm to align the NDE data to a simulated model of the at least a portion of the asset based upon at least one of the NDE data and the inspection information and automatically aligning the NDE data to the simulated model with the at least one alignment algorithm. The method further comprises analyzing the aligned NDE data on the simulated model to determine coverage of the simulated model by the NDE data.

In additional embodiments, a method of managing NDE data comprises retrieving NDE data for at least a portion of an asset, the NDE data having previously been aligned to a simulated model of the at least a portion of the asset, and determining coverage of the simulated model by the NDE data.

In still further additional embodiments, a method of managing NDE data comprises retrieving first NDE data for at least a portion of an asset, the first NDE data having previously been aligned to a simulated model of the at least a portion of the asset, and retrieving second NDE data for the at least a portion of the asset, the second NDE data having previously been aligned to the simulated model. The method further comprises determining an indication of a potential problem associated with at least one of the first NDE data and the second NDE data, including determining a trend associated with the indication in turn associated with a difference between the first NDE data and the second NDE data.

These and other advantages will be apparent in light of the following figures and detailed description.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

It should be understood that the appended drawings are not necessarily to scale, presenting a somewhat simplified representation of various preferred features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments may have been enlarged or distorted relative to others to facilitate visualization and clear understanding.

DETAILED DESCRIPTION

Embodiments of the invention provide for a method, apparatus, and program product to manage non-destructive evaluation ("NDE") data associated with at least a portion of an asset. In particular, embodiments of the invention provide for aligning NDE data with a simulated model associated with the at least a portion of the asset for inspection thereof. In some embodiments, the NDE data is associated with inspection information. The inspection information may include at least one indication of a potential problem and a location thereof on the NDE data. In some embodiments, the at least one indication is aligned to the simulated model and viewed. In additional embodiments, a plurality of datasets of NDE data (e.g., a plurality of individual instances of NDE data), at least some of which is associated with inspection information, is aligned to the simulated model. As such, indications in turn associated with the inspection information of the plurality of datasets may be viewed for trends of indications, including trends of indications of one or more assets over time.

Hardware and Software Environment

Figure 1:
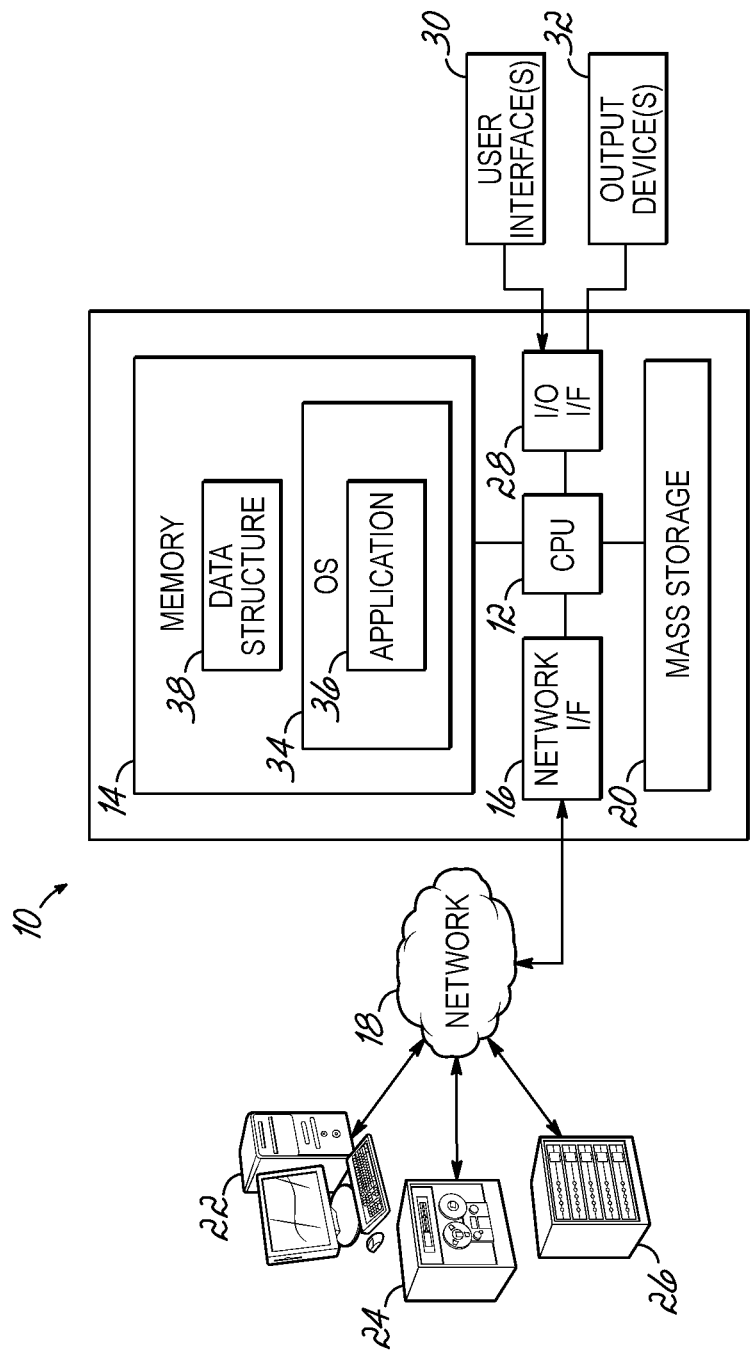
FIG. 1 is a diagrammatic illustration of a computer configured to accomplish the management of non-destructive evaluation ("NDE") data consistent with embodiments of the invention.

Turning to the drawings, wherein like numbers denote like parts throughout the several views, FIG. 1 illustrates a hardware and software environment for an apparatus 10 for managing non-destructive evaluation data consistent with embodiments of the invention. Apparatus 10, for purposes of this invention, may represent any type of computer, computing system, server, disk array, or programmable device such as a multi-user computer, single-user computer, handheld device, networked device, mobile phone, gaming system, etc. Apparatus 10 may be implemented using one or more networked computers, e.g., in a cluster or other distributed computing system. Apparatus 10 will be referred to as "computer" for brevity sake, although it should be appreciated that the term "apparatus" may also include other suitable programmable electronic devices consistent with the invention.

Computer 10 typically includes at least one central processing unit ("CPU") 12 coupled to a memory 14. Each CPU 12 may be one or more microprocessors, micro-controllers, field programmable gate arrays, or ASICs, while memory 14 may include random access memory (RAM), dynamic random access memory (DRAM), static random access memory (SRAM), flash memory, and/or another digital storage medium. As such, memory 14 may be considered to include memory storage physically located elsewhere in computer 10, e.g., any cache memory in the at least one CPU 12, as well as any storage capacity used as a virtual memory, e.g., as stored on a mass storage device, a computer, or another controller coupled to computer 10 through a network interface 16 (illustrated as, and hereinafter, "network I/F" 16) by way of a network 18. The computer may include a mass storage device 20, which may also be a digital storage medium, and in specific embodiments includes at least one hard disk drive. Additionally, mass storage device 20 may be located externally to computer 10, such as in a separate enclosure or in one or more networked computers 22, one or more networked storage devices 24 (including, for example, a tape drive), and/or one or more other networked devices 26 (including, for example, a server). The computer may communicate with networked computers 22, networked storage devices 24, and/or networked devices 26 through network 18.

The computer 10 may also include peripheral devices connected to the computer through an input/output device interface 28 (illustrated as, and hereinafter, "I/O I/F" 28). In particular, the computer 10 may receive data from a user through at least one user interface 30 (including, for example, a keyboard, mouse, and/or other user interface) and/or output data to a user through at least one output device 32 (including, for example, a display, speakers, and/or another output device).

Moreover, in some embodiments, the I/O I/F 28 communicates with a device that includes a user interface 30 and at least one output device 32 in combination, such as a touchscreen (not shown).

Computer 10 may be under the control of an operating system 34 and execute or otherwise rely upon various computer software applications, components, programs, files, objects, modules, etc. (illustrated as "application" 36) for managing non-destructive evaluation ("NDE") data consistent with embodiments of the invention as described herein. Moreover, computer 10 may include at least one data structure 38 to store various data consistent with embodiments of the invention. The data structure 38 in turn may include at least one database, list, array, table, data entry, file, and/or another data structure for use by the application 36, computer 10, and/or components thereof. It will be appreciated that various applications, components, programs, objects, modules, etc. may also execute on one or more processors in another networked device coupled to computer 10 via the network 18, e.g., in a distributed or client-server computing environment.

Figure 2:
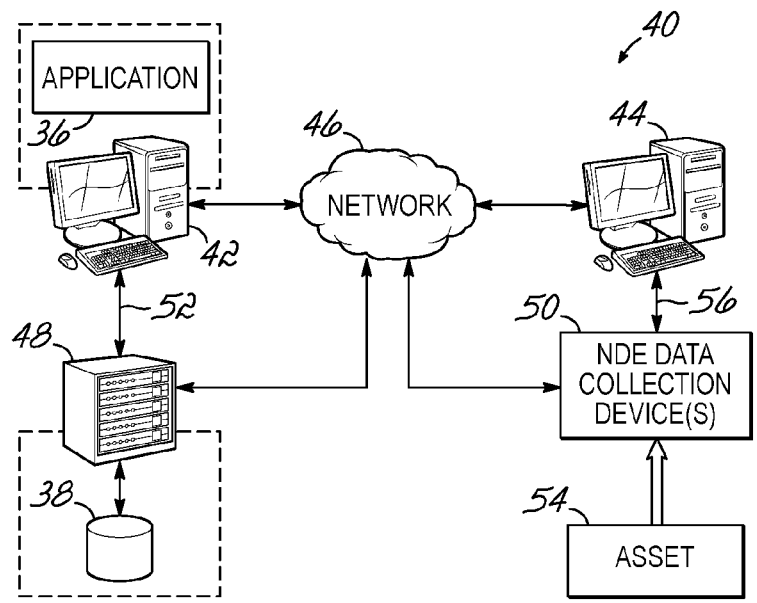
FIG. 2 is a diagrammatic illustration of an alternative embodiment of a computer configured to accomplish the management of NDE data consistent with alternative embodiments of the invention.

FIG. 2 is an alternative embodiment of a computing system 40 for managing non-destructive evaluation and inspection data consistent with alternative embodiments of the invention. As illustrated, the computing system 40 may include a first computer 42, which may be substantially similar to computer 10 illustrated in FIG. 1 and operate as an application, web, and/or NDE data server for the computing system 40. In specific embodiments, the first computer 42 may be accessed by a second computer 44 through a network 46. As such, the first computer 42 may provide access to the application 36 and/or at least one data structure 38 for that second computer 44 to access, view, add, modify, and/or delete NDE data. In some embodiments, the network 46 is a wide area network (such as, for example, the internet) such that the first computer 42 communicates with the second computer 44 through a wide area network using a secure TCP/IP connection (e.g., a secure internet connection), while in alternative embodiments network 46 is a local area network.

In addition to second computer 44, the computing system 40 may include at least one storage server 48 and at least one NDE data collection device 50 which may in turn be in communication with the network 46. The storage server 48 may be configured with the at least one data structure 38 consistent with embodiments of the invention. In some embodiments, and as illustrated in FIG. 2, the at least one data structure 38 is a database. The storage server 48 may be accessed by the first computer 42 in response to a request from second computer 44. The storage server 48 may be in communication with the first computer 42 through the network 46 or through a direct communication link as at 52. In some embodiments, the at least one storage server 48 is configured to store NDE data and inspection information associated therewith in the at least one data structure 38. The at least one storage server 48 may be configured as a picture archiving and communication system ("PACS") and store the NDE data as a digital image in the digital imaging and communication in non-destructive evaluation ("DICONDE") standard as is well known in the art.

NDE data from at least a portion of an asset 54 may be captured by the at least one NDE data collection device 50 and provided to the first computer 42, the second computer as at 56, and/or the storage server 48. The NDE data may be in various modalities, including a one-dimensional representation (e.g., a waveform), a two-dimensional representation (e.g., an image), a three-dimensional representation (e.g., a volumetric image), temporal data, text, an audio recording, a video recording, a binary representation (e.g., for example, a logic high signal for a passing condition or a logic low signal for a failing condition), or combinations thereof. Similarly, the simulated model may be in various modalities, including a one-dimensional representation (e.g., a waveform), a two-dimensional representation (e.g., an image), a three-dimensional representation (e.g., a volumetric image), temporal data, or combinations thereof. In specific embodiments, the simulated model is a second dataset of NDE data.

The NDE data collection device 50 may include one or more cameras (e.g., to capture still images for visualization, videos for visualization, and/or for sherography, etc.), thermograpic cameras (e.g., to capture a thermographic image), borescopes, fiberscopes, x-ray machines (e.g., to capture still images, to use with computed radiography, to use with direct and/or digital radiography, etc.), ultrasound machines, CT scanners, MRI machines, eddy current detectors, liquid penetrant inspection systems, and/or magnetic-particle inspection systems. Thus, the NDE data may be captured as a specific type of NDE data associated with a respective type of NDE data collection device 50. The asset 54 may be a machine, component, or other physical object, and in some embodiments may be an aircraft (e.g., a drone, a balloon, an airplane, a helicopter, etc.), a land vehicle (e.g., a trailer, a car, a truck, a tractor, a tank, a snowmobile, etc.), a sea vehicle (e.g., a skiff, a personal watercraft, a boat, a speed-boat, a yacht, a cruiser, a destroyer, etc.), a pipeline, an industrial plant (e.g., a power plant, a chemical plant, an electrical plant, etc.), a bridge, and/or a component thereof. In specific embodiments, the asset 54 is a military aircraft.

NDE data may be associated with inspection information that associates the NDE data with particular information that may be useful to align the NDE data, indicate potential problems, and/or otherwise provide data about the portion of the asset. In addition to capturing the NDE data, the at least one NDE data collection device 50 may be configured to capture inspection information associated with that captured NDE data. For example, the NDE data collection device 50 may include a user interface (not shown) in which to enter inspection information. In those embodiments, the inspection information may include data associated with a location of the asset 54 from which the NDE data was captured, an identification of the asset 54, a history of the asset 54, a time at which the NDE data was captured, a date at which the NDE data was captured, an identification of an NDE session associated with the NDE data, an annotation associated with the NDE data (e.g., such as an annotation that includes an indication of a potential problem), an identification of an inspector associated with the NDE data, an identification of a series of NDE data in which the NDE data was captured, an identification of the location of the NDE data in the series of NDE data, an orientation associated with the NDE data, a unique identification of the NDE data, an identification of the modality of NDE data collection device 50 used to capture the NDE data, and/or combinations thereof. The inspection information may be determined automatically, captured by the first computer 42, and/or captured by the second computer 44 before, during, or after the capture of the NDE data. For example, NDE data may captured by the at least one NDE data collection device 50 and viewed on the second computer 44. At least a portion of the inspection information for the NDE data may then be entered by a user at the second computer.

A "session" may include an inspection session during which NDE data is captured from an asset 54. A session may include the capture of a plurality of datasets of NDE data, and in particular a sequence to capture those datasets of NDE data. During a session, at least one dataset of NDE data associated with the asset 54 may be captured with at least one NDE data collection device 50, and each dataset of NDE data may be associated with at least a portion of the asset 54 as well as the time at which that NDE data was captured. Thus, NDE data may be associated with a session and, in some embodiments of the invention, NDE data from the same session may be aligned to a simulated model to provide a snapshot of at least a portion of an asset 54 at a particular time. For example, a session may include the capture of a plurality of datasets of NDE data with an x-ray machine from a spar of a wing of a plane. Specifications for the session may indicate that at least seven datasets of NDE data be captured along the length of the spar in an attempt to capture NDE data for the entire length of the spar. Aspects of the invention provide for aligning NDE data associated with the session, and thus aligning NDE data associated with the spar, then generating a display representation of the aligned NDE data to provide a snapshot of the spar at the time of the session. As a further example, aligned NDE data from previous sessions may be compared with the aligned NDE data from example session to compare the spar over time.

Figure 3:
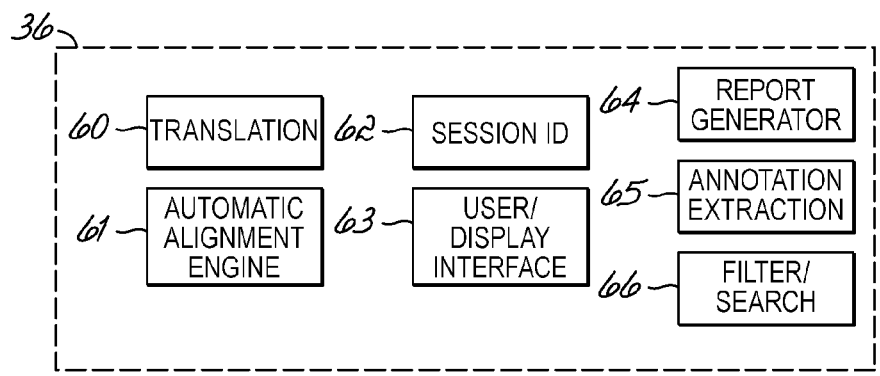
FIG. 3 is a diagrammatic illustration of the primary components of an application configured to manage NDE data in the computer of FIG. 1 or FIG. 2.

FIG. 3 is a diagrammatic illustration of one embodiment of a plurality of components of an application 36 consistent with embodiments of the invention. The application 36 may include various components, modules, or program code to manage NDE data and/or inspection information. In particular, the application 36 may include a translation component 60, an automatic alignment engine 61, a session identification component 62, a user and/or display interface 63, a report generator 64, an annotation extraction component 65, a filter and/or searching component 66, and/or additional components with which to manage NDE data. The translation component 60 may be configured to translate information associated with NDE data and/or inspection information into standardized information. The standardized information, in turn, may be utilized to assist in the alignment of the NDE data. For example, the standardized information may indicate an asset 54 with which the NDE data and/or inspection information is associated, indicate a portion of the asset 54 with which the NDE data and/or inspection information is associated, indicate a location (e.g., for example, an approximate location) of the at least a portion of the asset with which NDE data and/or inspection information is associated, be utilized to help choose a shot descriptor file to associate with the NDE data and/or otherwise be utilized to assist in the alignment of the NDE data and/or indications of the inspection information. The automatic alignment engine 61 may be used to align NDE data to a simulated model, while the session identification component 62 may be used to determine a session associated with the NDE data. The user and/or display interface 63 may be used to provide a display representation for the application 36, the NDE data, the simulated model, and/or the golden NDE data. In particular, the user and/or display interface 63 may be used to provide a display representation for the NDE data, the simulated model, and/or the golden NDE image in response to an automatic alignment and/or for manual alignment. The report generator 64 may be used to generate a report about the NDE data, and thus a report about at least a portion of the asset 54. Moreover, the application 36 may include an annotation extraction component 65 that may be configured to extract and standardize annotations about the NDE data. For example, an operator may input inspection information associated with NDE data indicating that a potential problem was detected, the location of the potential problem, and the type of the potential problem. The annotation extraction component 65 may be configured to analyze the indication and convert annotations to standardized annotations suitable for searching and indexing.

Additionally, the application 36 may include a filtering and/or searching component 66 with which to filter, and/or search through, NDE data, indications thereof, particular assets, serial numbers, inspection times, etc. In particular, the filter and/or searching component may be used to filter or search through a plurality of datasets of NDE data. For example, the data structure 38 may include a plurality of datasets of NDE data from a plurality of portions of a plurality of assets 54 over a plurality of sessions. The plurality of datasets may be filtered to align only NDE data for a particular portion of a particular asset 54 during a particular session to a simulated model. Thus, the portion of the asset 54 at a particular time (e.g., at the time of the particular session) may be viewed. Also for example, the data structure 38 may include a plurality of datasets of NDE data from a plurality of portions of a plurality of assets 54 over a plurality of sessions. In turn, at least a portion of the plurality of datasets of NDE data may be associated with respective inspection information that in turn includes at least one indication of a potential problem. The plurality of datasets may be filtered to align indications for a particular portion of the plurality of assets on the simulated model. Thus, indications of potential problems (e.g., for example, cracks, corrosion, etc.) associated with a particular portion of the plurality of assets 54 (e.g., for example, each asset may be a plane, and the particular portion may be a wing of the planes) over time (e.g., over the course of the plurality of sessions) may be viewed. Thus, a display representation that visually represents potential problems in a specific wing across a fleet of planes may be generated.

Although several components of the application 36 are illustrated in FIG. 3, one having ordinary skill in the art will appreciate that the application 36 may include more or fewer components without departing from the scope of the invention. For example, the application 36 may include an HTML generator (not shown), a shot descriptor parser to access and search through shot descriptor data structures (not shown), and/or another component as may be apparent to one having ordinary skill in the art. Moreover, one having ordinary skill in the art will appreciate that the application 36 may include fewer components and one or more of the individual components 61-66 may be separate applications without departing from the scope of the invention.

Figure 4:
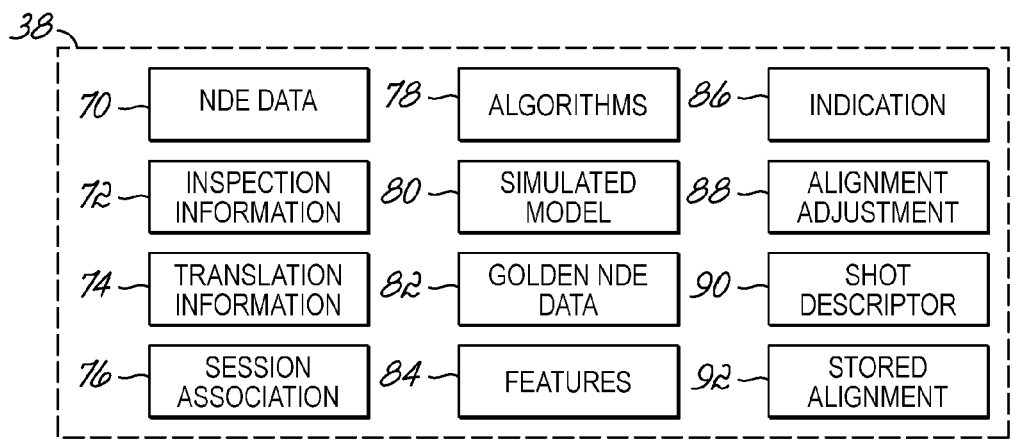
FIG. 4 is a diagrammatic illustration of a data structure and the primary components thereof of the computer of FIG. 1 or FIG. 2 configured to store data and/or information for the management of NDE data.

FIG. 4 is a diagrammatic illustration of one embodiment of the at least one data structure 38 consistent with embodiments of the invention. The at least one data structure 38 may include a plurality of individual data structures, including at least one NDE data data structure 70, at least one inspection information data structure 72, at least one translation information data structure 74, at least one session association data structure 76, at least one algorithms data structure 78, at least one simulated model data structure 80, at least one golden NDE data data structure 82, at least one features data structure 84, at least one indications data structure 86, at least one alignment adjustment data structure 88, at least one shot descriptor data structure 90, at least one stored alignment data structure 92 and/or combinations thereof. Moreover, the data structure 38 may include additional data structures without departing from the scope of the invention. In some embodiments, the NDE data data structure 70 is configured to store at least one dataset of NDE data while the inspection information data structure 72 is configured to store inspection information associated with NDE data. The translation information data structure 74 may be configured with a lexicon, a plurality of semantic concepts, individualized translation information, and/or other translation information for the translation component 62 to translate information associated with NDE data and/or inspection information into standardized information. In alternative embodiments, translation information may be provided in a translation information data structure that may be otherwise separate from the translation information data structure 74, such as in a translation information file and/or data structure supplied by a user or otherwise accessible by the translation component 62.

The algorithms data structure 78 may include a plurality of alignment algorithms from which to choose an alignment algorithm with which to automatically align NDE data (as well as indications associated with inspection information that is in turn associated with NDE data) to a simulated model. Embodiments of the invention support multiple alignment algorithms to automatically align NDE data to the simulated model. For example, the alignment algorithms may include alignment algorithms to align a dataset of NDE data to the simulated model through feature based alignments, area based alignments, parallel projection algorithms and/or other manners of alignment known to one having ordinary skill in the art. For example, feature based alignment algorithms may extract feature sets from a dataset of NDE data and the simulated model and attempt to align the two feature sets through best fit. Specifically, the features may include straight-line segments, corners, points, intensity of particular areas, etc. The feature set of the NDE data may then be compared to the feature set of the simulated model and aligned through best fit to register the NDE data to the simulated model. The alignment may include a rotation, translation, scale transformation and/or other registration of the feature set and/or NDE data.

Alternatively, and also for example, area matching alignment algorithms may set up a matrix to compare an area of a dataset of NDE data (e.g., the entire dataset of NDE data or a portion thereof) to an area of the simulated model (e.g., the entire simulated model or a portion thereof). Specifically, a Fourier transform of an area of the dataset of NDE data may be compared to a Fourier transform of an area of the simulated model. A translation between the two datasets may correspond to a phase shift between the two Fourier transforms thereof. As such, a function may be run on both of the Fourier transforms to align the Fourier transforms, and thus the datasets of NDE data. For example, a cross power spectrum of the two Fourier transforms may be taken, and an inverse Fourier transform of the cross power spectrum may provide an indication of at least one location that corresponds between the two datasets of NDE data. The datasets may then be aligned with reference to the at least one location. As such, the Fourier transforms may be manipulated, processed or otherwise analyzed to provide a translation, rotation and/or scale change between the two datasets.

Also for example, the area matching algorithms may attempt to align NDE data through mutual matching of an area of a dataset of NDE data to an area of the simulated model. Specifically, the area matching algorithms may attempt to maximize mutual information between an area of the NDE data and an area of the simulated model. Although some alignment algorithms are disclosed, it will be apparent to one having ordinary skill in the art that additional alignment algorithms and alignment methods may be used without departing from the scope of the invention.

Additionally, the algorithms data structure 78 may include a plurality of auditing algorithms to audit an alignment of NDE data on a simulated model. The simulated model, in turn, may be stored in the simulated model data structure 80. Golden NDE data, which may be a blueprint, schematic, NDE data, and/or other technical information about at least a portion of an asset 54, may be used to generate the simulated model. Alternatively, the simulated model may be supplied by a user without generating that simulated model from golden NDE data. Golden NDE data may be stored in the golden NDE data data structure 82. In some embodiments, NDE data and/or a simulated model may be aligned with its respective golden NDE data.

The features data structure 84 may include data associated with a plurality of features of respective portions of an asset. For example, one portion of an asset may have a feature that may be used to align NDE data to a simulated model. An alignment algorithm may use information about features of NDE data to align that NDE data to a simulated model. The indications data structure 86 may include a plurality of potential problems as indicated from inspection information or as determined from the inspection of the NDE data. The alignment adjustment data structure 88 may include adjusted algorithm parameters for various alignment algorithms. In particular, the alignment adjustment data structure 88 may include adjusted algorithm parameters as determined from input by a user in response to an alignment of NDE data to a simulated model, or the adjusted algorithm parameters may be automatically determined by the application 36 and stored in the alignment adjustment data structure 88 in response to an audit of the alignment of NDE data to the simulated model. The shot descriptor data structure 90 may include a plurality of shot descriptor data structures which may in turn be used to determine an alignment algorithm, if any, with which to align NDE data. The stored alignment data structure 92 may include stored parameters for a plurality of previous alignments of a respective plurality of NDE data. For example, the stored parameters may indicate input parameters for one or more alignment algorithms as well as specify the alignment algorithms with which to align previously aligned NDE data. Upon subsequent retrieval and/or alignment of that NDE data, the stored alignment data structure 92 may provide parameters to align that NDE data. Referring to FIG. 4, each of the data structures 70-92 may be disposed in at least one database, list, array, table, data entry, file, and/or another data structure for use by the application 36, computer 10, and/or a component thereof.

In general, the routines executed to implement the embodiments of the invention, whether implemented as part of an operating system or a specific application, component, algorithm, program, object, module or sequence of instructions, or even a subset thereof, will be referred to herein as "computer program code" or simply "program code." Program code typically comprises one or more instructions or sequence of operations that are resident at various times in memory and storage devices in a computer, and that, when read and executed by at least one processor in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies regardless of the particular type of computer readable media used to actually carry out the invention. Examples of computer readable media include, but are not limited to, recordable type media such as volatile and non-volatile memory devices, floppy and other removable disks, hard disk drives, tape drives, optical disks (e.g., CD-ROM's, DVD's, HD-DVD's, Blu-Ray Discs), among others, and transmission type media such as digital and analog communications links.

In addition, various program code described hereinafter may be identified based upon the application or software component within which it is implemented in specific embodiments of the invention. However, it should be appreciated that any particular program nomenclature that follows is merely for convenience, and thus embodiments of the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, Application Programming Interfaces [APIs], applications, applets, etc.), it should be appreciated that embodiments of the invention are not limited to the specific organization and allocation of program functionality described herein.

Moreover, various program code described hereinafter may be referred to as being able to align NDE data. However, it should be appreciated that the program code is configured to align not only NDE data to a simulated model, but is also configured to align indications of potential problems to a simulated model, align first NDE data to second NDE data, align additional information to a simulated model and/or align other data. It will be appreciated that an alignment algorithm may align NDE data to a model in a number of manners, including transforming (e.g., rotating, scaling, translating, registering, etc.) NDE data into the coordinate system for a model, transforming a model into the coordinate system for NDE data, or transforming both NDE data and a model to a common coordinate system. The embodiments hereinafter primarily focus on aligning NDE data to a model through transforming the NDE data into the coordinate system of a model; however, the invention is not limited as such.

Those skilled in the art will recognize that the environments illustrated in FIGS. 1-4 are not intended to limit the embodiments of the invention. Indeed, those skilled in the art will recognize that other alternative hardware and/or software environments may be used without departing from the scope of the invention.

Software Description and Flows

Figure 5:
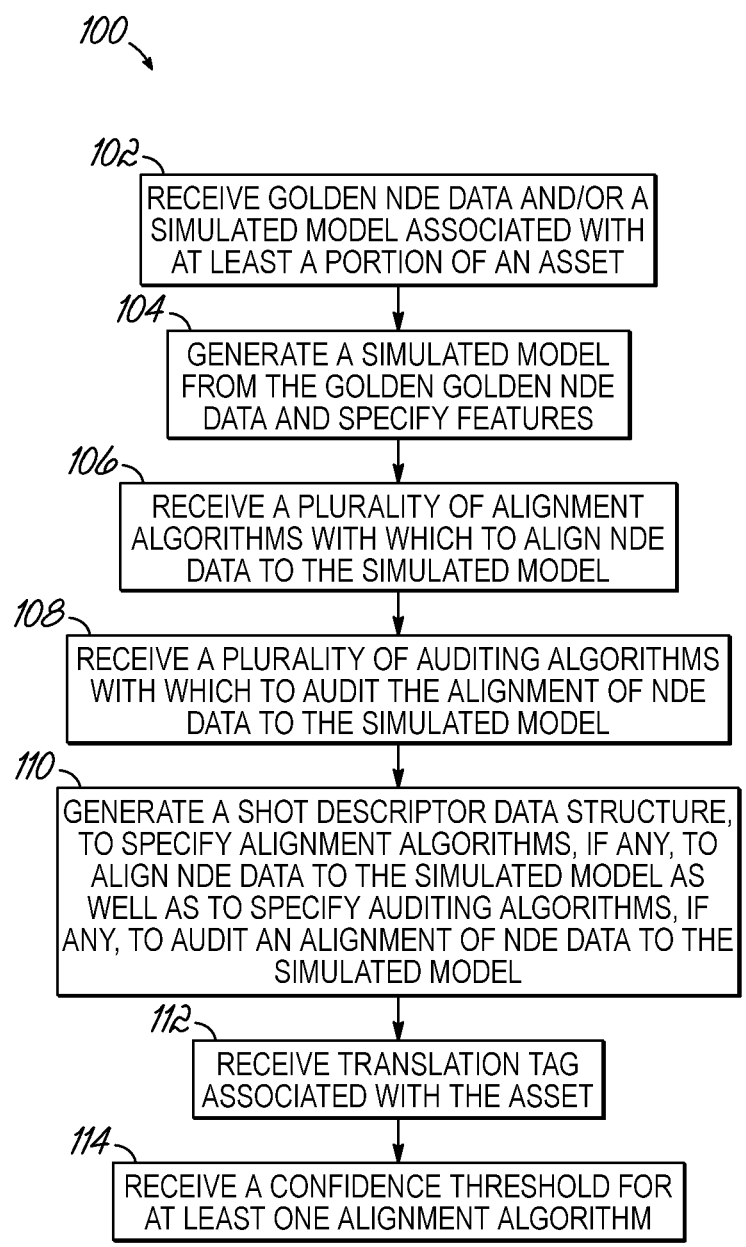
FIG. 5 is a flowchart illustrating a sequence of operations that may be executed by the application of FIG. 3 to accomplish the management of NDE data.

FIG. 5 is a flowchart 100 illustrating a sequence of operations that may be performed by the computer 10 of FIG. 1 and/or the computing system 40 of FIG. 2 to configure management of NDE data consistent with embodiments of the invention. Returning to FIG. 5, golden NDE data and/or a simulated model associated with at least a portion of an asset may be received (block 102). In various embodiments, golden NDE data may be blueprints, schematics, or other technical information about at least a portion of an asset. As such, and when golden NDE data is received, a simulated model of at least a portion of an asset may be generated from golden NDE data (block 104). In various embodiments, a simulated model includes a one-dimensional waveform, a two-dimensional image, and/or a three-dimensional representation of at least a portion of the asset. In specific embodiments, the two-dimensional and/or a three-dimensional simulated model is a computer aided design (CAD) and/or computer aided design and drafting (CADD) model generated through a respective CAD and/or CADD program, although different design software may be used without departing from the scope of the invention. NDE data and/or golden NDE data associated with a portion of an asset may be aligned with a simulated model associated with the same portion of the asset. The NDE data may then be inspected to determine if there are potential problems with that NDE data. For example, potential problems from at least one asset of a plurality of assets that is associated with the same portion of the respective at least one asset may be aligned to a simulated model. As such, trends in potential problems may be determined. Similarly, a plurality of datasets of NDE data from the same portion of the same asset may be aligned to a simulated model to determine a trend of the potential problems of that portion over time. Thus, potential problems may be displayed on a simulated model of at least a portion of an asset to determine if that particular portion of an asset is experiencing excessive potential problems across a plurality of assets or over time.

In addition to generating the simulated model or in response to receiving the simulated model, a plurality of features for that simulated model may be specified (block 104). These features may be used to align NDE data to the simulated model. For example, a feature may include a seam, a weld, a location of a bolt, a particular straight, curved, round, and/or other uniquely shaped area of the asset, and/or another feature that may be used to align the NDE data to the simulated model. The computer 10 of FIG. 1 and/or computing system 40 of FIG. 2 may also receive a plurality of alignment algorithms with which to align NDE data to the simulated model (block 106) as well as a plurality of auditing algorithms with which to audit an alignment of NDE data to the simulated model (block 108).

It may be advantageous to use various alignment algorithms to align NDE data collected from various types of NDE data collection devices, use various alignment algorithms to align NDE data associated with various parts of an asset and/or otherwise have various alignment algorithms with which to align NDE data. For example, a first alignment algorithm may be more effective at aligning NDE data collected from an x-ray machine, but that first alignment algorithm may not be as effective at aligning NDE data collected from an ultrasound machine. As such, shot descriptor data structures may be generated that specify alignment algorithms, if any, to align NDE data to the simulated model (block 110). In specific embodiments, a shot descriptor configuration tool may be configured to analyze a simulated model and/or NDE data and determine from that analysis, or from manual interaction with that shot descriptor configuration tool, the alignment algorithms, if any, to align NDE data to the simulated model, and thus generate the shot descriptor data structures to align NDE data to the simulated model. A shot descriptor data structure may be associated with each NDE data collection device and list, in an order, the preferred alignment algorithms with which to align NDE data from the respective NDE collection device. Thus, for example, if a first alignment algorithm to align the NDE data produces an unsatisfactory alignment of that NDE data to the simulated model, a second alignment algorithm to align the NDE data to the simulated model may be used. In addition to specifying at least one alignment algorithm, the shot descriptor data structure may specify at least one auditing algorithm to audit an alignment of the NDE data to the simulated model to determine whether that alignment has produced a satisfactory alignment (block 110). In the event that an alignment algorithm is not specified to align NDE data to a simulated model, the shot descriptor data structure may indicate that the NDE data is to be manually aligned by a user.

In addition to receiving golden NDE data, simulated models, alignment algorithms and auditing algorithms, translation information may be received (block 112). For example, if the asset is an airplane a portion of the inspection information associated with NDE data may indicate that the NDE data is associated with "wing2," which in turn may indicate that the NDE data is associated with a left wing of the airplane. As such, translation information may be used by a translation component to convert "wing2" to "LWING," or another identifier. Also for example, at least some portion of the NDE data may indicate the NDE data collection device that captured that NDE data. As such, translation information may be used by the translation component to indicate the type of NDE data collection device that captured the NDE data. This, in turn, may be used to determine a shot descriptor data structure associated with that NDE data.

Finally, a confidence threshold for at least one alignment algorithm may be received (block 114). In particular, the confidence threshold may be used to audit an alignment of NDE data to a simulated model. When an audit alignment determines that an alignment of NDE data to a simulated model has not reached a particular confidence threshold, the alignment may be discarded and/or adjusted. In one embodiment, when the confidence threshold of an alignment has not been met, the alignment of NDE data to the simulated model with a first alignment algorithm is discarded and a second alignment algorithm with which to align the NDE data to the simulated model is chosen. In an alternative embodiment, when the confidence threshold of an alignment has not been met, the parameters for the alignment algorithm used to align the NDE data to the simulated model is adjusted. In a further alternative embodiment, when the confidence threshold of an alignment has not been met, a user is given the opportunity to manually adjust the alignment of that NDE data to the simulated model.

Figure 6:
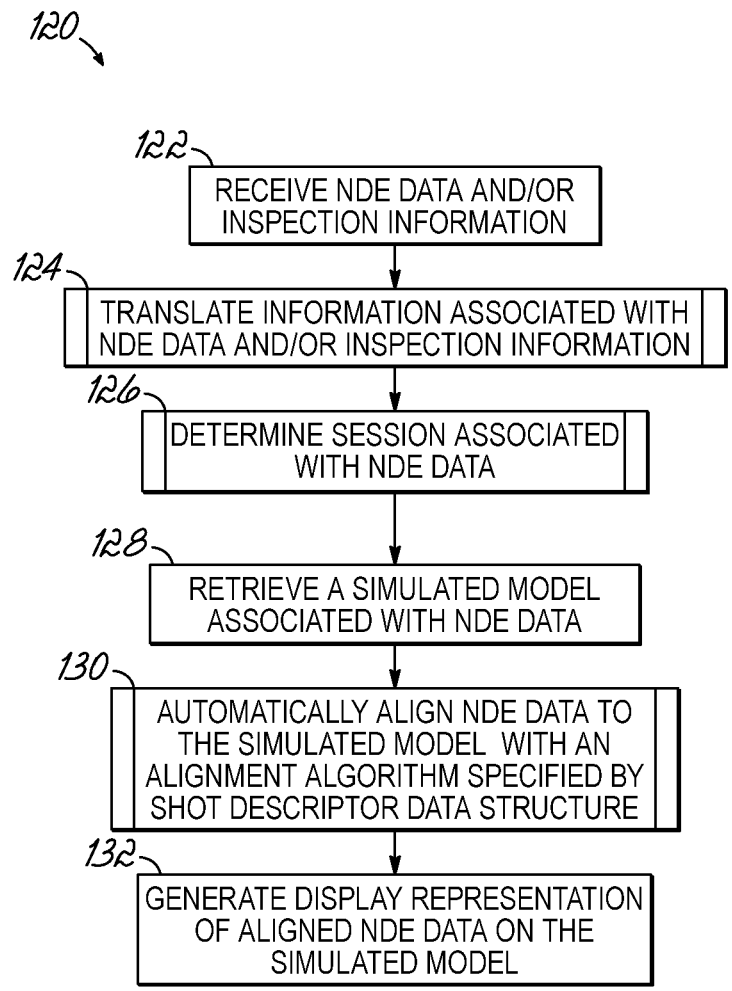
FIG. 6 is a flowchart illustrating a sequence of operations that may be executed by the application of FIG. 3 generally illustrating the management of NDE data.

FIG. 6 is a flowchart 120 illustrating a sequence of operations configured to be performed by the computer 10 of FIG. 1 and/or the computing system 40 of FIG. 2 to manage NDE data consistent with embodiments of the invention. As illustrated in FIG. 6, the sequence of operations includes receiving NDE data and/or inspection information associated with at least a portion of an asset (block 122). In response to receiving the NDE data and/or the inspection information, data associated with the NDE data and/or the inspection information may be translated into tagged information (block 124) and a session associated with the NDE data may be determined (block 126). In response to determining the session associated with the NDE data, a simulated model associated with the NDE data may be retrieved (block 128). Once the simulated model has been retrieved, the NDE data may be automatically aligned to the simulated model with at least one alignment algorithm specified by a shot descriptor data structure associated with the NDE data (block 130). A display representation of the aligned NDE data on the simulated model may be generated in response to alignment of the NDE data to the simulated model (block 132).

Figure 7:
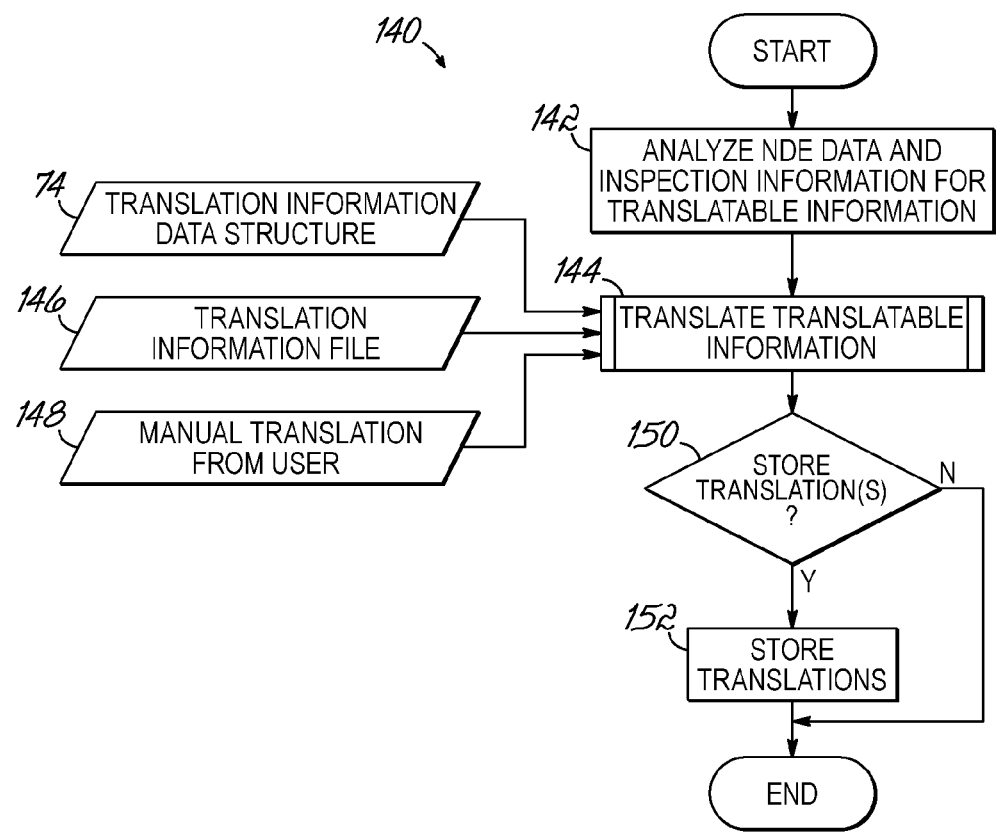
FIG. 7 is a flowchart illustrating in more detail the tag translation process of FIG. 6.

FIG. 7 is a flowchart 140 illustrating the translation process of block 124 in FIG. 6. Referring to FIG. 7, the NDE data and/or the inspection information may be analyzed for translatable information (block 142). In some embodiments, translatable information includes a location on the asset from which the NDE data was captured, an identification of the asset, an identification of a component of the asset, a history of the asset, a time at which the NDE data was captured, a date at which the NDE data was captured, an identification of an inspection location at which the NDE data was captured, an identification of a service location associated with the NDE data, an identification of an NDE session associated with the NDE data, an indication associated with the NDE data, an annotation associated with the NDE data, an identification of an inspector associated with the NDE data, an identification of an NDE data collection device associated with the NDE data, an orientation associated with the NDE data, a unique identification of the NDE data, a pixel spacing of the NDE data, a photometric interpretation of the NDE data, a bit depth of the NDE data, color mapping of the NDE data, intensity settings of the NDE data, a status of the NDE data, an uncertainty of a measurement associated with the NDE data and/or combinations thereof. This translatable information, in specific embodiments, is determined from data associated with the NDE data and/or the inspection information. When there is translatable information, information may be translated (block 144) with reference to the translation information data structure 74, a translation information file 146 separate from the translation information data structure 74 (e.g., a translation information file 146 separately supplied by the user and/or otherwise available to translate information) and/or manual translation of the information from the user 148. In response to translating the information, it may be determined whether to store the translation (block 150). When it is determined to store the translation (e.g., for example, the translation was performed with reference to manual translation from the user 148) ("Yes" branch of decision block 150) the translation may be stored (block 152) for future reference. When it is determined not to store the translation ("No" branch of decision block 150) and/or after storing the translation (block 152) tag translation process may end.

Figure 8:
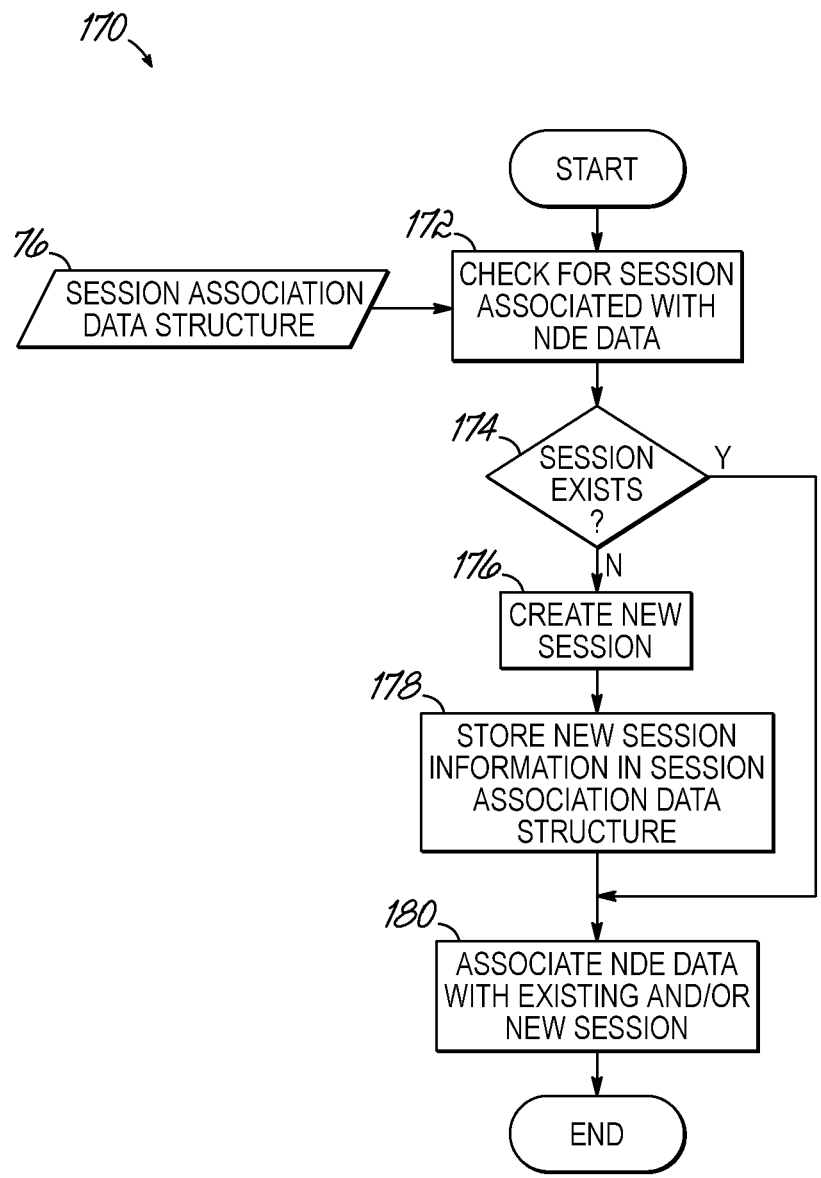
FIG. 8 is a flowchart illustrating in more detail the session association process of FIG. 6.

FIG. 8 is a flowchart 170 illustrating in more detail the session association process of block 126 of FIG. 6. Referring to FIG. 8, a session associated with NDE data may be determined by comparing translated tags associated with that NDE data and/or inspection information with sessions in the session association data structure (block 172). The session association data structure (block 76) may include a list of sessions during which NDE data may have been captured from an asset, each of which may include the times and/or dates of that session, the serial number of the asset inspected in that session, an identification of the portions of the asset inspected in that session, an identification of the inspector who captured the NDE data, and/or an identification of datasets of required and/or optional NDE data that may have been captured during that session. Thus, in the event that a session includes the capture of a plurality of datasets of NDE data (e.g., from the same portion of an asset or from various portions of the asset, as well as from various NDE data collection devices) and/or a sequence to capture that plurality of datasets of NDE data, each dataset of NDE data captured during that session may be associated with that session. As such, it may be determined whether a session associated with the NDE data exists (block 174). When there is no session associated with the NDE data ("No" branch of decision block 174), a new session may be created and associated with the NDE data (block 176) and data associated with the new session may be stored in the session association data structure (block 178). When there is a session associated with the NDE data ("Yes" branch of decision block 174), or after storing new session data in the session association database (block 178), the NDE data may be associated with the existing session or new session, respectively (block 180).

Figure 9:
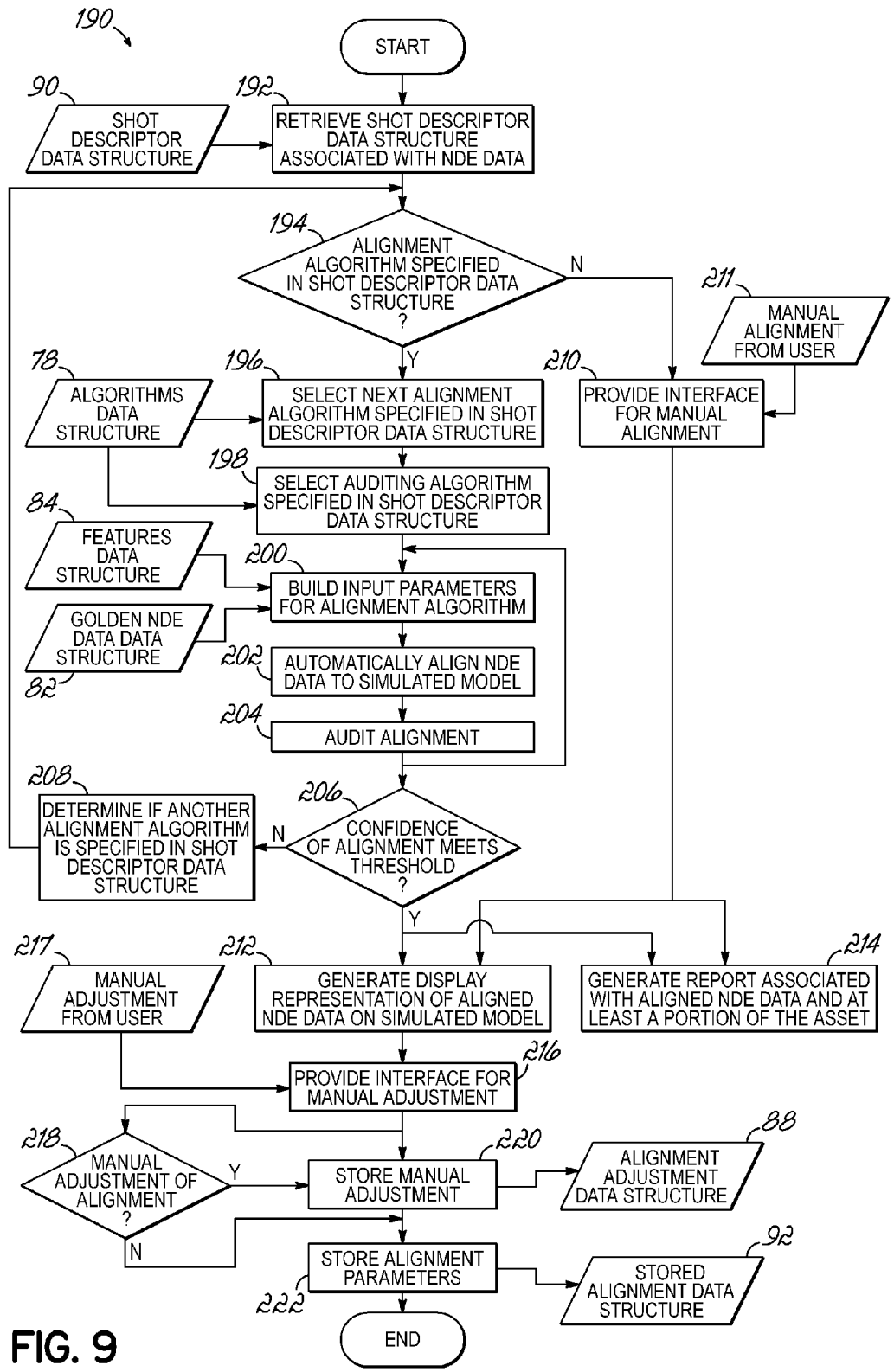
FIG. 9 is a flowchart illustrating in more detail the alignment algorithm selection process and automatic alignment process of FIG. 6.

FIG. 9 is a flowchart 190 illustrating in more detail the alignment algorithm selection and automatic alignment process of block 130 in FIG. 6. Translated information associated with a dataset of NDE data may be used to determine a particular shot descriptor data structure associated with that dataset of NDE data. As such, a shot descriptor data structure associated with that NDE data may be retrieved (block 192). In response to retrieving the shot descriptor data structure, it may be determined whether an alignment algorithm is specified in that shot descriptor data structure (block 194). In particular, the shot descriptor data structure may be accessed and it may be determined whether that shot descriptor data structure includes at least one alignment algorithm for the NDE data. When the shot descriptor data structure includes at least one alignment algorithm ("Yes" branch of decision block 194), the next alignment algorithm specified in the shot descriptor data structure may be selected from the algorithm data structure (e.g., in one example, the first alignment algorithm specified in the shot descriptor data structure) (block 196). In an optional step, an auditing algorithm specified in the shot descriptor data for auditing an alignment with the alignment algorithm selected in block 196 may also be selected from the algorithm data structure (block 198).

Upon selecting the alignment algorithm with which to align the NDE data to a simulated model, input parameters for that alignment algorithm may be built (block 200). Input parameters for various alignment algorithms may be determined based on the translated tags associated with the NDE data (e.g., the type of NDE data collection device used to capture the NDE data) and/or the inspection information (e.g., data concerning the asset, component, angle, orientation, or other information associated with the NDE data). The input parameters for a particular dataset of NDE data may include that the NDE data should be decimated, filtered using edge detection, rotated, oriented, noise filtered, that seed values be applied to the NDE data, that the scale of the NDE data should be adjusted (e.g., the NDE data should be enlarged or reduced), that portions of the NDE data should be deformed (e.g., some portion of the NDE data should include local distortion to account for manufacturing variances, parallax distortion, and/or other variances), and/or that other input parameters should be applied to the NDE data for alignment to the simulated model. Moreover, input parameters may be built at least partly based upon input parameters and/or an alignment adjustment of a previous alignment (e.g., input parameters for a second alignment algorithm may be built or otherwise based upon the input parameters for a first alignment algorithm and/or the alignment adjustments to an alignment by the first alignment algorithm). The input parameters may also include NDE data features and/or a golden NDE data. Using the input parameters, the NDE data may be automatically aligned to the simulated model with the alignment algorithm (block 202). As illustrated in FIG. 9, after the NDE data has been aligned to a simulated model (block 202) the input parameters for that alignment may be fed back to build new input parameters for a subsequent alignment algorithm as at 203.

In response to aligning the NDE data to the simulated model, the alignment may be audited (block 204). In particular, auditing the alignment may include determining a confidence of the alignment of the NDE data to the simulated model and comparing that confidence to a confidence threshold associated with the alignment algorithm and specified by a shot descriptor data structure associated with that NDE data. When the confidence of the alignment of the NDE data to the simulated model is unsatisfactory and/or when the confidence threshold associated with the alignment algorithm has not been met or exceeded ("No" branch of block 206) it may be determined whether another alignment algorithm in the shot descriptor data structure associated with the NDE data has been specified (block 208) and the sequence of operations may return to block 194.

Returning to block 194, when an alignment algorithm is not specified in a shot descriptor data structure associated with the NDE data, when the confidence of a an alignment is unsatisfactory and there is no other alignment algorithm specified in the shot descriptor data structure associated with the NDE data, and/or when the confidence threshold of an alignment has not been met and there is no other alignment algorithm specified in the shot descriptor data structure associated with the NDE data ("No" branch of decision block 194), a user interface may be provided to a user for manual alignment of the NDE data to the simulated model (block 210). That user interface may receive a manual alignment of the NDE data to the simulated model (block 211). When the confidence of an alignment of NDE data to a simulated model is satisfactory, when the confidence threshold of an alignment algorithm has been met or exceeded ("Yes" branch of block 208), and/or after the manual alignment of NDE data to the simulated model (block 210), a display representation of the aligned NDE data to the simulated model may be generated (block 212) and/or a report associated with the aligned NDE data, and thus at least a portion of the asset, may be generated (block 214). In an optional step and in response to generating a display representation of the aligned NDE data to the simulated model (block 212), and in particular after an automatic alignment of the NDE data to the simulated model (block 202), a user interface may be provided to a user for an adjustment of the alignment (block 216), and that user interface may receive an adjustment of the alignment of the NDE data to the simulated model (block 217). When the user tunes an automatic alignment of the NDE data to the simulated model ("Yes" branch of decision block 218) the adjustment of the alignment may be stored in an alignment adjustment data structure associated with that alignment algorithm (block 220). When the user does not tune an automatic alignment of the NDE data to the simulated model ("No" branch of decision block 218) the alignment parameters of the alignment may be stored (block 222) and the alignment of the NDE data to the simulated model may end.

Figure 10:
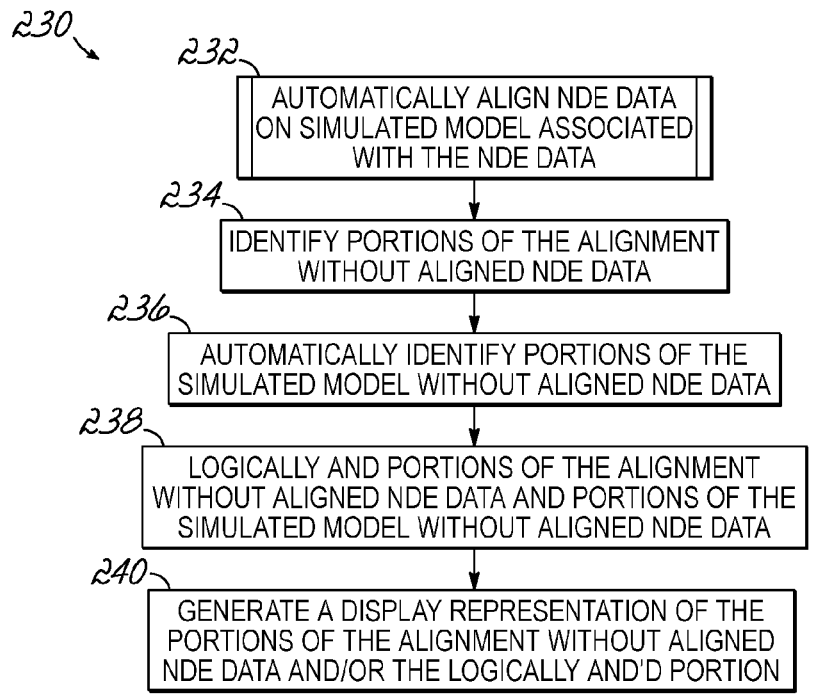
FIG. 10 is a flowchart illustrating a sequence of operations that may be executed by the application of FIG. 3 to determine missed coverage of at least a portion of a simulated model.

FIG. 10 is a flowchart 230 illustrating detection of missed coverage of at least a portion of a simulated model consistent with embodiments of the invention. In some embodiments, the missed coverage is indicated identifying those portions of the simulated model which are not associated with a dataset of NDE data and generating a display of those portions. Thus, NDE data may be automatically aligned to a simulated model associated with that NDE data (block 232) and at least a portion of the alignment without aligned NDE data may be identified (block 234). In a specific example, the portion of the alignment without aligned NDE data are identified by changing a color of the background of the display representation upon which aligned NDE data and the simulated model are displayed. In this manner, a user may simply look for those parts of the alignment which have the color to determine those parts of the simulated model that are not associated with NDE data. In an optional step, at least a portion of the simulated model that are not associated with aligned NDE data may be automatically identified (block 236). In specific embodiments, the portion of the simulated model may be determined through a filler algorithm configured to identify a part of the simulated model that are not associated with aligned NDE data, then associate that part with a color. In some embodiments, the identified at least a portion of the alignment without the aligned NDE data and the at least a portion of the simulated model without aligned NDE data may be logically AND'd (block 238) and a display representation of the at least a portion of the alignment without aligned NDE data and/or the logically AND'd portions may be generated (block 240). As such, a user may be able to view portions of a simulated model, or portions of an alignment, that are not associated with aligned NDE data. Thus, the user may be able to determine whether the coverage of at least a portion of an asset associated with that simulated model was acceptable, in that the coverage may be unacceptable when there is at least a portion of the simulated model that is not associated with aligned NDE data.

Figure 11:
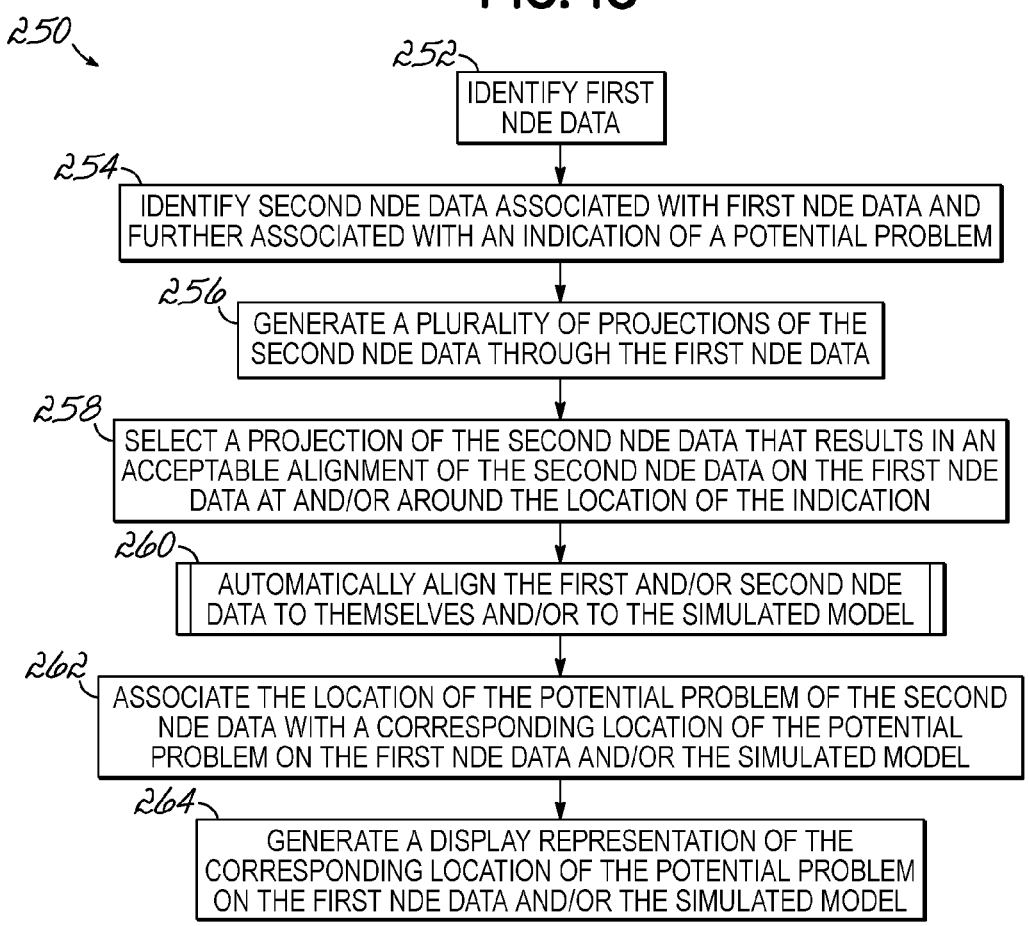
FIG. 11 is a flowchart illustrating a sequence of operations that may be executed by the application of FIG. 3 to align two datasets of NDE data with each other and determine the location of an indication.

FIG. 11 is a flowchart 250 illustrating a sequence of operations to align two datasets of NDE data with each other and determine the location of an indication of a potential problem. In particular a first dataset of NDE data that may include an indication of a potential problem may be identified (block 252). For example, the first NDE data may be an x-ray image of at least a portion of an asset. A second dataset of NDE data associated with the first NDE data and that is further associated with an indication of a potential problem may also be identified (block 254). For example, the second NDE data may be a CT slice of the at least a portion of the asset. Moreover, the second NDE data may be associated with an indication that may not be in turn associated with the first NDE data. As such, a plurality of projections of the second NDE data may be generated through the first NDE data (block 256) and a projection from among the plurality of projections that results in an acceptable alignment (e.g., a projection of the second NDE data that substantially matches the first NDE data at and/or around the location of the indication) may be selected (block 258). For example, a plurality of projections of the CT slice may be generated through the x-ray image, and the projection with the most minimal difference, or smallest error, between the slice and image may be selected.

In response to selecting the projection, the second NDE data may be automatically aligned to first NDE data and/or the first and second NDE data may be aligned to a simulated model associated with both the first and second NDE data consistent with embodiments of the invention (block 260). For example, the x-ray image and CT slice may be of a fan blade of a turbine engine, and the x-ray image and/or CT slice may be aligned to themselves and/or a simulated model of the fan blade of the turbine engine. In response to automatically aligning the first and/or second NDE data, the location of the indication associated with the first NDE data may be associated with a corresponding location on the first NDE data and/or the simulated model (block 262) and a display representation of the corresponding location of the indication on the first NDE data and/or the simulated model may be generated (block 264). Thus, for example, the location of an anomaly of the CT slice may be associated with a location on the x-ray image. By aligning both the CT slice to the x-ray image, the location of the anomaly may be located on the x-ray image. Similarly, by aligning both the x-ray image and the CT slice to the simulated model, the location of the anomaly may be located within the three dimensional space of the simulated model.

Figure 12:
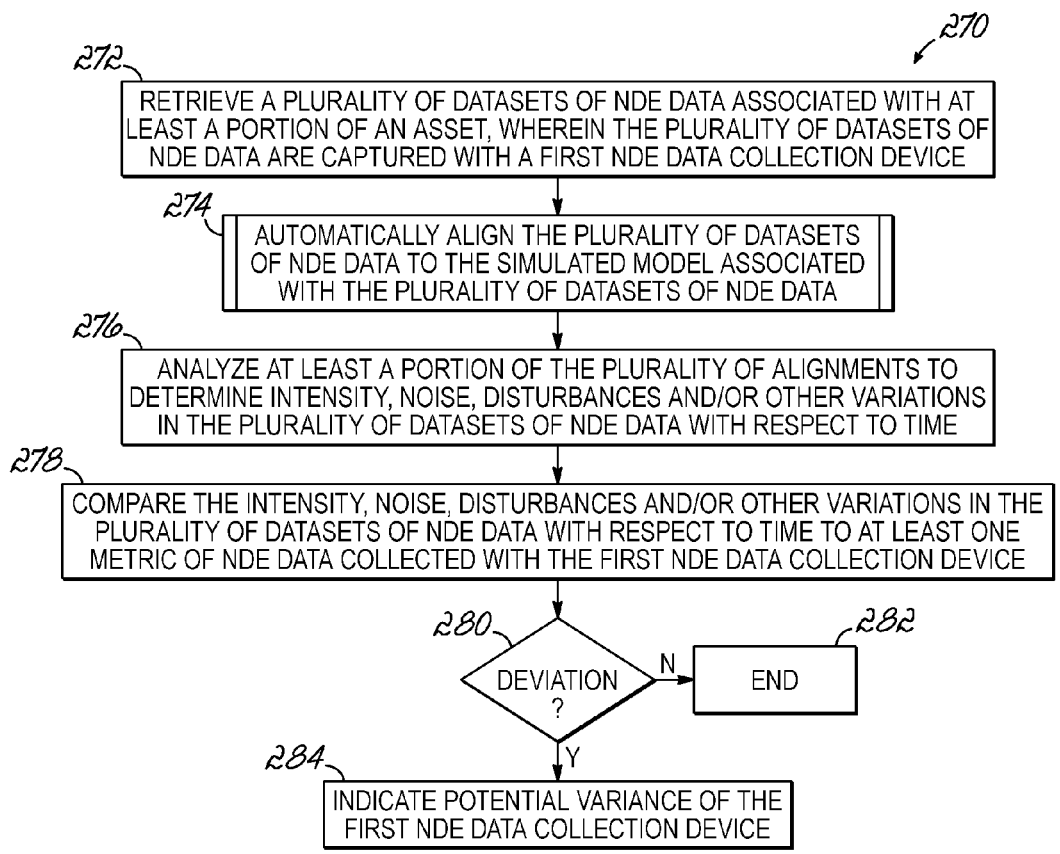
FIG. 12 is a flowchart illustrating a sequence of operations that may be executed by the application of FIG. 3 to maintain data integrity of NDE data captured from an NDE data collection device.

FIG. 12 is a flowchart 270 illustrating a sequence of operations to maintain data integrity of NDE data captured from an NDE data collection device consistent with embodiments of the invention. Over time, NDE data collection devices may experience wear and otherwise experience malfunctions that are evident in the NDE data that they capture. In particular, NDE data collection devices that utilize computed radiography are typically configured with phosphor plates instead of film. These phosphor plates are often prone to wear from the absorption of radiation over time as well as to rough handling often associated with industrial settings. In some embodiments of the invention, by trending NDE data collected from an NDE data collection device that utilizes computed radiography and a phosphor plate, the wear to that phosphor plate can be identified. Thus, a plurality of datasets of NDE data associated with at least a portion of an asset, and captured with a first NDE data collection device, may be retrieved (block 272) and automatically aligned to a simulated model associated with that plurality of datasets of NDE data (block 274). The plurality of alignments may be analyzed to determine a trend in the intensity of those NDE datasets over time, noise in NDE datasets, a common disturbance in NDE datasets and/or a trend of that disturbance over time, as well as other variations in the plurality of datasets of NDE with respect to time (block 276).

The intensity, noise, disturbances and/or other variations in the plurality of datasets of NDE data may be compared to some metric of expected NDE data collected with the first NDE data collection device to determine a deviation of the plurality of datasets of NDE data (block 278). When there is no deviation in the plurality of NDE datasets ("No" branch of decision block 280) the sequence of operations 270 may end (block 282). When there is a deviation in the plurality of NDE datasets ("Yes" branch of decision block 282), the deviation, and thus a potential variance of the first NDE data collection device, may be indicated (block 284). This, in turn, may be transferred to an inspector that utilizes the NDE data collection device and thus informs that inspector of wear of at least a portion of the NDE data collection device.

Figure 13:
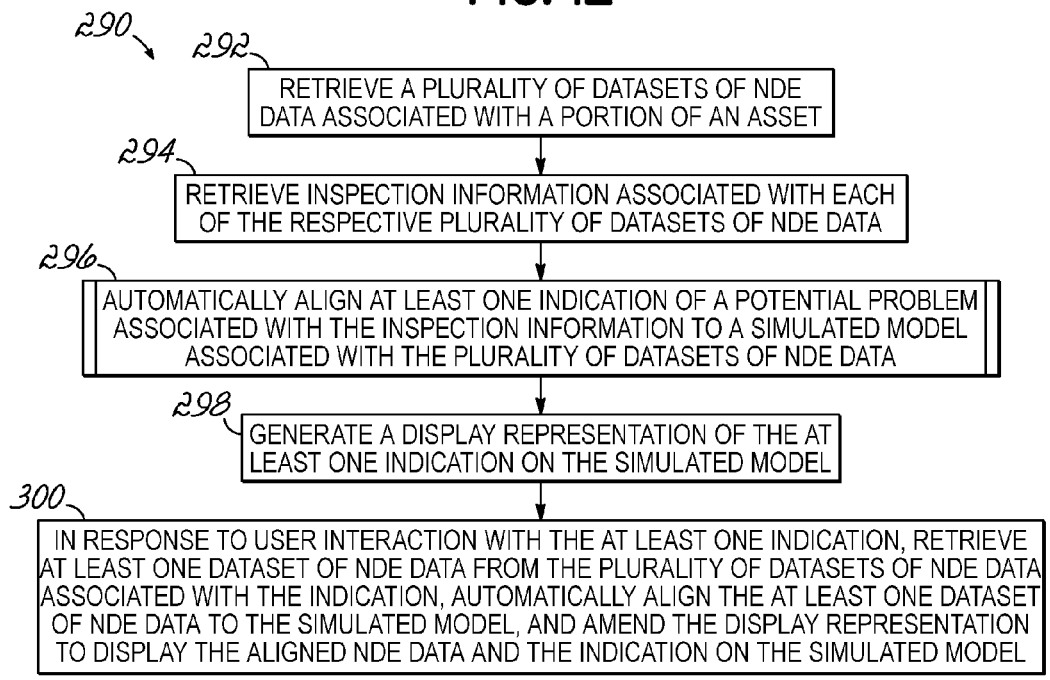
FIG. 13 is a flowchart illustrating a sequence of operations that may be executed by the application of FIG. 3 to retrieve NDE data associated with an first indication in response to the selection of that first indication from among a plurality of indications.

FIG. 13 is a flowchart 290 illustrating a sequence of operations to retrieve NDE data associated with an indication from among a plurality of indications consistent with embodiments of the invention. In particular, the sequence of operations may be used when a plurality of indications associated with a plurality of datasets of NDE data are aligned and displayed on a simulated model associated with the plurality of datasets of NDE data. In response to a user selecting a particular indication, the NDE data associated with that particular indication may be retrieved. Thus, the plurality of datasets of NDE data associated with at least a portion of an asset may be retrieved (block 292). In response, the inspection information associated with each of the respective plurality of datasets of NDE data may also be retrieved (block 294). In response to retrieving the inspection information, at least one indication associated with inspection information is automatically aligned to a simulated model associated with the plurality of datasets of NDE data (block 296). A display representation of the at least one indication on the simulated model is then generated (block 298). In response to user interaction with the at least one indication (e.g., a user clicking, tabbing to and/or otherwise selecting the at least one indication), each dataset of NDE data from among the plurality of datasets of NDE data associated with the at least one indication are retrieved and automatically aligned with the simulated model, and the display representation is amended to display the aligned NDE data and the at least one indication on the simulated model (block 300).

Figure 14:
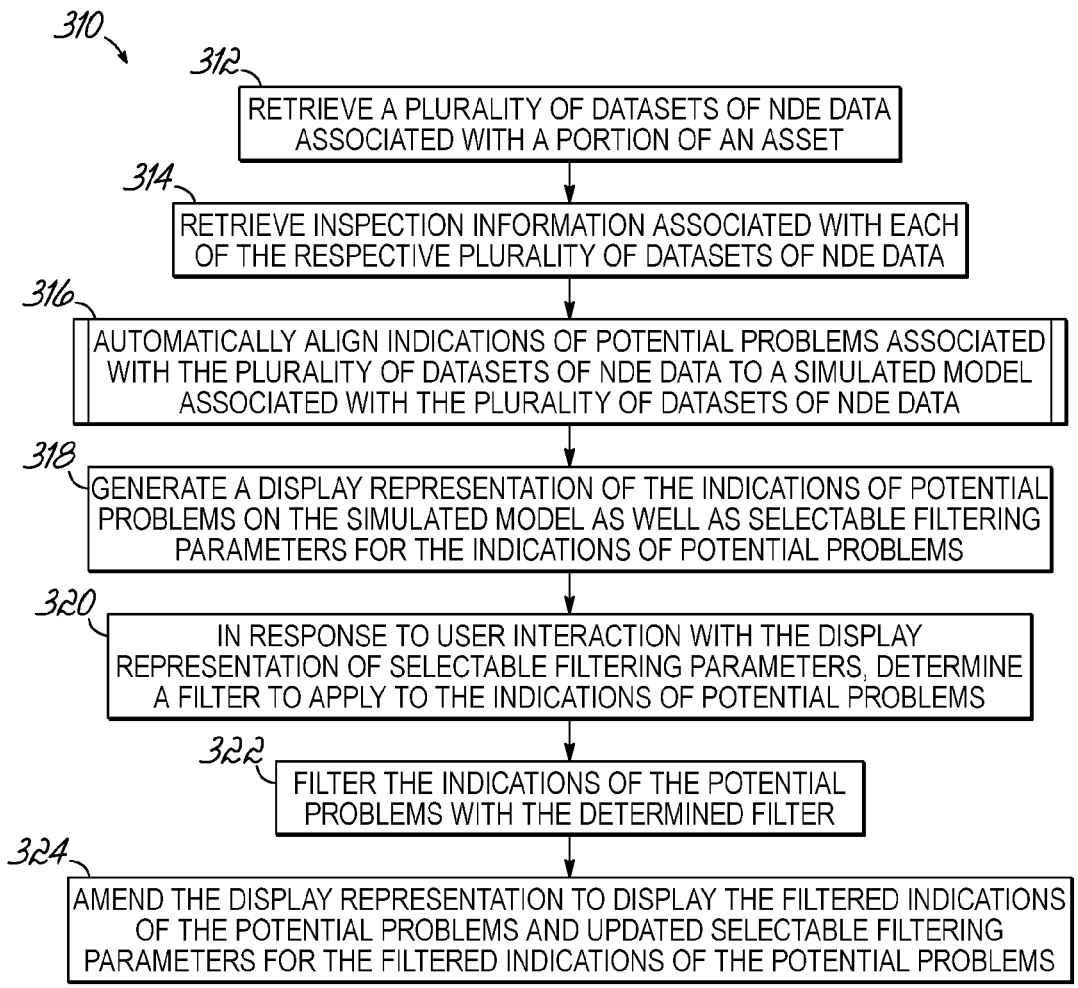
FIG. 14 is a flowchart illustrating a sequence of operations that may be executed by the application of FIG. 3 to filter a plurality of indications.

FIG. 14 is a flowchart 310 illustrating a sequence of operations to filter indications consistent with embodiments of the invention. Initially, a plurality of datasets of NDE data associated with at least a portion of an asset are retrieved (block 312). Similarly, inspection information associated with each of the respective plurality of datasets of NDE data may be retrieved (block 314). The plurality of datasets of NDE data and respective inspection information may be retrieved in response to user interaction to specify the at least a portion of the asset. Indications of potential problems associated with the plurality of datasets of NDE data may be automatically aligned to a simulated model associated with the plurality of datasets of NDE data (block 316). In turn, a display representation of the indications on the simulated model may be generated, along with selectable filtering parameters for the indications (block 318). For example, the selectable filtering parameters may be interacted with to select the type of indications to display (e.g., cracks, abrasions, etc.), more specific portions of the at least a portion of the asset, indications associated with a particular NDE data collection device, a time (e.g., an hour, a day, a week, a month, a year and/or a range thereof) associated with that indication, and/or indications to display based upon another selectable filtering parameter.

In response to user interaction with the display representation of selectable filtering parameters, a filter to apply to the indications to selectively filter at least one indication is determined (block 320) and applied to the plurality of indications to remove that at least one indication from the aligned plurality of indications (block 322). In turn, the display representation is amended to display those indications that have not been removed (e.g., the "filtered indications), and the selectable filtering parameters for the filtered indications are updated (block 324).

Figure 15:
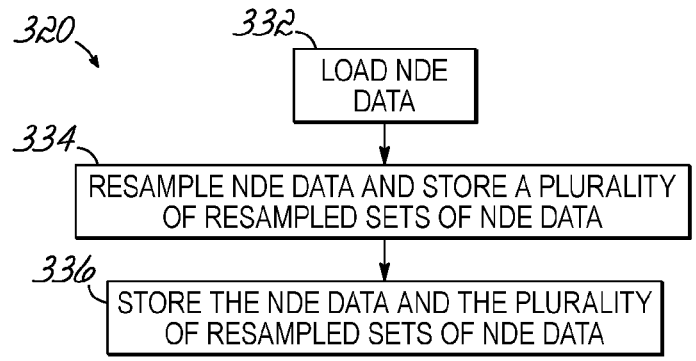
FIG. 15 is a flowchart illustrating a sequence of operations that may be executed by the application of FIG. 3 to sample NDE data and produce a plurality of resolutions of that NDE data.

FIG. 15 is a flowchart 330 illustrating a sequence of operations to resample NDE data and produce a plurality of resolutions of that NDE data for subsequent display consistent with embodiments of the invention. For example, a dataset of NDE data may approach several hundred megabytes in size. This, in turn, may be difficult to display. As such, the NDE data may be resampled using bilinear interpolation to generate a plurality of resamples of NDE data from a dataset of NDE data. In particular, a resample of NDE data may be smaller than the NDE data and thus require less resources to view. As such, a first resample of NDE data that is smaller in size than the NDE data may be viewed at a lower magnification of view of an alignment when it is unnecessary to illustrate all details of the NDE data, while a second resample of NDE data that is larger in size than the first resample of NDE data may be viewed at a higher magnification of view of the alignment to illustrated finer details. Thus, NDE data may be loaded (block 332) and that NDE data may be sampled using bilinear interpolation into a plurality of resampled sets of NDE data (block 334). For example, the NDE data may be decimated or otherwise sampled to produce resampled sets of NDE data. More specifically, the NDE data may be an image and the plurality of resampled sets of the NDE data may include a resampled set of NDE data at one-half the resolution of the NDE data, a resampled set of NDE data at one-fourth the resolution of the NDE data, and so on. It will be appreciated that any fraction of the NDE data may be specified for a resampled set of NDE data, including three-fourths, seven-eighths, one-tenth, one-thousandth, etc. Upon generating the plurality of resampled sets of NDE data, the NDE data as well as the plurality of resampled sets of NDE data may be stored (block 336).

Figure 16:
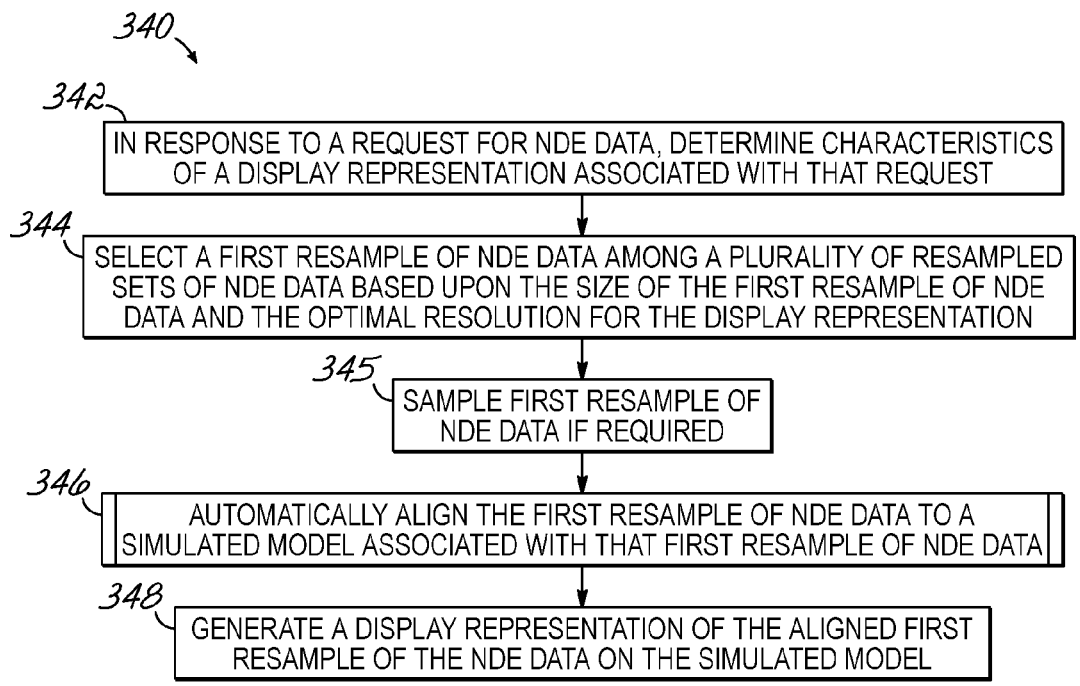
FIG. 16 is a flowchart illustrating a sequence of operations that may be executed by the application of FIG. 3 to display a dataset of NDE data or a sub-dataset thereof.

FIG. 16 is a flowchart 340 illustrating a sequence of operations to display a dataset of NDE data or a resampled set thereof consistent with embodiments of the invention. In response to a request for the NDE data (e.g., in response to a request from a user to view a portion of an asset associated with the NDE data, or otherwise align the NDE data), the characteristics of a display representation associated with that request (e.g., a display representation that includes the NDE data) are determined (block 342). In particular, the display representation characteristics may include the current zoom level at which to display the NDE data. Thus, a first resample of NDE data from among a plurality of resampled sets of NDE data may be selected based upon a size of the first resample of NDE data and/or an optimal resolution for the display representation (block 344). In an optional step, the first resample of NDE data may then be sampled using nearest neighbor interpolation (block 345). For example, if it is determined that the optimal resolution for the display representation should be a resampled set of NDE data that is one-third the resolution of the original NDE data, the sequence of operations may select the resampled set of NDE data that is one-half the resolution of the original NDE data (e.g., the resampled set of NDE data that is closest to the desired resolution and that is also larger than the desired resolution for more accurate re-sampling) and sample that NDE data to one-third the resolution of the original NDE data. After selecting the first resample of NDE data, or after re-sampling the first resample of NDE data, the first resample is automatically aligned to a simulated model associated with that first resample of NDE data (block 346) and a display representation of the aligned first resample of NDE data on the simulated model is generated (block 348).

Figure 17:
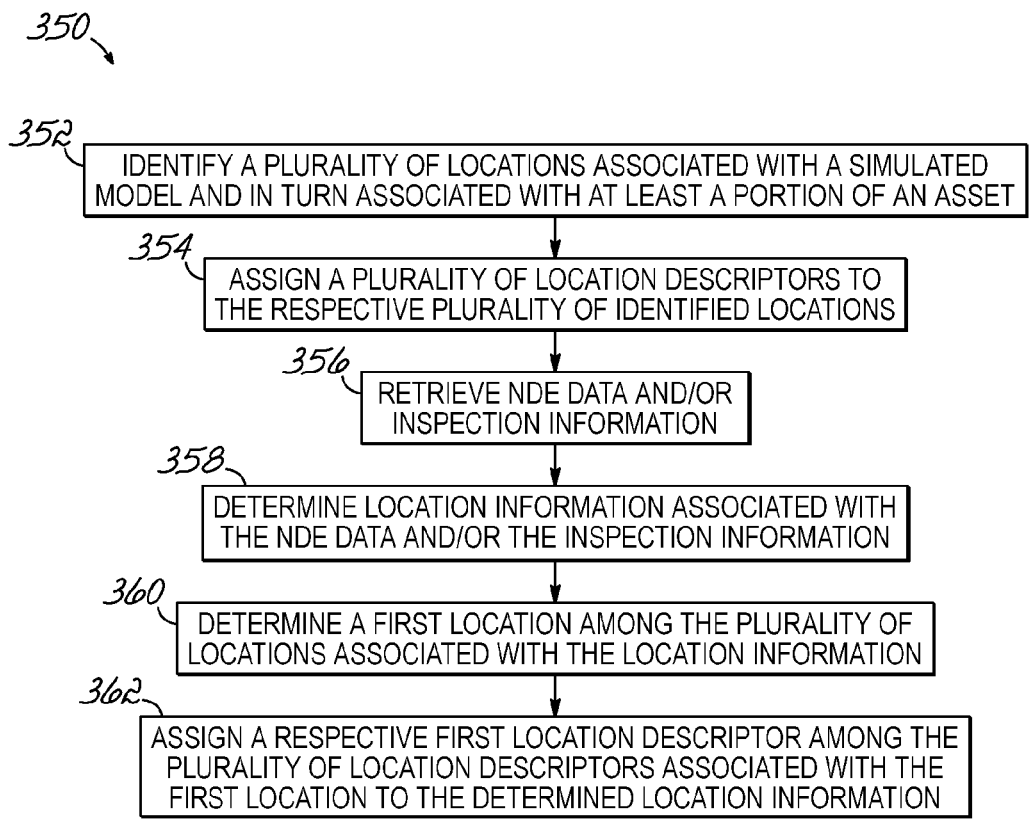
FIG. 17 is a flowchart illustrating a sequence of operations that may be executed by the application of FIG. 3 to assign a location descriptor to at least a portion of an asset and translate location information associated therewith.

FIG. 17 is a flowchart 350 illustrating a sequence of operations to assign a location descriptor to at least a portion of an asset and translate location information associated with NDE data (e.g., location information specifying the location of an indication, asset, portion of an asset, sub-portion of an asset, etc.) consistent with embodiments of the invention. Initially, a plurality of locations associated with a simulated model, and in turn associated with at least a portion of an asset, are identified (block 352). For example, one location may identify that the simulated model is associated with the left wing of an asset, a second location may identify a portion of the simulated model that is associated with a slat of the left wing, a third location may identify a portion of the simulated model that is associated with a spoiler of the left wing, a fourth location may identify that a portion of the simulated model is associated with a bolt of the left wing, the slat or the spoiler, etc. A plurality of location descriptors may then be assigned to at least some of the respective identified locations (block 354). For example, a location descriptor may describe the left wing as "WING2," the slat as "SLAT1," the spoiler as "SPOILT," and the bolt as "BOLT289."

In response to retrieving NDE data and/or inspection information associated therewith (block 356), location information associated with the NDE data and/or the inspection information may be determined (358). In particular, the determined location information may include location information specifying the at least a portion of the asset associated with the NDE data and/or the inspection information. Additionally and/or alternatively, the determined location information may include location information specifying the location of an indication of a potential problem in turn associated with the NDE data and/or the inspection information. In response to determining the location information, a first location among the plurality of locations associated with the location information may be determined (block 360) and a respective first location descriptor among the plurality of location descriptors associated with the first location may be assigned to the determined location information (block 362). Thus, a location associated with the NDE data and/or the location of an indication may be automatically determined and assigned to that NDE data.

Figure 18:
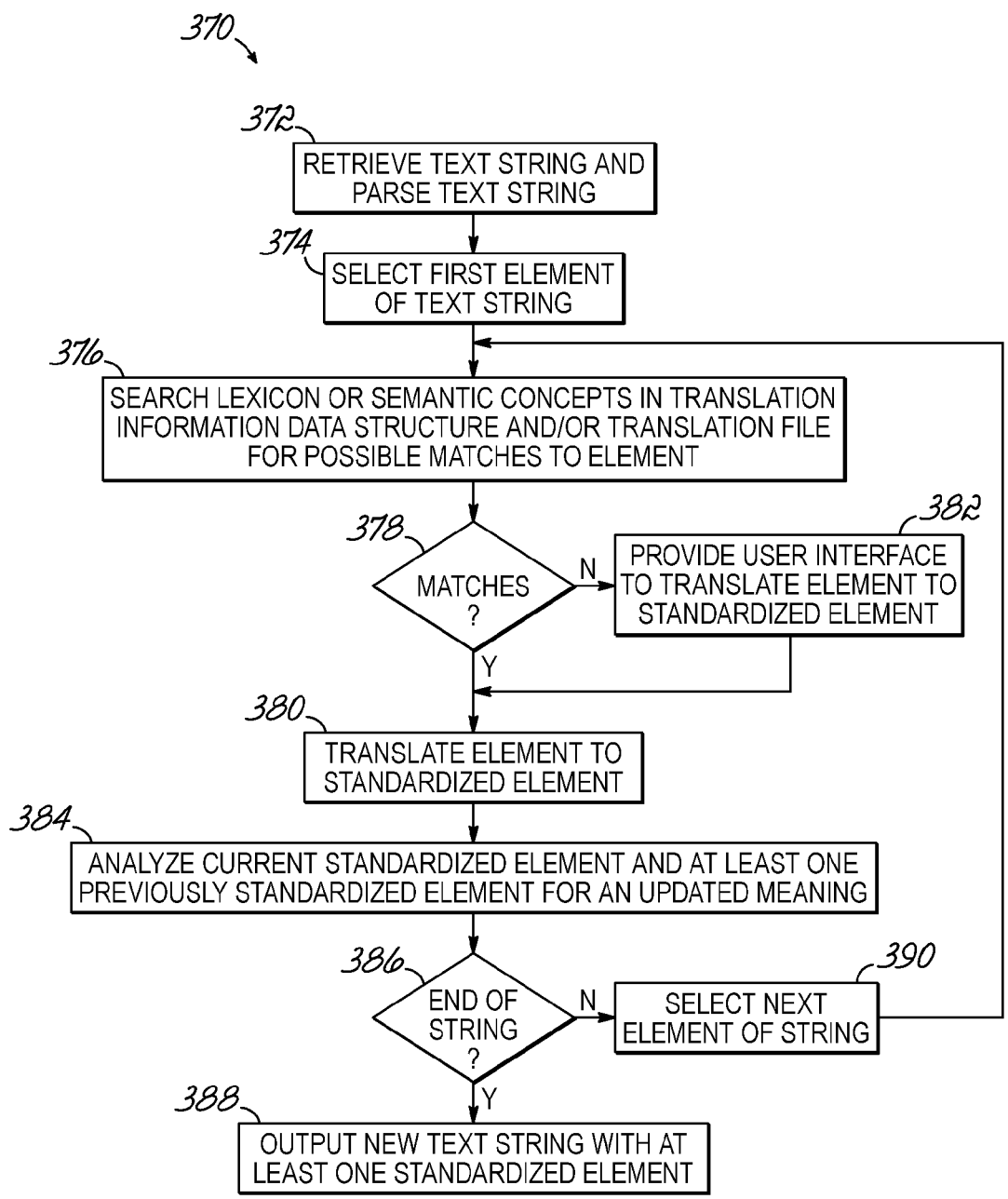
FIG. 18 is a flowchart illustrating a sequence of operations that may be executed by the application of FIG. 3 to standardize text strings associated with NDE data and/or inspection information.

FIG. 18 is a flowchart 370 illustrating in more detail the translation process 144 of FIG. 7. In response to determining that there is translatable information to translate, a text string of the translatable information is retrieved and parsed (block 372). In some embodiments, the text string is parsed by separating each element of the text string (e.g., each element of the text string separated by at least one space character). In this manner, the first element of the text string is selected (block 374) and a lexicon or other semantic concept in the translation information data structure and/or translate file is searched for that first element (block 376). When there is a match for the element ("Yes" branch of decision block 378) that element is automatically translated to the standardized element (block 380). When there is not a match ("No" branch of decision block 378) a user interface may be provided to translate the element to a standardized element (block 382) and the element may be translated to the standardized element manually (block 380).

In response to translating the element either manually or automatically, the most recently standardized element and at least one previously standardized element may be analyzed for an updated meaning (block 384). In particular, the most recently standardized element and at least one previously standardized element may be compared to the semantic concepts to determine if their meaning should be updated. The sequence of operations may then determine whether the end of the string has been reached (block 386). When the end of the string has been reached ("Yes" branch of decision block 386) a new text string with at least one standardized element is output (block 388). In particular, the new text string may be output and stored in inspection information associated with NDE data. When the end of the string has not been reached ("No" branch of decision block 386) the next element of the text string is selected (block 390) and the sequence of operations returns to block 376. It will be appreciated that the flowchart 370 may be repeated for at least a portion of translatable information associated with NDE data and/or inspection data associated therewith consistent with embodiments of the invention.

Figure 19:
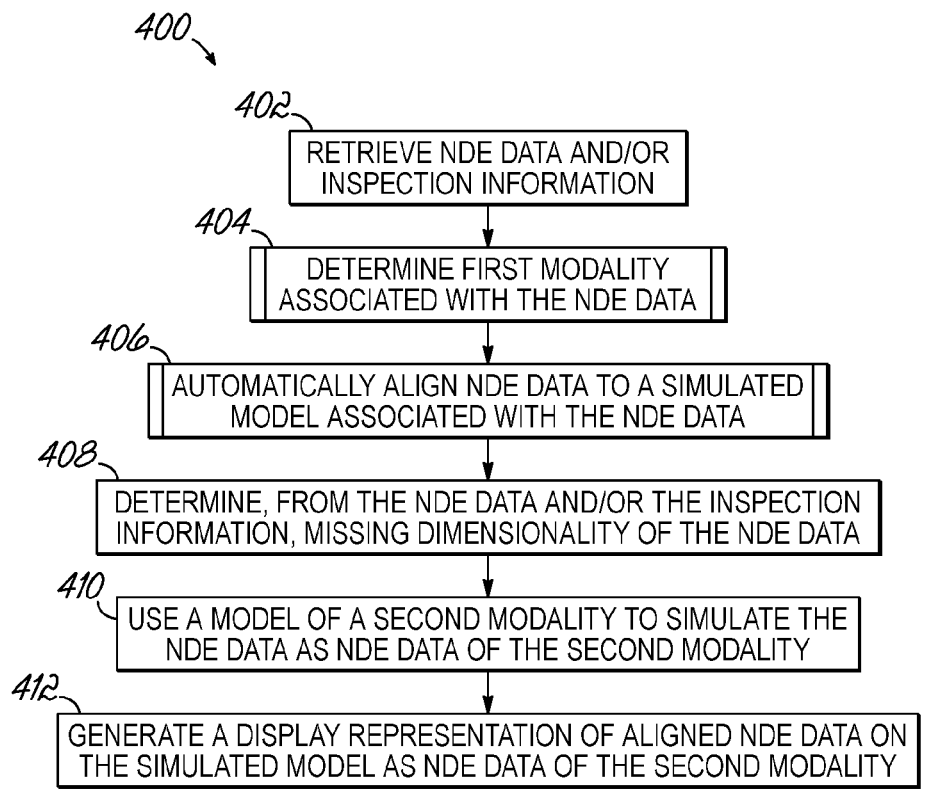
FIG. 19 is a flowchart illustrating a sequence of operations that may be executed by the application of FIG. 3 to display NDE data of a first modality as NDE data of a second modality.

FIG. 19 is a flowchart 400 illustrating a sequence of operations to display NDE data of a first modality as NDE data of a second modality consistent with embodiments of the invention. In particular, it may be useful to display the NDE data of the first modality as NDE data of the second modality for ease of users by users familiar and trained to interpret NDE data of the second modality. Thus, NDE data and/or inspection information associated therewith is retrieved (block 402) and the modality of the NDE data (e.g., the "first" modality) is determined (block 404). In an optional step, the NDE data may be automatically aligned to a simulated model associated therewith (block 406). Using a model of the NDE data collection device that collected the NDE data, the known structure of the at least a portion of the asset with which the NDE data is associated and/or data from the inspection information, a missing dimensionality of the NDE data may be determined (block 408). A model of a second modality to simulate the NDE data as NDE data of the second modality may be used (block 410) and a display representation of the aligned NDE data on the simulated model as NDE data of the second modality may be generated (block 412).

Figure 20:
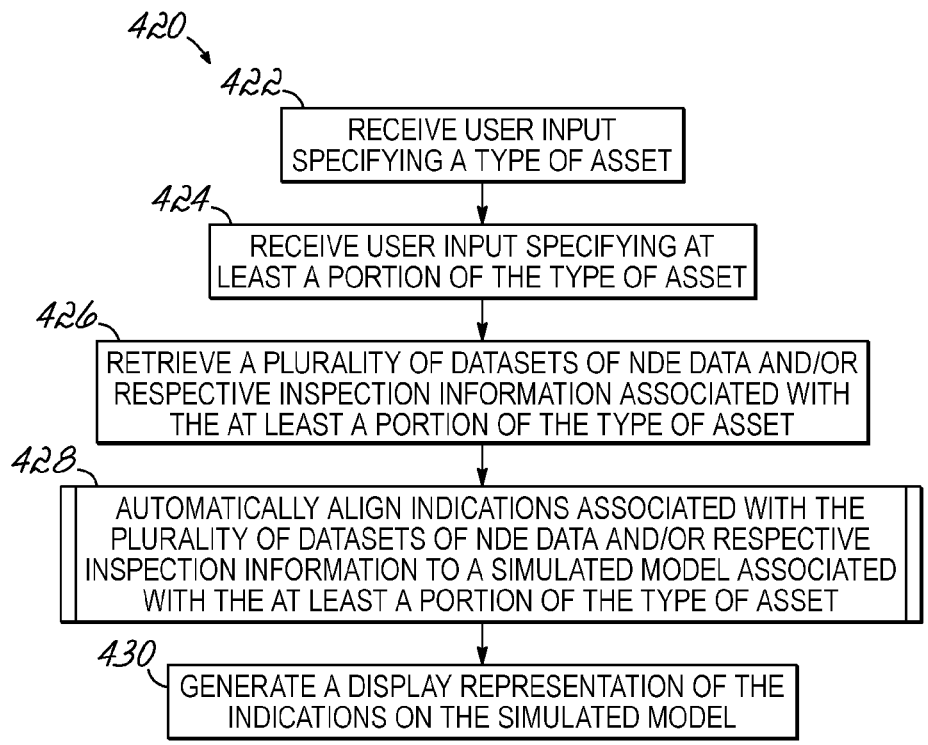
FIG. 20 is a flowchart illustrating a sequence of operations that may be executed by the application of FIG. 3 to display indications from a plurality of datasets of NDE data associated with a similar portion of a plurality of assets.

FIG. 20 is a flowchart 420 illustrating a sequence of operations to display indications from a plurality of datasets of NDE data associated with a similar portion of a plurality of assets consistent with embodiments of the invention. For example, user input specifying a type of asset is received (block 422) and user input specifying at least a portion of that type of asset is also received (block 424). In response to the specification of at least a portion of the type of asset, a plurality of datasets of NDE data and/or respective inspection information associated with the at least a portion of the type of asset may be retrieved (block 426) and indications associated with the plurality of datasets of NDE data and/or respective inspection information may be automatically aligned to a simulated model associated with the at least a portion of the type of asset (block 428). As such, a display representation of the indications associated with the plurality of datasets of NDE data and/or the respective inspection information on the simulated model is generated (block 430).

For example, a user may wish to view indications associated with a population of a particular type of asset. The asset may be a tank, and the user may wish to view indications for all right front turret armor sections of a plurality of tanks. Thus, the user may specify a tank as the type of asset and the portion of the tanks (e.g., right front turret armor sections) that they wish to view indications for. The datasets of NDE data and inspection information associated with the right front turret armor sections of a plurality of tanks may be retrieved, and any indications therein automatically aligned to a simulated model of the right front turret armor sections of a tank. Thus, a display representation of the indications associated with the respective right front turret armor sections of a plurality of tanks may be displayed for the user to view potential population-wide problems, and any trends for indications of that particular population may be determined.

Figure 21:
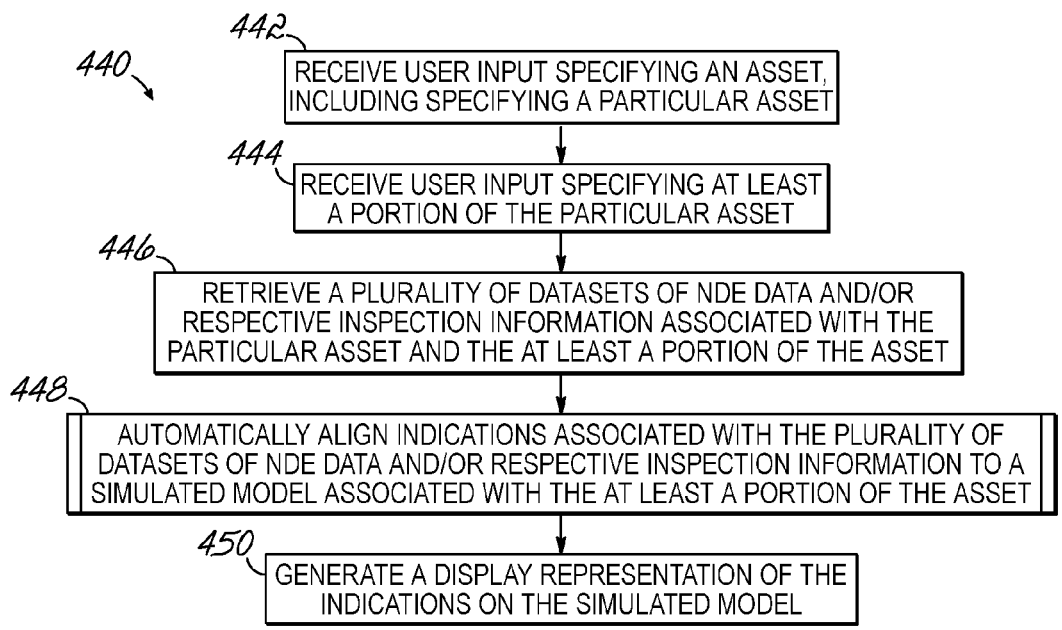
FIG. 21 is a flowchart illustrating a sequence of operations that may be executed by the application of FIG. 3 to display indications from a plurality of datasets of NDE data associated with at least a portion of a particular asset.

FIG. 21 is a flowchart 440 illustrating a sequence of operations to display indications from a plurality of datasets of NDE data associated with at least a portion of a particular asset consistent with embodiments of the invention. For example, user input specifying an asset, and specifically a particular asset, is received (block 442) and user input specifying at least a portion of the particular asset is also received (block 444). In some embodiments, the particular asset may be identified by a unique identification, such as a serial number of that particular asset. In response to the user input, a plurality of datasets of NDE data and/or respective inspection information associated with the at least a portion of the particular asset are retrieved (block 448) and a display representation of the indications associated with the plurality of datasets of NDE data and/or the respective inspection information on the simulated model is generated (block 450).

For example, a user may wish to view indications associated with a particular asset. The asset may be a particular tank, and the user may wish to view indications for the right front turret armor section of that tank. Thus, the user may specify the tank by serial number and the portion of the tank (e.g., right front turret armor section) that they wish to view indications for. The datasets of NDE data and inspection information associated with the right front turret armor section of the particular tank may be retrieved, and any indications therein automatically aligned to a simulated model of the right front turret armor section of that type of tank. Thus, a display representation of the indications associated with the respective right front turret armor section of a particular tank may be displayed for the user to view potential problems of that tank, and any trends in indications for that particular tank may be determined.

Figure 22:
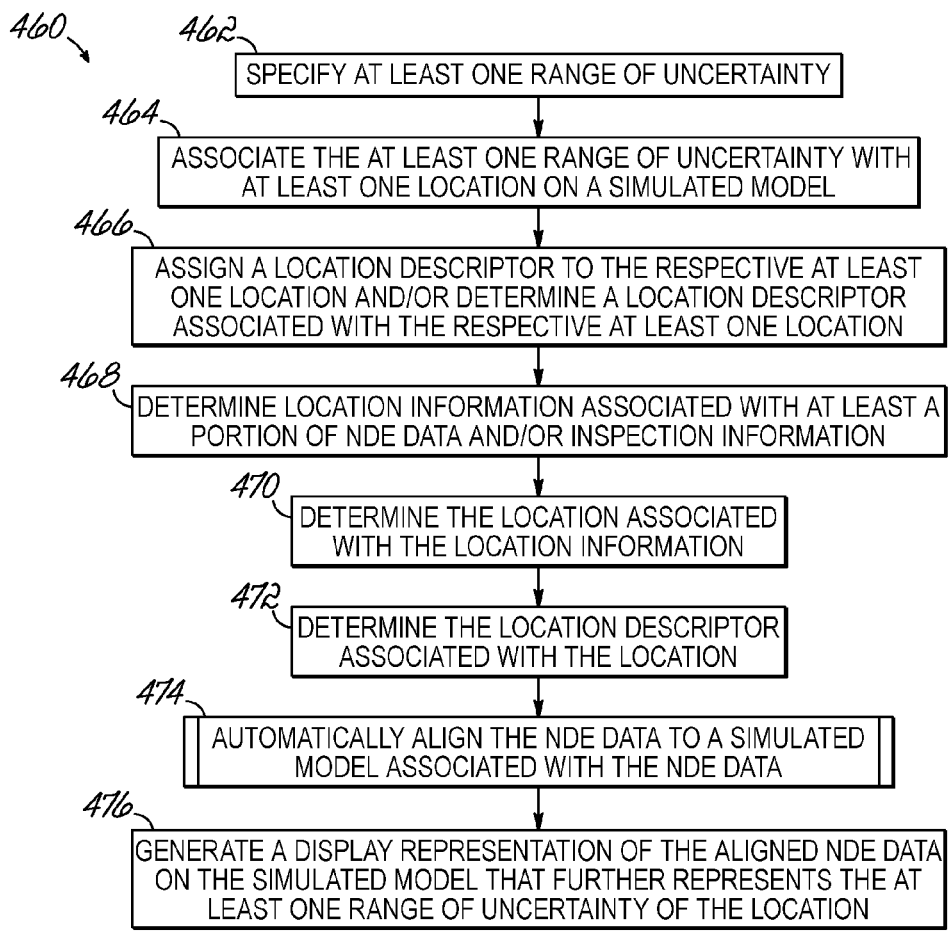
FIG. 22 is a flowchart illustrating a sequence of operations that may be executed by the application of FIG. 3 to determine the uncertainty of a location on a simulated model.

FIG. 22 is a flowchart 460 illustrating a sequence of operations to determine uncertainty of a location on a simulated model consistent with embodiments of the invention. In particular, the sequence of operations 460 may be used to specify a range of uncertainty of a location, such as the location of an indication. As such, at least one range of uncertainty may be specified (block 462) and that at least one range of uncertainty may be associated with at least one location on a simulated model (block 464). For example, the range of uncertainty for a particular location may be associated with a portion of an asset or a sub-portion thereof. More specifically, and also for uncertainty, the range of uncertainty for an axle beam of a landing gear on an aircraft may include a first range for the axle beam itself, a second range for the axle beam and couplers of the axle beam to a tire, or the entire axle beam assembly in which that axle beam is disposed. Alternatively, the range of uncertainty may be specified as a probability distribution function such that the further from the center of the location, the smaller the probability of the location being encompassed in the probability distribution function. Alternatively, the uncertainty may not be specified, and instead may be determined from at least one of the inspection information associated with NDE data, the modality of NDE data, and/or the alignment of the NDE data to the simulated model.

In response to associating the at least one range of uncertainty with at least one location on a simulated model, a location descriptor is assigned to the respective at least one location and/or a location descriptor previously associated with the respective at least one location is determined (block 466). Thus, and in some embodiments, various ranges of uncertainty may be associated with various locations, and thus various location descriptors, on a simulated model. Also in this manner, an indication specifying a location on the simulated model may be automatically associated with not only a location descriptor but also a range of uncertainty. For example, location information associated with at least a portion of NDE data and/or location information may be determined (block 468). In particular, the location information may be determined in response to receiving the NDE data and/or location information. In response to determining the location information, a location associated with the location information may be determined (block 472) and, in response to determining the location, a location descriptor associated with the location may be determined (block 472). As such, the NDE data may be automatically aligned to a simulated model associated with the NDE data (block 474) and a display representation of the aligned NDE data on the simulated model that includes the at least one range of uncertainty of the location may be generated (block 476).

Figure 23:
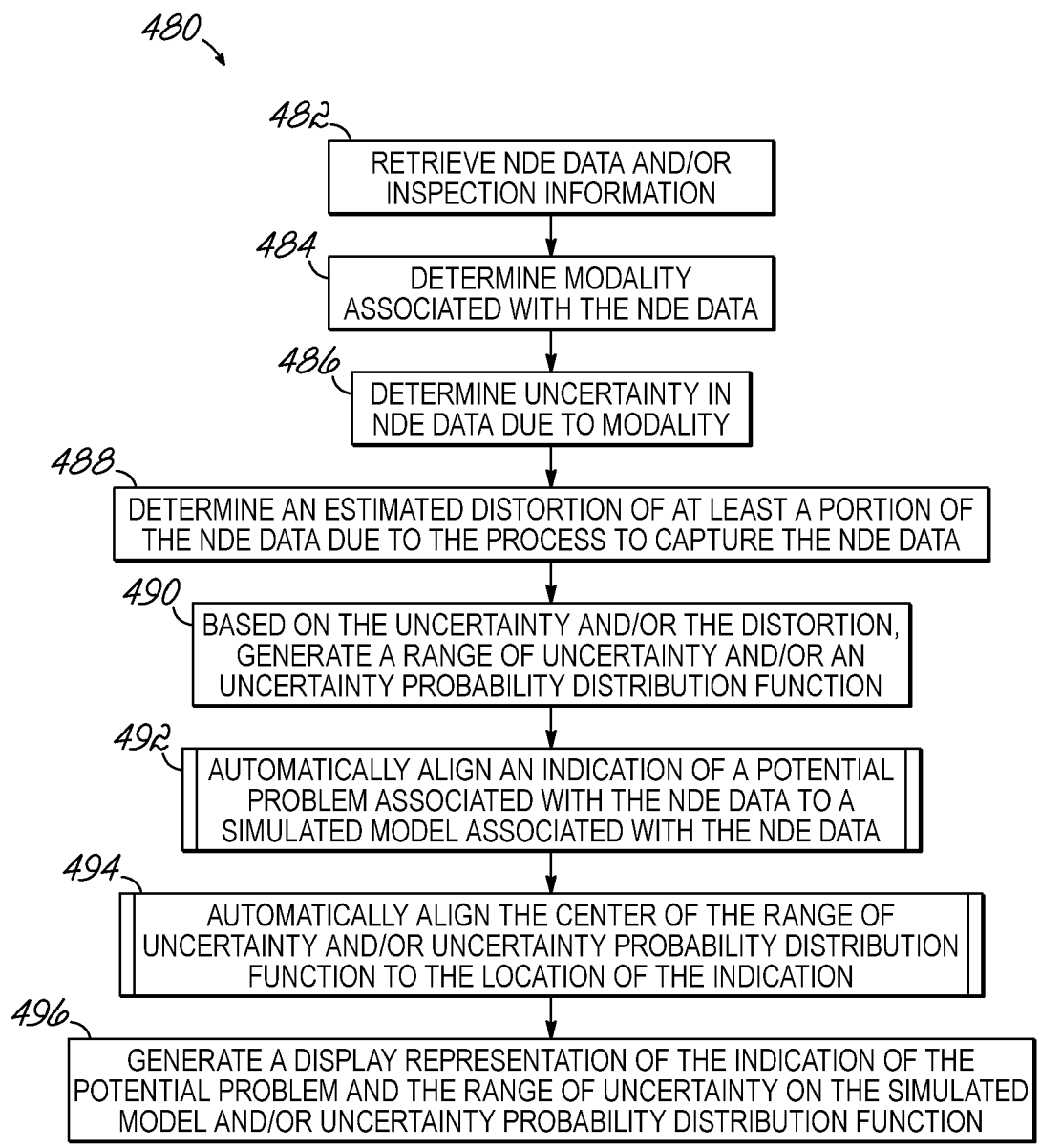
FIG. 23 is a flowchart illustrating a sequence of operations that may be executed by the application of FIG. 3 to determine the uncertainty of a location on a simulated model due to the inspection process, and in particular due to the various modalities associated with NDE data.

FIG. 23 is a flowchart 480 illustrating a sequence of operations to determine uncertainty of a location on a simulated model due to the inspection process, and particular due to the various modalities associated with NDE data, consistent with embodiments of the invention. In particular, it may be useful to display a range of uncertainty associated with a particular modality of NDE data, or otherwise display a range of uncertainty associated with the capture of NDE data with an NDE data collection device. Thus, NDE data and/or inspection information associated therewith is retrieved (block 482) and the modality of the NDE data is determined (block 484). Thereafter, an uncertainty (e.g., a range of uncertainty) in the NDE data due to the modality of the NDE data may be determined (block 486) and an estimated distortion of at least a portion of the NDE data due to the process to capture the NDE data may be determined (block 488). In some embodiments, the uncertainty in the NDE data due to the modality of the NDE data is specified by a user. Alternatively, the uncertainty in the NDE data due to the modality of the NDE data may be retrieved from a previous specification by the user. The distortion, however, may be determined by how NDE data is captured. For example, NDE data may be two-dimensional NDE data captured from a three-dimensional portion of an asset. Thus, there is distortion between the two-dimensional NDE data and the simulated model associated therewith. Thus, the distortion and/or the uncertainty may be used to generate a range of uncertainty and/or an uncertainty probability distribution function associated with that NDE data (block 490).

After determining the range of uncertainty and/or the uncertainty probability distribution function associated with NDE data, an indication of a potential problem associated with the NDE data may be automatically aligned to a simulated model associated with the NDE data (block 492) and the center of the range of uncertainty and/or the uncertainty probability distribution function may be automatically aligned to the location of the indication (block 494). Thus, the location of the indication as well as the range of uncertainty and/or the uncertainty probability distribution function associated with the location of the indication may be generated on a display representation (496). In this manner, the uncertainty in the location of an indication due to the capture of the NDE data with the NDE data collection device may be determined and displayed.

Figure 24:
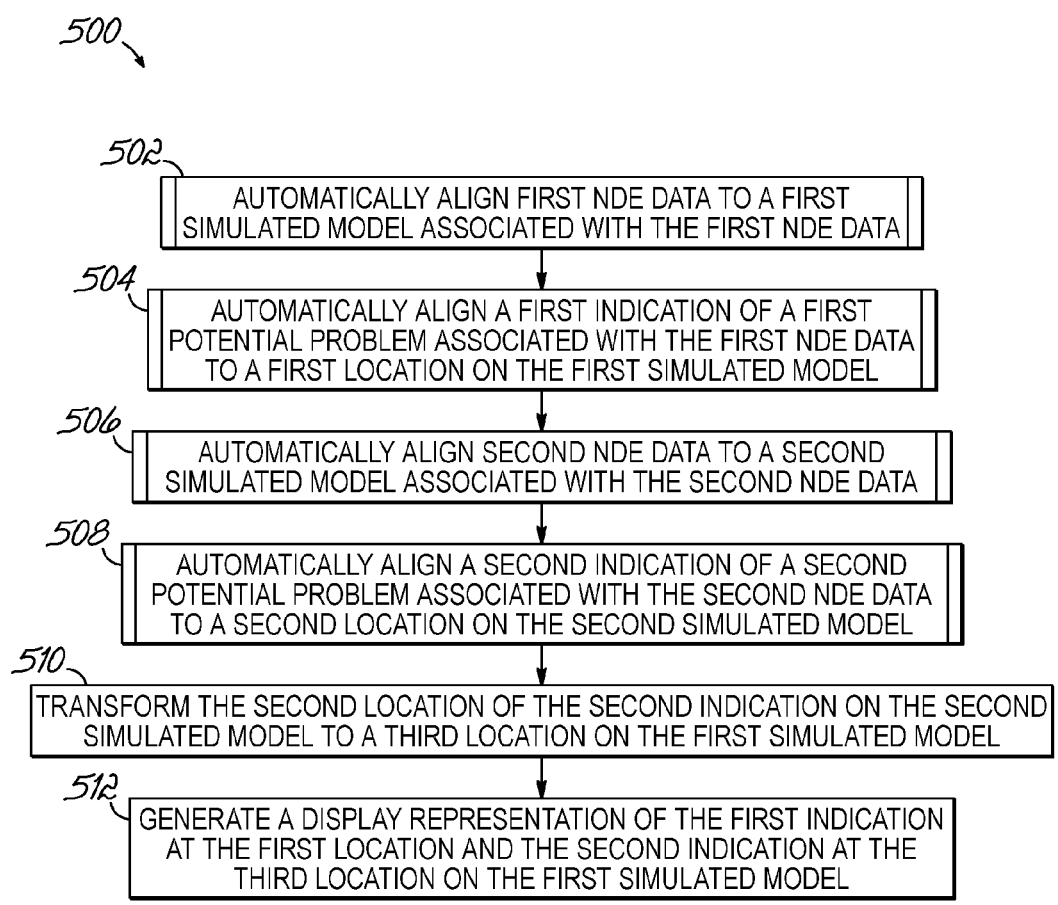
FIG. 24 is a flowchart illustrating a sequence of operations that may be executed by the application of FIG. 3 to display a plurality of indications of portions of at least one asset that are substantially structurally similar, but that may be located at different locations on the at least one asset or that are oriented in different manners respective to each other.

FIG. 24 is a flowchart 500 illustrating a sequence of operations to display a plurality of indications of portions of at least one asset that are substantially structurally similar, but that may be located at different locations on the at least one asset or that are oriented in different manners respective to each other. For example, the sequence of operations 500 may be used to display a first and second indication associated with a respective first and second wing (e.g., of the same or different assets) on a simulated model of the first wing by transforming the location of the second indication on the second wing into a location on the first wing. Thus, first NDE data is automatically aligned to a first simulated model associated with the first NDE data (block 502) and a first indication associated with the first NDE data is automatically aligned to a first location on the first simulated model (block 504). Similarly, second NDE data is automatically aligned to a second simulated model associated with the second NDE data (block 506) and a second indication associated with the second NDE data is automatically aligned to a second location on the second simulated model (block 508). The second location of the second indication on the second simulated model is then transformed to a corresponding third location on the first simulated model (block 510). For example, when the first NDE data is NDE data from a right wing of an asset and the second NDE data is NDE data from a left wing of the asset, the transformation between the simulated models associated with the respective first and second NDE data may include a mirror reflection transformation between the simulated models associated with the respective first and second NDE data. Also for example, the transformation may include transforming a location across at least one axis of transformation between the simulated model associated with the respective first and second NDE data. A display representation of the first indication at the first location on the first simulated model, as well as the second indication at the third location on the first simulated model, is then generated (block 512). In this manner, indications of portions of at least one asset that are substantially structurally similar but otherwise oriented in different manner respective to each other may be viewed on a single simulated model. Thus, a user may view trends for at least two different portions of at least one asset on one simulated model.

Figure 25:
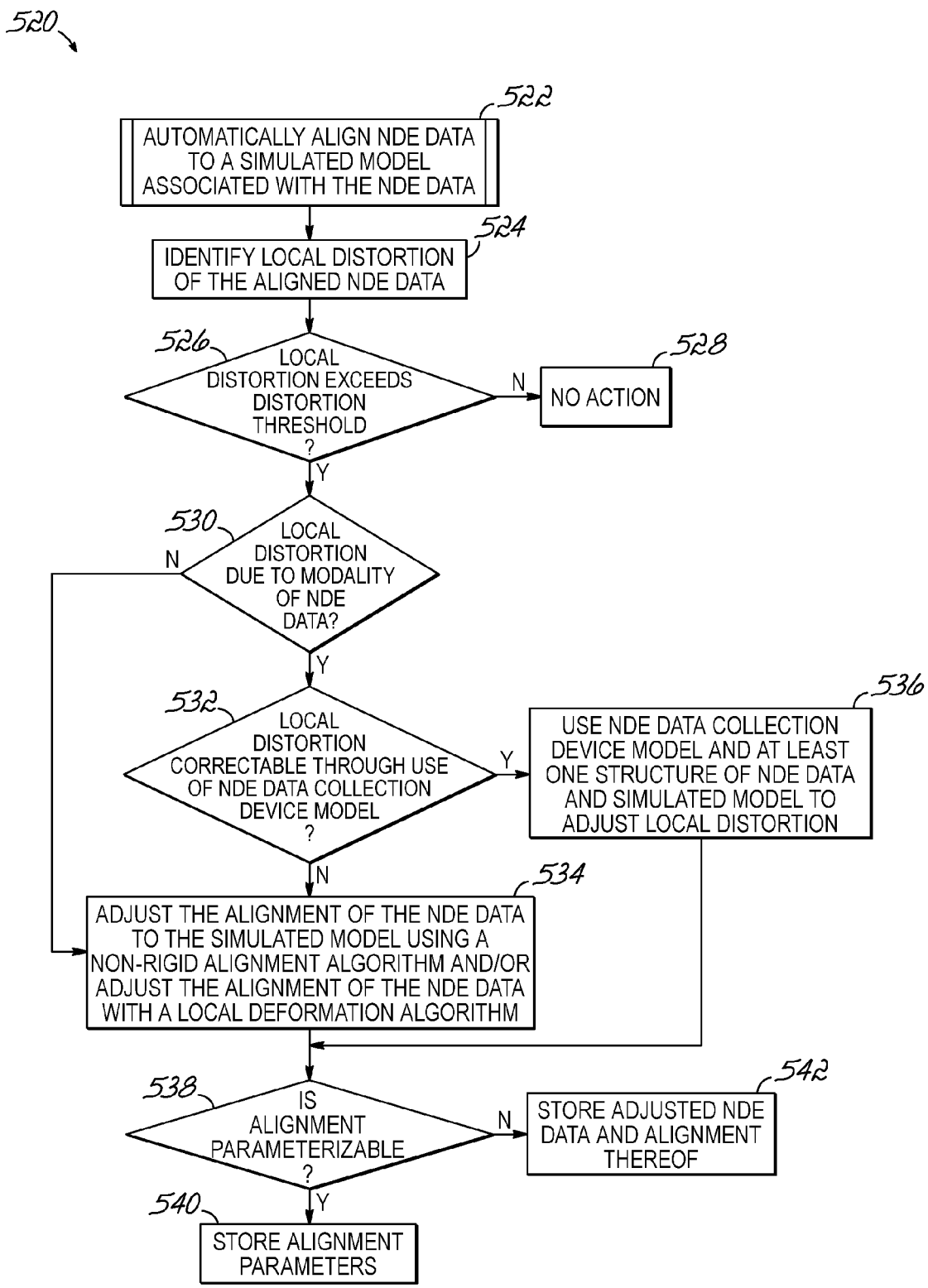
FIG. 25 is a flowchart illustrating a sequence of operations that may be executed by the application of FIG. 3 to locally deform at least a portion of NDE data.

FIG. 25 is a flowchart 520 illustrating a sequence of operations to locally deform at least a portion of the NDE data. Initially, NDE data may be automatically aligned to a simulated model associated with the NDE data with an alignment algorithm that rigidly attempts to align the NDE data with the simulated model (e.g., a "rigid" alignment algorithm that only rotates, translates and/or scales NDE data) (block 522). For example, and not intending to be limiting, a rigid alignment algorithm may attempt to align the NDE data to the simulated model based on matching at least one straight-line section of the NDE data to at least one corresponding straight-line section on the simulated model regardless of other portions of the NDE data. However, the alignment of a portion of the NDE data may be slightly distorted in relation to the simulated model and/or the asset. In particular, the NDE data may be slightly distorted due to the manner in which that NDE data is captured from the asset, human error and/or the NDE data collection device used to capture the NDE data, for a few examples. As such, local distortion of the aligned NDE data may be identified (e.g., the local distortion between at least one and/or all portions of the NDE data that were not used to align the NDE data) (block 524) and it may be determined whether that local distortion exceeds a distortion threshold for distortion (block 526). When the local distortion (e.g., the local distortion of at least one and/or all portions of the NDE data that were not used to align the NDE data) does not exceed a distortion threshold ("No" branch of decision block 526) no action may be taken (block 528). However, when the local distortion exceeds the distortion threshold ("Yes" branch of decision block 528), the local distortion may be analyzed to determine if that local distortion is due to the modality of the NDE data (block 530). When the local distortion is due to the modality of the NDE data ("Yes" branch of decision block 530), the local distortion may be analyzed to determine if the local distortion is correctable through the use of a model of the NDE data collection device used to capture the NDE data (block 532). When the local distortion is not correctable through the use of the model of the NDE data collection device used to capture the NDE data ("No" branch of decision block 532), the NDE data may be automatically re-aligned to the simulated model using an alignment algorithm that does not rigidly attempt to align the NDE data with the simulated model (e.g., a "non-rigid" alignment algorithm) and/or the aligned NDE data may be adjusted with a local deformation algorithm (block 534).

In some embodiments, the non-rigid alignment algorithm attempts to align at least two portions of NDE data with at least two corresponding portions of a simulated model associated with the NDE data. The non-rigid alignment algorithm may include at least one local deformation algorithm that may be used when a first portion of the NDE data aligns with the simulated model but a second portion does not. Thus, the alignment algorithm may utilize the local deformation algorithm on the second portion and/or the first portion in an attempt to align the NDE data to the simulated model. In alternative embodiments, a local deformation algorithm is utilized to align at least a portion of aligned NDE data to the simulated model to reduce local distortion. As such, the local deformation algorithm may be applied to at least one portion of the NDE data to more closely align that at least one portion to the simulated model. Returning to block 530, when the local distortion is not due to the modality of the NDE data ("No" branch of decision block 530), the NDE data may be automatically re-aligned to the simulated model using the non-rigid alignment algorithm and/or the aligned NDE data may be adjusted with a local deformation algorithm (block 534). In some embodiments, the non-rigid alignment algorithm is utilized to re-align the NDE data to the simulated model (block 534) when the alignment algorithm used in block 522 is a rigid alignment algorithm. In corresponding embodiments, the local deformation algorithm is used to adjust the aligned NDE data (block 534) when the alignment algorithm used in block 522 is a non-rigid alignment algorithm.

Returning to block 532, when the local distortion is correctable through the use of the NDE data collection device model ("Yes" branch of decision block 532), the model of the NDE data collection device and at least one structure of the NDE data and simulated model (e.g., at least one structure of the at least a portion of the asset that is associated with both the NDE data and the simulated model) may be used to adjust the local distortion of the NDE data (block 536). In some embodiments, the model of the NDE data collection device includes at least one parameter to adjust NDE data associated with the respective modality of NDE data captured with that NDE data collection device. Thus, the alignment of a portion of the NDE data to the simulated model may be adjusted using the NDE data collection device model and at least one known structure common to the NDE data and the simulated model to correct local distortion.

In response to automatically re-aligning the NDE data to the simulated model using a non-rigid alignment algorithm (block 534), adjusting the aligned NDE data with a local deformation algorithm (block 534), or using the NDE data collection device model and at least one known structure of the NDE data and the simulated model to adjust local distortion (block 536), the alignment of the NDE data to the simulated model may be analyzed to determine if the alignment is parameterizable (e.g., whether the alignment of the NDE data to the simulated model can be expressed through at least one parameter to align subsequent NDE data to the simulated model) (block 538). When the alignment of the NDE data to the simulated model is parameterizable ("Yes" branch of decision block 538) the alignment parameters for that alignment of the NDE data to the simulated model are stored (block 540). When the alignment of the NDE data to the simulated model is not parameterizable (e.g., such as when a portion of the NDE data is adjusted in blocks 534 or 536) ("No" branch of decision block 538) the adjusted NDE data itself, as well as the alignment of that adjusted NDE data, are stored (block 542).

Figure 48:
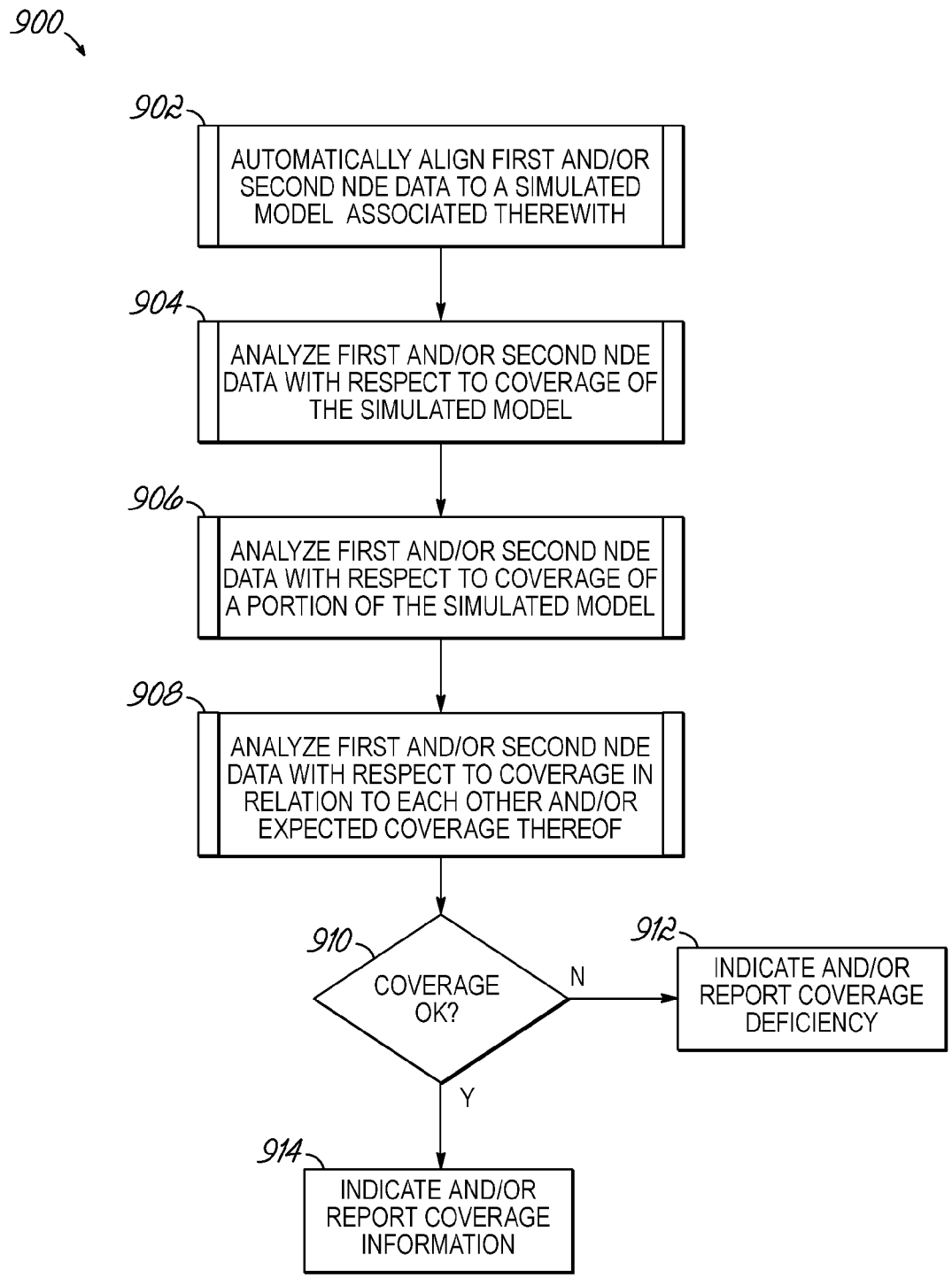
FIG. 48 is a flowchart illustrating a sequence of operations that may be executed by the application of FIG. 3 to analyze aligned NDE data on a simulated model for coverage.

FIG. 48 is a flowchart 900 illustrating a sequence of operations to analyze at least one dataset of NDE data with respect to coverage. For example, first and/or second NDE data may be automatically aligned to a simulated model associated therewith as previously described (block 902). In various embodiments, the first NDE data may be associated with the second NDE data in that both are NDE data associated with the same portion of an asset, that the first NDE data is adjacent to the second NDE data, that the first NDE data and the second NDE data are associated with the same asset, and/or that the first NDE data and the second NDE data are associated with the same inspection. In particular, the first and/or second NDE data may be aligned with one alignment algorithm or with respective first and second alignment algorithms consistent with embodiments of the invention. Once aligned, the first and/or second NDE data, as well as the simulated model, may be analyzed to determine coverage of the first and/or second NDE data in relation a simulated model (e.g., coverage of NDE data on the simulated model, which may be expressed in a statistical measure), coverage of the first and/or second NDE data in relation to a portion of the simulated model (e.g., actual coverage of NDE data on a portion of the simulated model, and in particular a specifically defined portion of the simulated model, which may be expressed in a statistical measure), and/or coverage of the first and/or second NDE data in relation to each other and/or the expected coverage thereof (e.g., whether the first and second NDE data overlap and/or have a gap therebetween and whether the first and second NDE data are supposed to be configured as such). As such, it will be appreciated that one or more of the analysis blocks 904-908 may be executed, and that an analysis of the coverage of the first and/or second NDE data may not require all such blocks.

In some embodiments, the coverage of NDE data on a simulated model may be determined by projecting a plurality of lines from the simulated model to the aligned NDE data and/or from the aligned NDE data to the simulated model. In specific embodiments, the plurality of lines are projected along the axis of alignment of the NDE data to the simulated model. When the projection intersects both the NDE data and the simulated model, then it is determined that the NDE data "covers" the simulated model at the point. As such, the aligned first and/or second NDE data may be analyzed with respect to coverage of the simulated model (block 904). In some embodiments, the analysis in block 904 may include determining information about at least one area of the simulated model covered by the first and/or second NDE data. Alternatively, the analysis in block 904 may include determining information about at least one area of the simulated model that is not covered by the first and/or second NDE data. For example, if the first NDE data covers about 20% of the simulated model, information about coverage of the simulated model may include data indicating that the percentage of coverage of the first NDE data is about 20%, and the information about coverage of the simulated model may include data indicating that the percentage of area of the simulated model that is not covered by the first NDE data is about 80%. It will be appreciated that, in some embodiments, the coverage of the simulated model may be determined with respect to more than one dataset of NDE data. In particular, the coverage may be determined with respect to a plurality of datasets of NDE data. For example, the coverage of a plurality of datasets of NDE data, including the first and/or second NDE data, may indicate that the plurality of datasets of NDE data cover about 98% of the simulated model. Alternatively, the coverage of the plurality of datasets of NDE data may indicate that the percentage of area of the simulated model that is not covered by the plurality of datasets of NDE data is about 2%. Additionally, the coverage of the plurality of datasets of NDE data may be compared to at least one previous coverage of another plurality of datasets and the variability of coverage over time may be indicated in a statistical measure, and more specifically a chart or graph of a plurality of statistical measures.

The analysis of the first and/or second NDE data with respect to coverage of the simulated model may be performed in one or more of a plurality of ways. For example, a point-by-point hit test of a point on the simulated model and a corresponding point on aligned NDE data may be analyzed to determine coverage. The simulated model is analyzed at the point and the first and/or second NDE data is analyzed at a corresponding point to determine if there is matching data. The points may include a pixel or a plurality of pixels. In some embodiments, the coverage at a point may be determined by projecting a plurality of lines from the simulated model to the aligned NDE data and/or from the aligned NDE data to the simulated model at respective points. In specific embodiments, the plurality of lines are projected along the axis of alignment of the NDE data to the simulated model at their respective points. When a projection intersects both aligned NDE data and the simulated model, then it is determined that the NDE data "covers" the simulated model at the point. If there is not matching data (such as when there is simulated model data but not NDE data at the point), there is no coverage at both points. Alternatively, a vertex-by-vertex hit test, a feature-by-feature hit test, and/or a features-by-features hit test may operate similarly to the point-by-point hit test, with the exception of focusing on a respective vertex of the simulated model, respective feature of the simulated model and/or respective plurality of features of the simulated model, the first NDE data and/or the second NDE data.

Furthermore, the analysis of the first and/or second NDE data with respect to coverage of the simulated model may be performed with a floodfill algorithm. In some embodiments, a floodfill algorithm is configured to define and fill a boundary of the simulated model. It may then be determined whether the area defined by the boundary is associated with the first and/or second NDE data. In some embodiments, the floodfill algorithm may be configured to fill in any areas of the simulated model that are not associated with the first and/or second NDE data, while in alternative embodiments the floodfill algorithm may be configured to fill in any areas of the simulated model that are associated with the first and/or second NDE data. From the floodfilled areas, the coverage of the simulated model, and/or the first and/or second NDE data, may be determined. Information about coverage of the simulated model, and/or the first and/or second NDE data, may be provided in a report and/or on a display representation of the simulated model.

In some embodiments, the aligned first and/or second NDE data may be analyzed with respect to coverage of a portion of the simulated model and/or expected coverage thereof (block 906). For example, the portion of the simulated model may be a portion associated with the first and/or second NDE data, such as an expected portion that the first and/or second NDE data are supposed to cover. Specifically, the particular portion of the simulated model may be defined by a region which, in turn, may be defined by a boundary (e.g., a parallelogram, a circle, an abstract boundary that follows the contours of a portion of NDE data or a simulated model, etc.). Data associated with the first and/or second NDE data may then be compared to the edge of a boundary and/or the area within to determine coverage. Specifically, a region of the simulated model may be established and it may be determined whether an area of the region is associated with at least a portion of the first and/or second NDE data. Similarly, a boundary of the region of the simulated model may be established and it may be determined whether the boundary of the region is associated with a corresponding boundary in the first and/or second NDE data, and/or whether data associated with the boundary of the region is associated with corresponding data associated with a corresponding boundary of a region in the first and/or second NDE data. In specific embodiments, it may be known that a particular dataset of NDE data should encompass a rectangular area defined by four lines. A line by line comparison may then be performed against the plurality of lines defining the boundary of the dataset of NDE data and the boundary of the dataset of NDE data to determine the coverage thereof. Alternatively, an area comparison may be performed against the area defined by the plurality of lines and the area of the dataset of NDE data to determine the coverage thereof. Alternatively, any of the methods described above (e.g., portion-by-portion, vertex-based, feature-based, floodfill algorithm) may be used to analyze the aligned first and/or second NDE data with respect to coverage of the portion of the simulated model and/or the expected coverage thereof. Information about coverage of the portion of the simulated model may be provided in a report and/or on a display representation of the simulated model. In some embodiments, areas of the simulated model that are filled by the floodfill algorithm and also associated with the first and/or second NDE data may be removed from a display representation of the aligned first and/or second NDE data, leaving only those portions of the simulated model that were not covered by the first and/or second NDE data. This allows a user to quickly view those portions of the simulated model that are not covered.

In some embodiments, the aligned first and/or second NDE data may be analyzed with respect to coverage of a portion of the simulated model in relation to each other (block 908). For example, the first NDE data may be associated with a portion of an asset and the second NDE data may be associated with the same portion. As such, the coverage of the first and second NDE data on the same simulated model may be analyzed to determine if there is missed coverage. Specifically, it may be desirable that the areas covered by the first and second NDE data match so as to indicate consistency in scans at the same or different times. When the areas don't match, those portions that are associated with first NDE data but not the second NDE data may be reported and/or indicated. Additionally, when the areas don't match, those portion that are associated with second NDE data but not the first NDE data may be reported and/or indicated. In specific embodiments, areas of the simulated model that are associated with first NDE data but not the second NDE data and/or areas of the simulated model that are associated with the second NDE data but not the first NDE data may be provided on a display representation of the simulated model.

Also for example, the first NDE data may be associated with a portion of an asset and the second NDE data may be associated with an adjacent portion. As such, coverage of the first and second NDE data on the same simulated model may be analyzed to determine if there is overlapping coverage. Specifically, it may be desirable that there is at least some area of overlap between the first and second NDE data so as to ensure coverage of an asset. When there is overlap, those portions that are associated with first NDE data and the NDE data may be reported and/or indicated. When there is no overlap but there is overlap expected (e.g., such as specified through a shot descriptor file or other data associating the first and second NDE data), those portions that should have been overlapped may be reported and/or indicated. In specific embodiments, areas of the simulated model that are associated with overlap of the first and second NDE data and/or areas of the simulated model that are not associated with overlap of the first and second NDE data but were expected to be associated with overlap may be indicated on a display representation of the simulated model.

In some embodiments, the statistical measure may indicate the degree of overlap of the a plurality of datasets of NDE data as well as the variability of overlap over time. For example, the degree of overlap may indicate the average degree of overlap between adjacent datasets of NDE data. More specifically, the statistical measure may indicate that the average degree of overlap between datasets of NDE data is about two to four inches. Alternatively, the statistical measure may indicate that the degree of overlap between datasets of NDE data is never less than two inches. As such, a process to obtain that NDE data may be adjusted to provide a greater or lesser degree of overlap, depending on the required degree of overlap. Moreover, a statistical measure, and more specifically a chart or graph of a plurality of statistical measures, may indicate the variability of overlap over time. When the variability of overlap over time is low, that may indicate that the method(s) used to obtain datasets of NDE data are sufficiently efficient and stable. When the variability of overlap over time is high, this may indicate that the method(s) used to obtain datasets of NDE data need improvement in reliability.

In some embodiments, and in an optional step, the analysis of any of blocks 904-908 may be used to determine if a coverage has satisfied a predetermined condition relating thereto (e.g., whether the coverage is "OK") (block 910). In specific embodiments, the predetermined condition may be that a particular statistical measure of coverage has been achieved or that a particular statistical measure of coverage has not been achieved. Alternatively, the predetermined condition may be that the first and/or second NDE data did not provide proper coverage in relation to a specific region, boundary, perimeter and/or plurality of lines that define the region, boundary and/or perimeter (e.g., the first and/or second NDE data did not cover the region, boundary, perimeter and/or plurality of lines that define the region, boundary and/ or perimeter, either partially or fully), that a specific feature was not properly covered (e.g., the specific feature was not covered either partially or fully), that specific plurality of features were not properly covered (e.g., the specific plurality of features were not covered either partially or fully), and/or that the first and second NDE data did not provide proper overlap. Thus, when the coverage has not satisfied the predetermined condition ("No" branch of decision block 910) the coverage deficiency may be provided in a report and/or on a display representation of the simulated model as discussed above (block 912). However, when the coverage has satisfied the predetermined condition ("Yes" branch of decision block 910) information about the coverage may be provided in a report and/or on a display representation of the simulated model as discussed above (block 914).

In some embodiments, the report may be provided as a database entry, a comma-separated value file, a printed report, a spreadsheet, an electronic document, or combinations thereof. Additionally, the report may be provided as a window generated by the program code that includes report information (e.g., the report information may be provided in a software-generated window). The report may indicate information about the coverage of simulated model with the first and/or second NDE data. Moreover, the report may indicate data about the first and/or second NDE data (e.g., including information from inspection data related thereto), the simulated model and/or the coverage of a portion of the simulated model with the first and/or second NDE data. Additionally, the report may include a display representation of the simulated model with a graphical representation of coverage thereupon.

In regard to providing the display representation of the simulated model to indicate coverage, the display representation may include a simulated model, one or more datasets of NDE data, and may be modified to change the color, pattern and/or another aspect of a background to highlight areas of missing coverage on the simulated model. Similarly, the display representation may be modified to change the color, pattern and/or another aspect of the background behind only the simulated model to highlight areas of missing coverage on the simulated model. For example, the simulated model is may be represented through a plurality of lines and the NDE data may be aligned and represented as discussed above. By adjusting a color of a background of a display representation to red, those areas of the simulated model that are not covered by NDE data are more easily visible. Alternatively, the display representation may be modified by changing the color, pattern and/or another aspect of the simulated model itself. For example, the plurality of lines may have their color modified to be red such that those lines that are not covered by NDE data are more easily visible. Even further alternatively, the display representation may be modified by changing the color, pattern and/or another aspect of aligned NDE data. For example, the aligned NDE data may be filled in, or otherwise replaced, with black boxes that occlude portions of the simulated model such that those areas of the simulated model that are not covered by NDE data are more easily visible.

Additionally, and still with regard to providing the display representation of the simulated model to indicate coverage, the display representation may be modified by highlighting those sections of the simulated model that are not covered by NDE data. Moreover, the display representation may be modified by removing portions of the simulated model that are not associated with NDE data, or alternatively removing portions of the simulated model that are associated with NDE data. Furthermore, and still with regard to providing the display representation of the simulated model to indicate coverage, those datasets of NDE data that are not providing proper coverage may be displayed on the simulated model and those vertexes and/or features that were not properly covered may be highlighted (as discussed above) and/or displayed on the simulated model. In the above examples, the color, pattern and/or other aspect of the background and/or simulated model may again be changed to more easily illustrate missed coverage.

Figure 49:
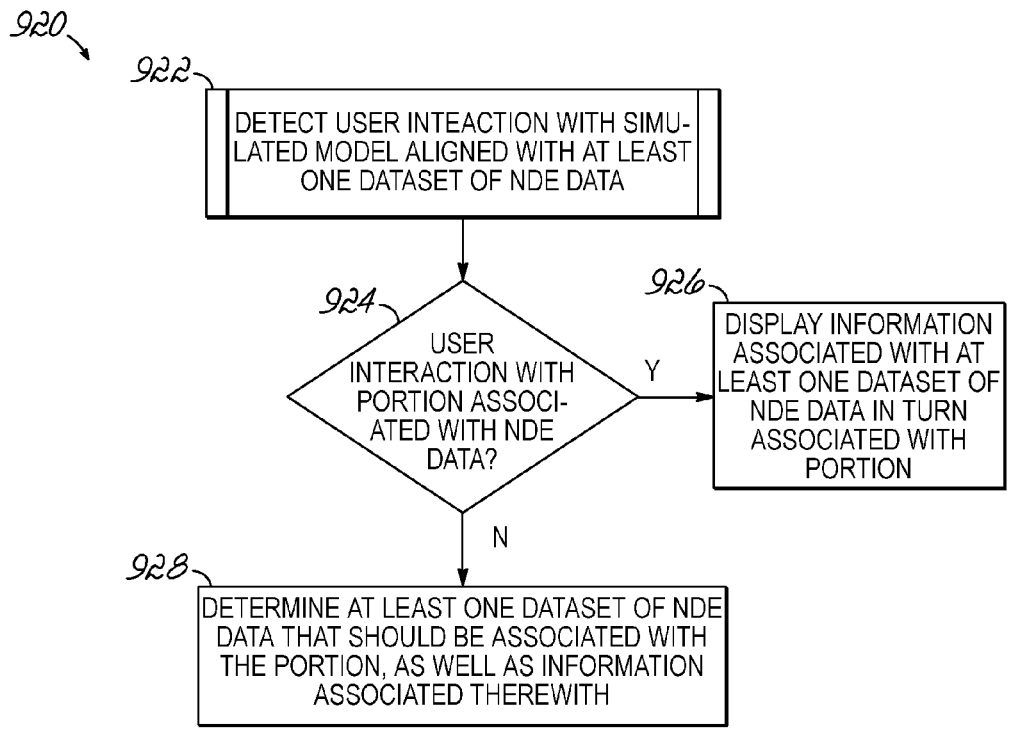
FIG. 49 is a flowchart illustrating a sequence of operations that may be executed by the application of FIG. 3 to detect user interaction with at least a portion of the display representation of a simulated model and display information related thereto.

FIG. 49 is a flowchart 920 illustrating a sequence of operations to detect user interaction with a portion of a simulated model and provide information related thereto. For example, user interaction with at least a portion of a simulated model aligned with at least one dataset of NDE data may be detected (block 922). In particular, the user interaction may be a selection and/or activation of the portion of the simulated model with a mouse. In response to the detection of user interaction, it may be determined whether the portion is associated with NDE data (block 924). When the portion is associated with NDE data (e.g., such as when a user selects a portion of the simulated model that is in turn associated with aligned NDE data) ("Yes" branch of decision block 924) information associated with the aligned NDE data in turn associated with the portion is displayed (block 926). The information may include information associated with the inspection information of the NDE data. However, when the portion is not associated with NDE data (e.g., such as when a user selects a portion of the simulated model that is not associated with aligned NDE data) ("No" branch of decision block 924) a dataset of NDE data that should be associated with the selected portion, as well as information associated therewith, may be determined (block 928). For example, if the selected portion is in a region that should be associated with one or more adjacent datasets of NDE data, an indication of the identity of the one or more adjacent datasets of NDE data will be determined, along with information associated therewith. Also for example, if the selected portion is in a region that was not associated with NDE data but a shot descriptor file for at least one other dataset of NDE data indicates that it should have been (e.g., the shot descriptor file for at least one other dataset of NDE data indicates that the "missing" NDE data is part of a sequence with that at least one dataset of NDE data), information about the missing NDE data (e.g., the sequence with which it is associated, the date it should have been taken, the inspector who should have taken it, etc.) may be determined. In some embodiments, the determined at least one dataset of NDE data that should have been associated with the selected portion, as well as the information associated therewith, may be provided to the user in a report and/or a display representation. In particular embodiments, that information is displayed through a pop-up information module. Alternatively, that information may be displayed in a selected indication information component that is configured to display information about selected indications.

Figure 50:
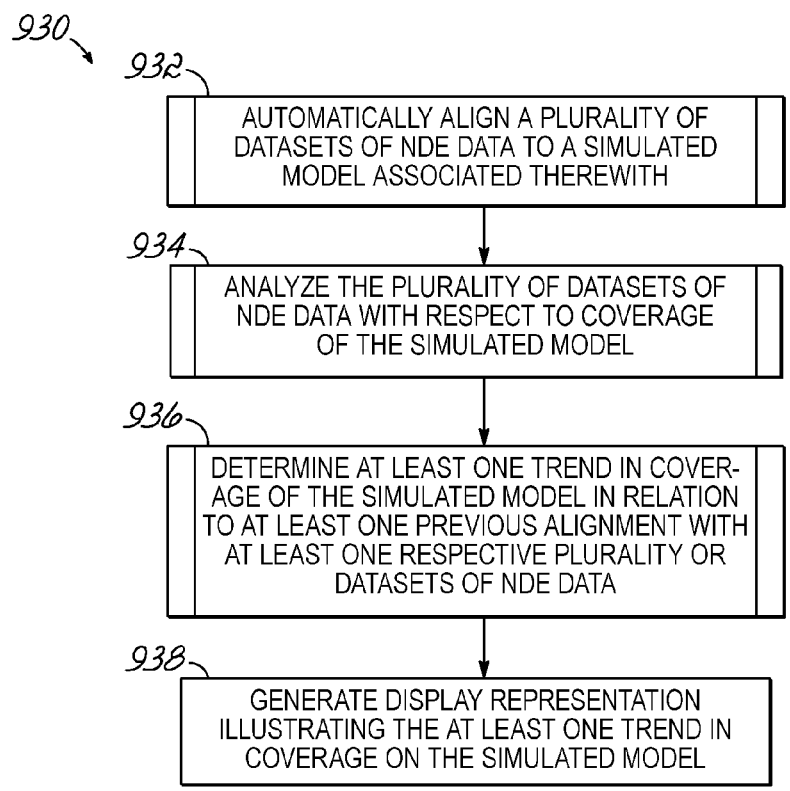
FIG. 50 is a flowchart illustrating a sequence of operations that may be executed by the application of FIG. 3 to determine a trend associated with coverage of a simulated model.

FIG. 50 is a flowchart 930 illustrating a sequence of operations to determine trend information associated with coverage of a plurality of datasets of NDE data. For example, determined plurality of NDE datasets may be automatically aligned to a simulated model associated therewith as discussed above (block 932). As such, the aligned plurality of NDE datasets may be analyzed with respect to coverage of the simulated model as discussed above (block 934). Thus, at least one trend in the coverage of the simulated model in relation to at least one previous alignment with at least one separate plurality of NDE datasets may be determined (block 936). In particular, the determination in block 936 may occur when there has been at least two alignments of at least two pluralities of NDE datasets, each of the pluralities of NDE datasets associated with respective inspections. As such, at least one trend associated with lack of coverage between the at least two alignments may indicate an area that has repeatedly lacked coverage over a plurality of inspections. This information may be subsequently provided to inspectors to relieve the deficiencies. To detail the at least one trend in coverage, a display representation illustrating the at least one trend in coverage may be generated on the simulated model (block 938). For example, when the trend in coverage indicates that an area is consistently associated with NDE data over the at least two inspections, a corresponding area on the simulated model associated therewith may be colored a first color, such as green. However, when the trend in coverage indicates that an area is inconsistently associated with NDE data over at least two inspections, a corresponding area on the simulated model associated therewith may be colored a second color, such as yellow or red. It will be appreciated that trends in coverage may be illustrated in various shades of colors on the simulated model, and the three colors discussed above are not intended to be limiting.

Although FIG. 48 refers to first and/or second NDE data, one having ordinary skill in the art will appreciate that one dataset of NDE data or a plurality of datasets of NDE data may be analyzed to determine the coverage thereof. Similarly, although FIG. 50 refers to determining at least one trend in coverage in relation to previous alignments with separate pluralities of NDE datasets, one having ordinary skill in the art will appreciate that the at least one trend may be determined in relation to the currently aligned plurality of NDE datasets. Similarly, although FIG. 50 refers to pluralities of NDE datasets, one having ordinary skill in the art will appreciate that an inspection may include only one dataset of NDE data, and thus the determination of at least one trend in coverage of the simulated model may be performed in relation to at least one previous alignment with a separate NDE dataset.

Further details and embodiments of the present invention will be described by way of the following examples.

Example 1

Figure 26:
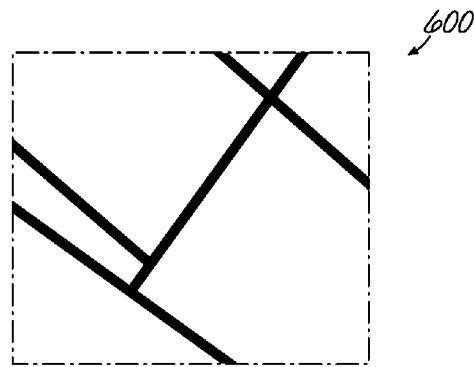
FIG. 26 is a display representation of at least a portion of a dataset of NDE data consistent with embodiments of the invention.
Figure 27:
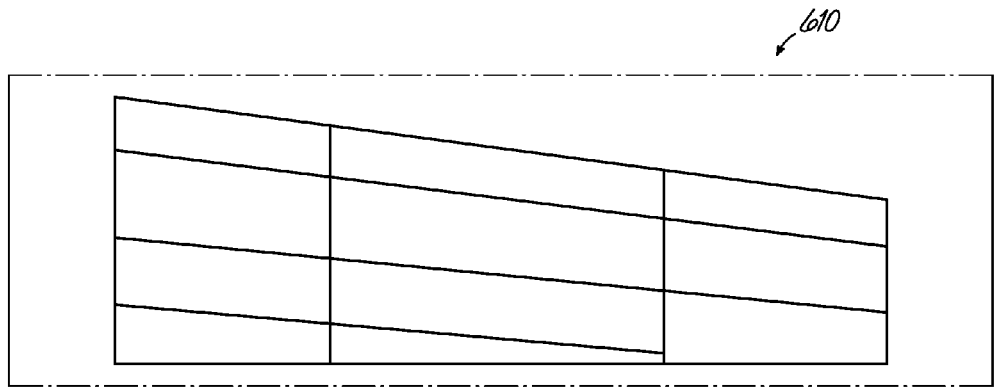
FIG. 27 is a display representation of a simulated model consistent with embodiments of the invention.
Figure 28:
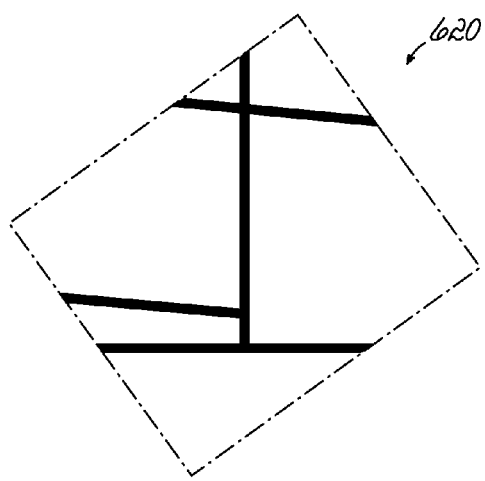
FIG. 28 is a display representation of the NDE data of FIG. 26 rotated to align with the simulated model of FIG. 27.
Figure 29:
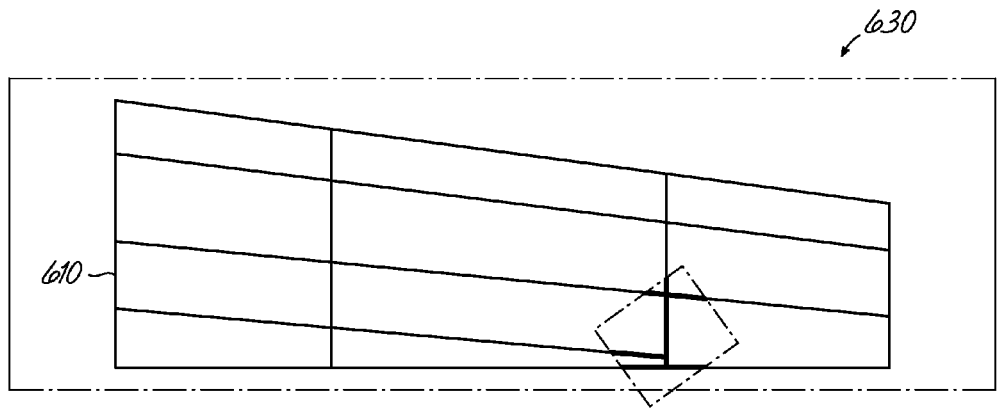
FIG. 29 is a display representation of the aligned NDE data of FIG. 28 on the simulated model of FIG. 27.

By way of example, FIG. 26 illustrates a display representation of at least a portion of a dataset of NDE data 600 that may be captured consistent with embodiments of the invention. In particular, the NDE data 600 of FIG. 26 may be captured from at least a portion of an asset, and for this example may be captured from at least a portion of a right wing of an aircraft. FIG. 27 illustrates a display representation of a simulated model 610 of that right wing of the aircraft. Consistent with embodiments of the invention, it may be advantageous to align the NDE data 600 on the simulated model 610. As such, an alignment algorithm to align the NDE data 600 to the simulated model 610 may be determined from the NDE data 600 and/or inspection information associated therewith. The NDE data 600 may then be automatically aligned to the simulated model 610 with that alignment algorithm. FIG. 28 illustrates a display representation of aligned NDE data 620, and in particular illustrates the NDE data 600 of FIG. 26 rotated to align with the simulated model 610 of FIG. 27. FIG. 29 is a display representation 630 that visually represents the aligned NDE data 620 of FIG. 28 on the simulated model 610 of FIG. 27.

It will be appreciated by one having skill in the art that a plurality of datasets of NDE data may be automatically aligned with the simulated model 610 without departing from the scope of the invention. Subsequently, a display representation of the plurality of aligned datasets of NDE data on the simulated model may be generated. Thus, first and second NDE data may be received, a first alignment algorithm to align the first and second NDE data to the simulated model may be determined, and the first and second NDE data may be automatically aligned to the simulated model. A display representation of the simulated model with the first and second NDE data may be generated. In some embodiments, a second alignment algorithm to align the second NDE data may be determined and the second NDE data may be automatically aligned to the simulated model. In those embodiments, the display representation of the simulated model with the first and second NDE data may still be generated.

Example 2

Figure 30:
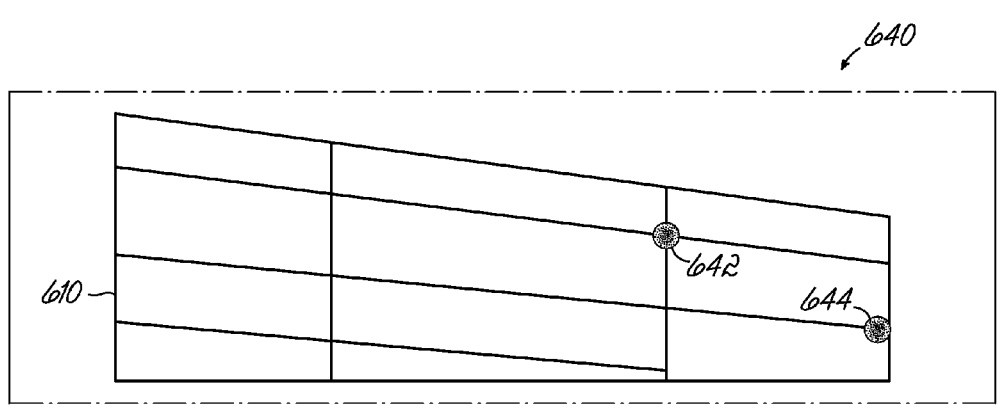
FIG. 30 is a display representation that illustrates an uncertainty of a determined location for an indication on the simulated model of FIG. 27 by displaying a probability density of the location at the location.

Due to the capture and transformation of NDE data, the exact location of an indication may be unknown, and the approximate location of an indication may be represented. By way of example, FIG. 30 illustrates a display representation 640 that illustrates uncertainty of a determined location for an indication on a simulated model 610. The display representation 640 visually represents two indications as at 642 and 644, and more specifically illustrates a probability density as at 642 and 644 of a distance from the determined location for the indication. Simply put, the closer to the center of the probability density 642 and/or 644 (e.g., which may be a Gaussian distribution density), the more likely that is the actual location of the indication. For example, NDE data and/or inspection information may indicate the location of an indication. The location of the indication may thus be indicated as a point on the simulated model 610 and/or a probability density 642, 644 at the point. In this manner, relative locations of indications may be determined.

Figure 31:
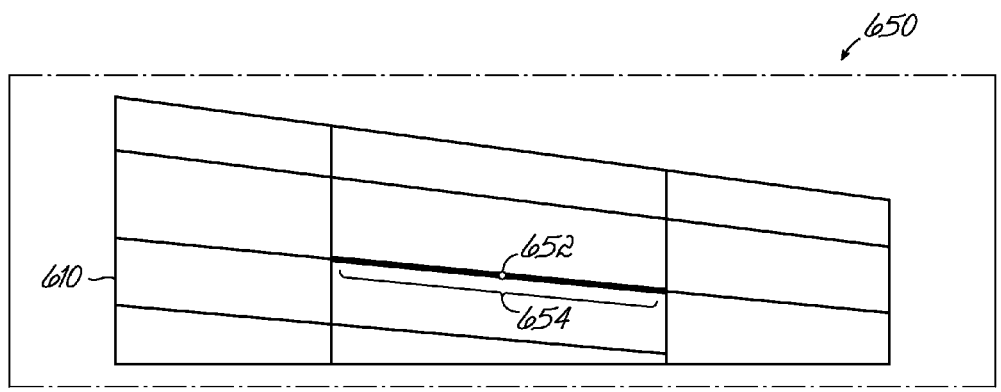
FIG. 31 is a display representation that illustrates an uncertainty of a determined location for an indication on the simulated model of FIG. 27 by adjusting a color component of at least a portion of the simulated model at the location.

Similarly, and by way of an alternative example, FIG. 31 illustrates a display representation 650 that illustrates an uncertainty of a determined location for an indication on a simulated model 610. The display representation 650 visually represents an indication as at 652, and more specifically illustrates that at least a portion 654 of the simulated model 610 may be highlighted to indicate that the portion 654 is associated with an uncertainty of the exact location for the indication 652. Specifically, a color component of at least a portion 654 of the simulated model 610 may be adjusted to indicate that the portion 654 is associated with an uncertainty of the exact location for the indication 652. For example, NDE data and/or inspection information may indicate the location of an indication. The location of the indication may thus be indicated as a point 652 on the simulated model 610 and/or as a portion 654 of the simulated model 610.

Example 3

Figure 32:
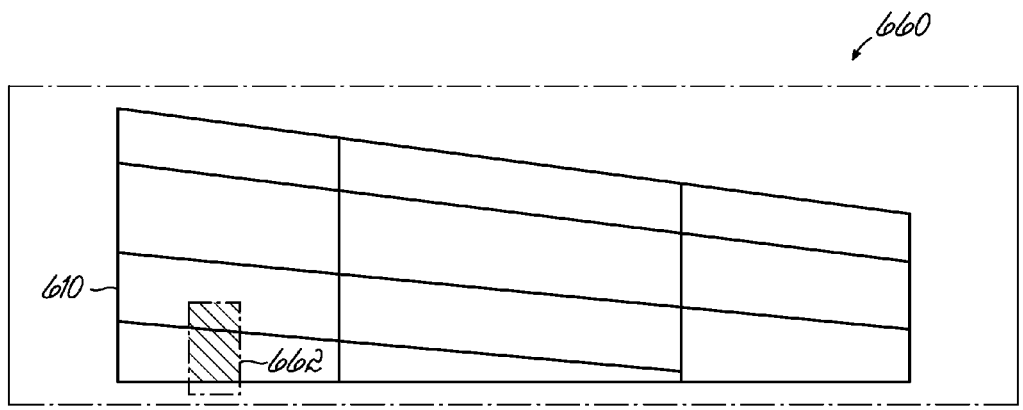
FIG. 32 is a display representation that illustrates a display representation of the simulated model of FIG. 27 in which a color component of at least a portion of a background of the display representation has been adjusted to indicate a lapse in coverage of aligned NDE data with the simulated model.
Figure 33:
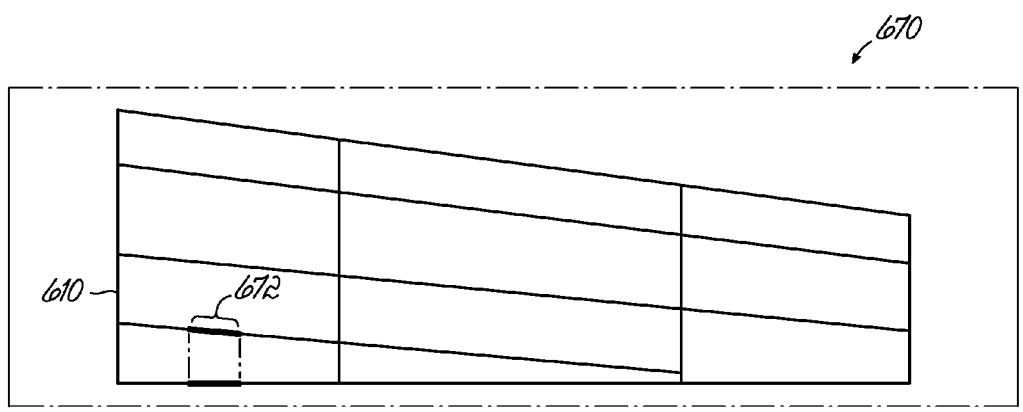
FIG. 33 is a display representation that illustrates a display representation 670 in which a color component of at least a portion of the simulated model of FIG. 27 has been adjusted to indicate a lapse in coverage of aligned NDE data with the simulated model.

During inspection of an asset, at least a portion of NDE data for the asset may not be captured, leading to lapses in coverage. For example, an inspection may involve capturing a plurality of datasets of NDE data from a plurality of portions of an asset. In some embodiments, the inspection involves capturing NDE data from overlapping portions of an asset. However, when a portion of the asset is not captured, there is a lapse of coverage of the asset. As such, embodiments of the invention are configured to indicate that at least a portion of the simulated model is not aligned with NDE data. By way of example, FIG. 32 illustrates a display representation 660 of the simulated model 610 in which at least a portion of the display representation 662, and specifically at least a portion of the background thereof, has been highlighted to indicate a lapse in coverage of aligned NDE data with the simulated model 610. In specific embodiments, the color component of the portion of the display representation 662 that aligned NDE data on the simulated model 610 is supposed to cover, but that is otherwise not covered, may be adjusted. In this manner, the lapse in coverage may be easily located. By way of alternative example, FIG. 33 illustrates a display representation 670 in which at least a portion 672 of the simulated model 610 has been highlighted to indicate a lapse in coverage of aligned NDE data with the simulated model 610. In specific embodiments, the color component of the portion 672 of the simulated model 610 may be adjusted.

Example 4

Figure 34:
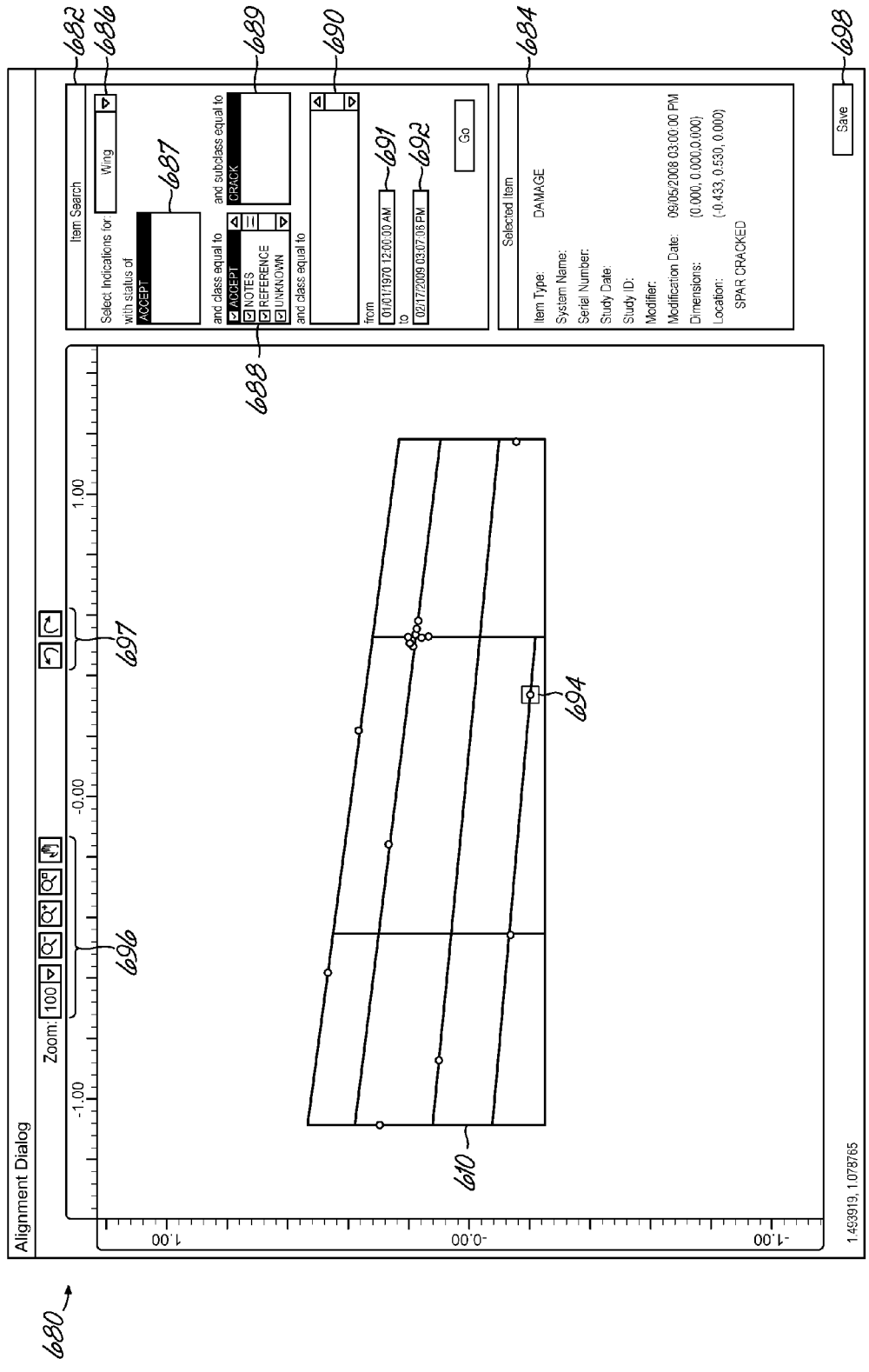
FIG. 34 is a display representation of the simulated model of FIG. 27 in which a plurality of indications have been visually represented.

In some embodiments, it may be advantageous to illustrate a plurality of indications of a plurality of portions of the same type of asset, such as indicate a plurality of indications of a right wing of a fleet of similar aircraft. As such, embodiments of the invention are configured to determine at least one indication, and a location thereof, associated with NDE data and/or inspection information from the plurality of portions of the same type of asset. Embodiments of the invention are further configured to visually represent that at least one indication on the NDE data of the plurality of portions of the same type of asset and/or visually represent that at least one indication on a simulated model associated with the plurality of portions of the same type of asset. Indications may be searched and/or selectively filtered and a display representation may visually represent the searched and/or selectively filtered indications. By way of example, FIG. 34 illustrates a display representation 680 of the simulated model 610 in which a plurality of indications have been visually represented. The plurality of indications may be from a plurality of portions of the same type of asset, and thus illustrated on the simulated model 610 associated with that portion of the same type of asset. Specifically, the display representation 680 illustrates a search and filter component 682 (hereinafter, "search/filer" component 682) and a selected indication information component 684. In some embodiments, the user may interact with the search/filter component 682 to search through and/or selectively filter the plurality of indications. At least one searched and/or filtered indication may then be displayed. As illustrated in FIG. 34, the search/filter component 682 includes selectable components 686-689 (e.g., components that search and/or filter indications based on that selection) as well as specifiable components 690-692 (e.g., components that search and/or filter indications based on the data entered into those components).

As illustrated in FIG. 34, the selected indication information component 684 illustrates information associated with a selected indication as at 694. It will be appreciated that the selected indication information component 684 may populate information fields with information from the NDE data and/or inspection information associated with the selected indication 694 automatically in response to user interaction to select the selected indication 694. In addition to the search/filter component 682 and the selected indication information component 684, the display representation 680 may also include controls 696-697 to enlarge, reduce, pan and/or rotate the visual representation of the simulated model 610 and the indications. A button to save the current alignment, including saving the current zoom level, rotation, searched and/or filtered indications, as well as other alignment information, may be provided as at 698.

Example 5

Figure 35:
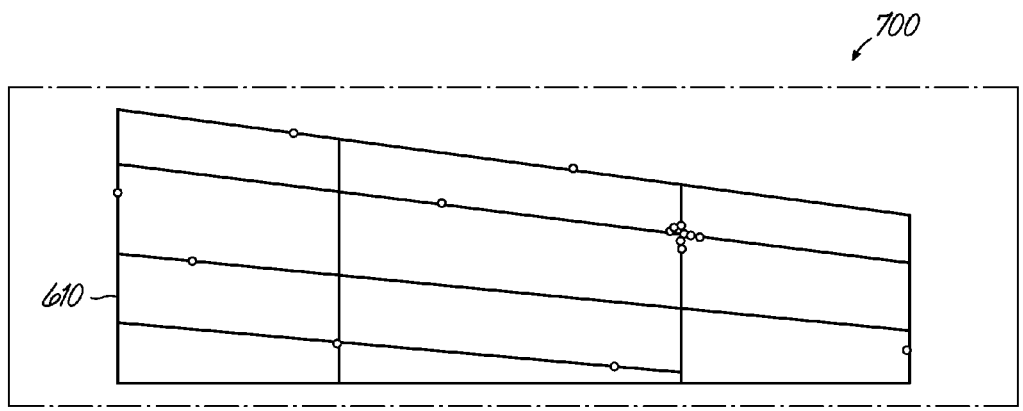
FIG. 35 is a display representation of the simulated model of FIG. 27 in which a first plurality of indications have been visually represented.
Figure 36:
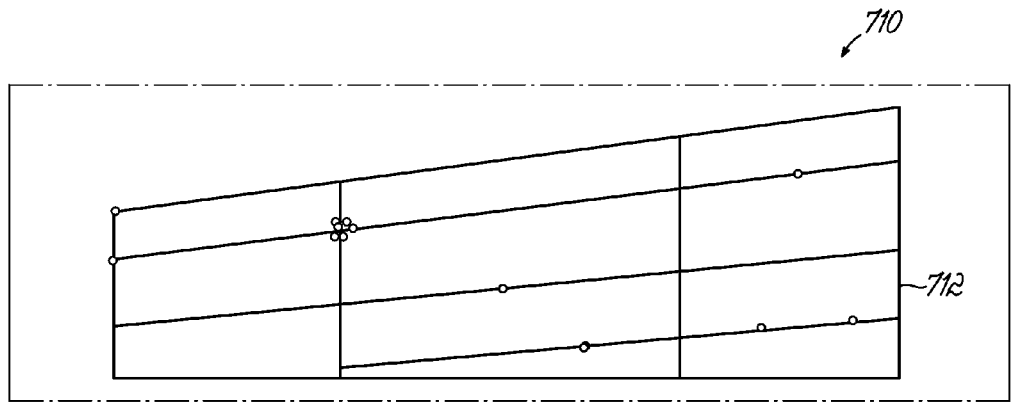
FIG. 36 is a display representation of a second simulated model in which a second plurality of indications have been visually represented consistent with embodiments of the invention.
Figure 37:
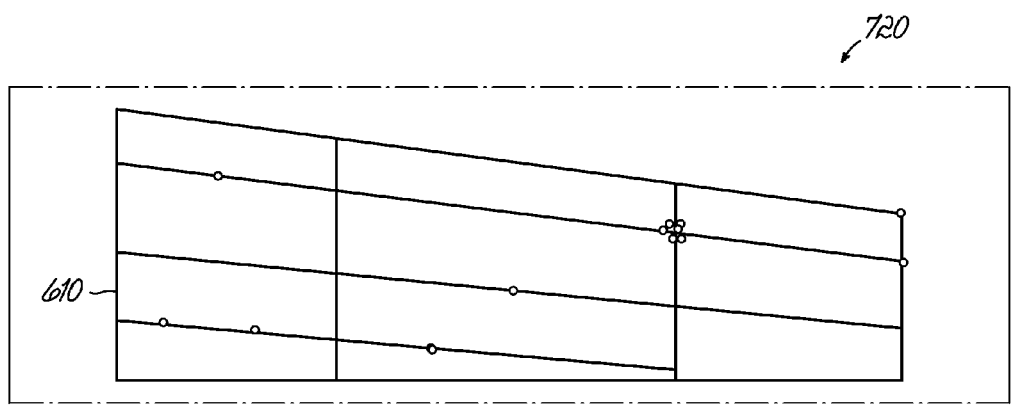
FIG. 37 is a display representation of the second plurality of indications visually represented on the simulated model of FIG. 27.
Figure 38:
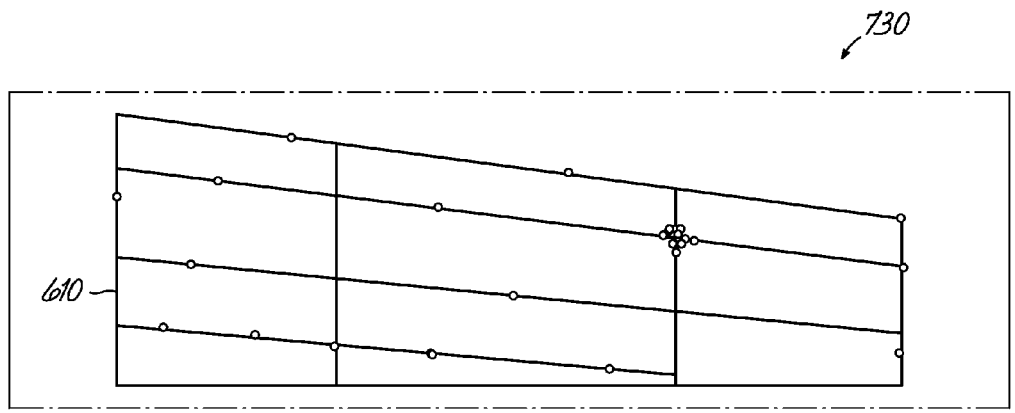
FIG. 38 is a display representation of the first plurality of indications of FIG. 35 and the second plurality of indications of FIG. 37 visually represented on the simulated model of FIG. 27.

In some embodiments, it may be advantageous to translate the location of at least one indication associated with a first part of an asset to a substantially symmetrical location on a second part of an asset, the second part of the asset being substantially symmetrical to the first part of the asset. For example, it may be advantageous to view indications associated with a left wing and a right wing on a simulated model of either the left or right wings. By way of example, FIG. 35 is a display representation 700 of the simulated model 610 in which a first plurality of indications have been visually represented. The simulated model 610 of FIG. 35 is associated with right wing of an aircraft. FIG. 36, on the other hand, is a display representation 710 of a simulated model 712 in which a second plurality of indications have been visually represented. The simulated model 712 of FIG. 36 is associated with a left wing of an aircraft. It may be advantageous to view the first and second plurality of indications on the same simulated model. As such, the locations for each of the second plurality of indications on the simulated model 712 of FIG. 36 may be transformed to locations on the simulated model 610. FIG. 37 is a display representation 720 illustrating the second plurality of indications at their transformed locations on the simulated model 610. The second plurality of indications may then be visually represented with the first plurality of indications to view trends in indications across the substantially symmetrical first and second parts of the asset. To that end, FIG. 38 is a display representation 730 of the first and second plurality of indications on the simulated model 610.

Although not illustrated, one having ordinary skill in the art will appreciate that the location of one indication may be transformed from a second part of an asset to a first part of an asset substantially symmetrical with the second part. Thus, although Example 5 is disclosed with regard to a first and second plurality of indications, it will be appreciated that at least one indication for either of the first and second parts may be transformed without departing from the scope of the invention. Moreover, one having ordinary skill in the art will appreciate that indications may be shown on simulated models associated with either the first or second substantially similar part consistent without departing from the scope of the invention.

Example 6

Figure 39:
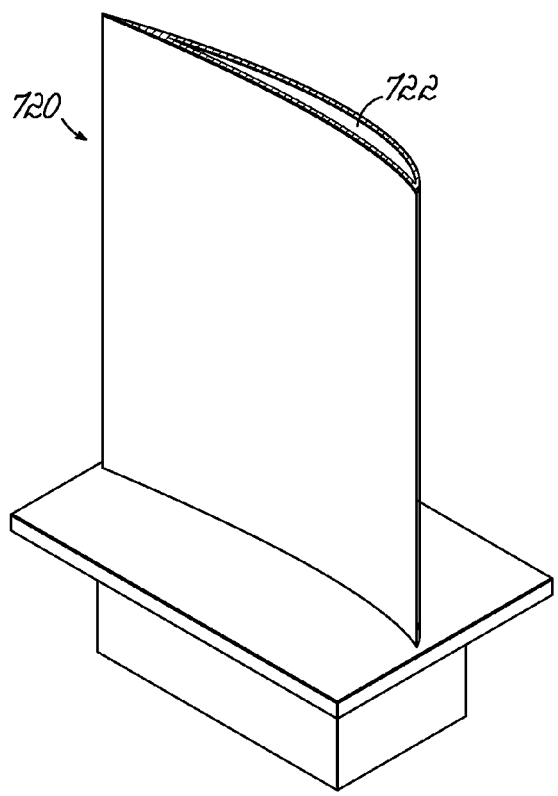
FIG. 39 is a diagrammatic illustration of at least a portion of a fan blade of a jet engine.

In some embodiments, it may be advantageous to align a first dataset of NDE data with a second dataset of NDE data to determine the location of an indication of a potential problem with either the first or second datasets of NDE data. By way of example, FIG. 39 is a diagrammatic illustration of at least a portion of a fan blade 720 of a jet engine. In some configurations, at least a portion of the fan blade 720 is hollow as indicated at void 722. Inasmuch as the fan blade 720 is configured to withstand harsh conditions during its use, imperfections in the fan blade 720 may be intolerable. As such, after fabrication of a fan blade 720, it may be desirable to inspect the fan blade 720. Thus, the fan blade 720 may be inspected by various NDE data collection devices.

Figure 40:
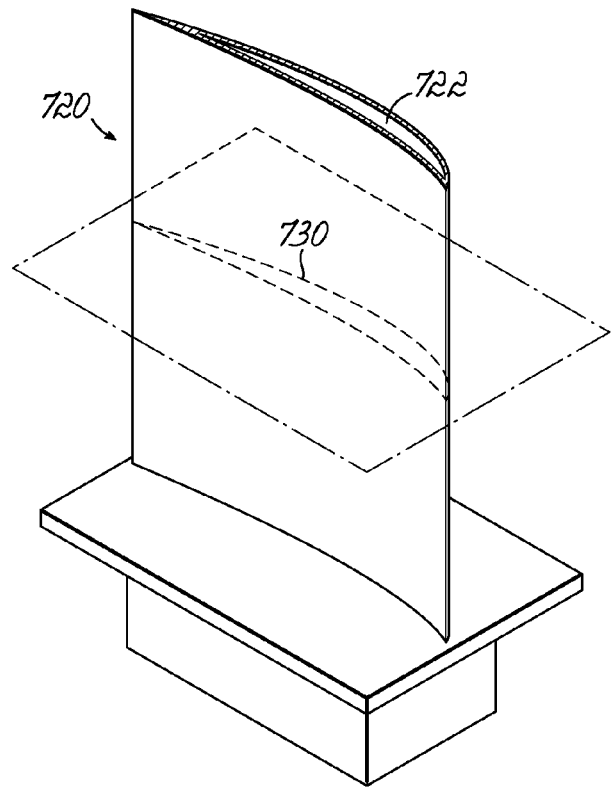
FIG. 40 is a diagrammatic illustration of the fan blade of FIG. 39 and the location of a CT slice taken through the fan blade consistent with embodiments of the invention.
Figure 41:
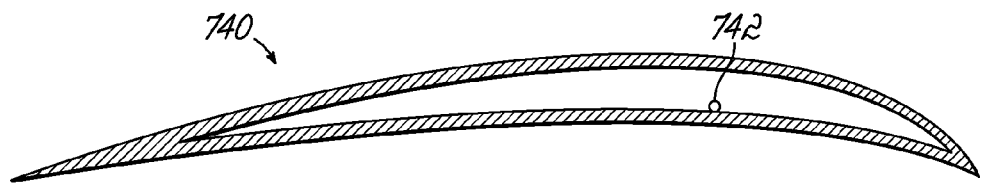
FIG. 41 is a display representation of at least a portion of a dataset of NDE data associated with the CT slice of FIG. 40.

In some embodiments, the fan blade 720 may be inspected through computed tomography ("CT") to produce a plurality of slices of the blade that indicate the external and internal characteristics of that fan blade at that slice. By way of example, FIG. 40 is a diagrammatic illustration of the fan blade 720 and the location of a CT slice as at 730 taken through the fan blade 720. FIG. 41 is a display representation of at least a portion of a dataset of NDE data 740 associated with the CT slice 730. As illustrated in FIG. 41, the NDE data 740 may be associated with at least one indication 742 of a potential problem. In particular, and as illustrated, the indication 742 may be internal to the fan blade 720 and, for example, may be an accumulation of material on the inner surface of the fan blade 720.

Figure 42:
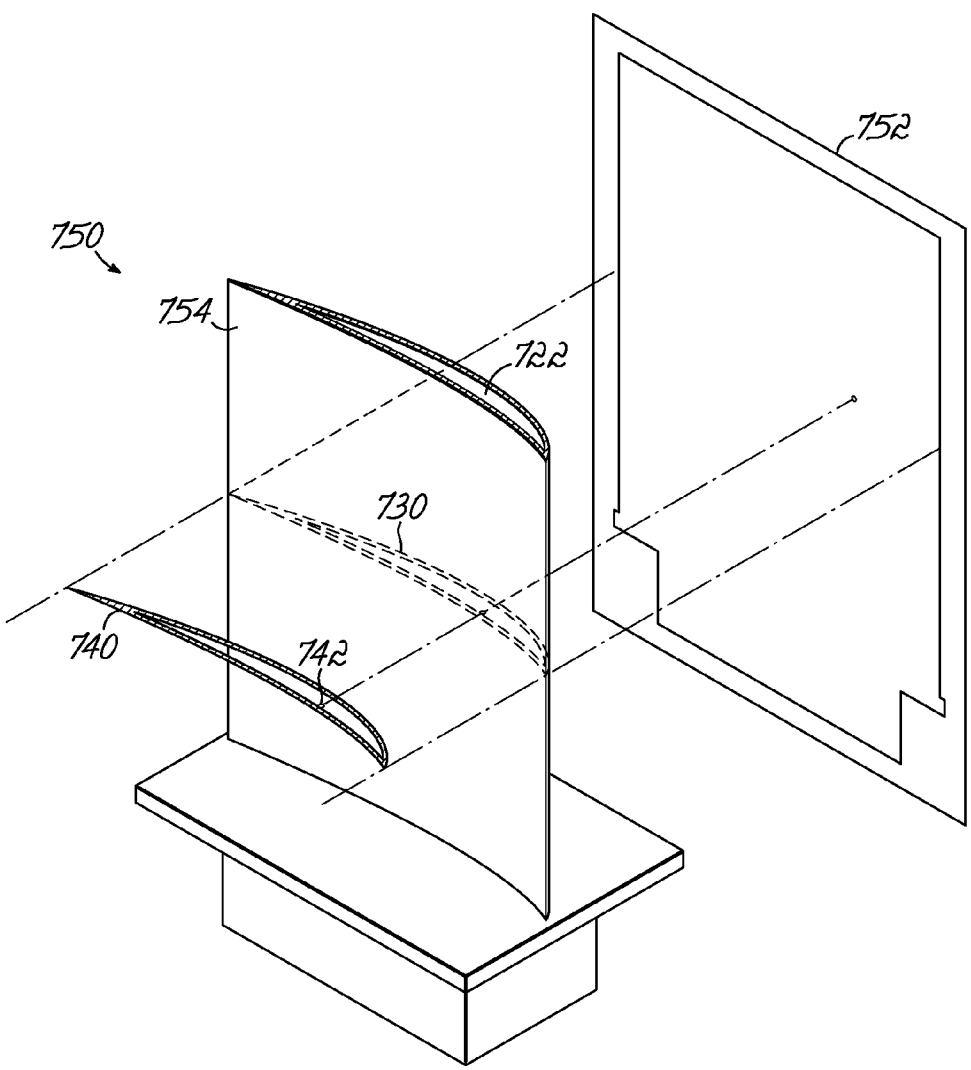
FIG. 42 is a diagrammatic illustration of a projection of the NDE data of FIG. 41 through a second dataset of NDE data associated with the fan blade of FIG. 39 and a three-dimensional simulated model of the fan blade of FIG. 39.
Figure 43A:
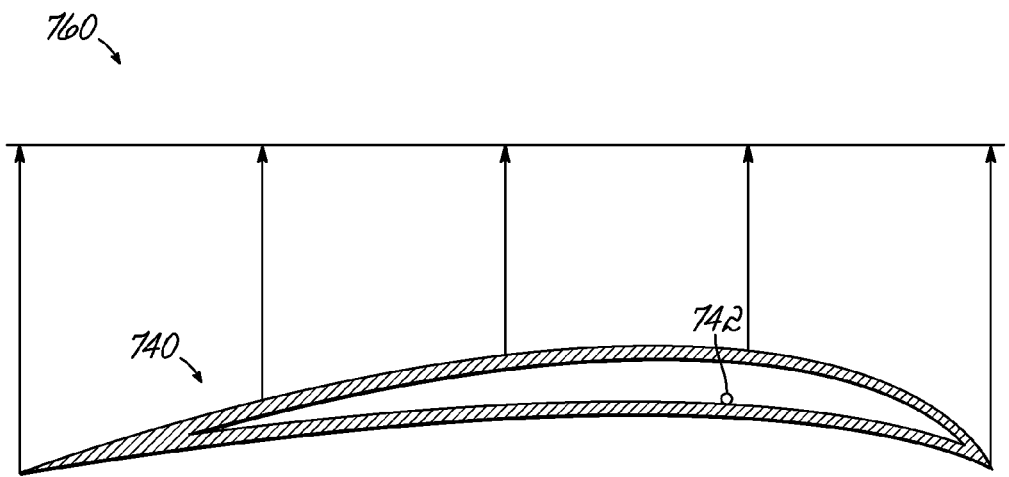
FIG. 43A and FIG. 43B are respective projections of the NDE data of FIG. 41 through the second dataset of NDE data and/or the simulated model of FIG. 42.
Figure 43B:
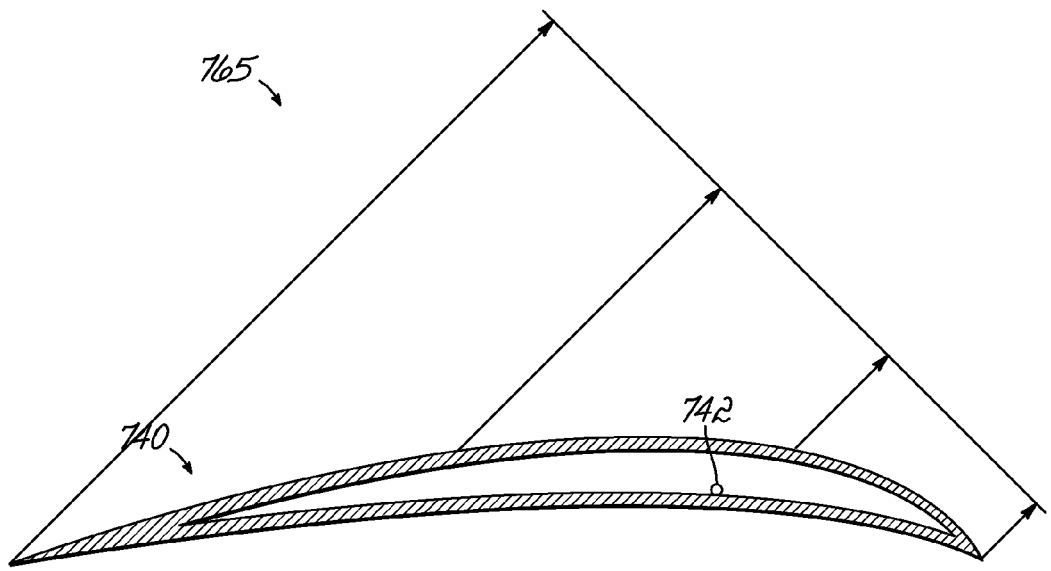

After capturing the NDE data 740, it may be advantageous to align the NDE data 740 (e.g., first NDE data 740) with additional NDE data (e.g., second NDE data) and/or a simulated model associated with the fan blade 720. Specifically, it may be desirable to associate the first NDE data 740 with the second NDE data and determine the location of the indication 742 on both. To associate the datasets of NDE data, a plurality of projections of the first NDE data 740 through the second NDE data may be generated. By way of example, FIG. 42 is a diagrammatic illustration 750 of a projection of the first NDE data 740 through second NDE data of the fan blade 752 (e.g., an x-ray of the fan blade 720 face-on) and a three-dimensional simulated model of the fan blade 754 while FIG. 43A and FIG. 43B are respective projections 760 and 765 of the first NDE data 740 through the second NDE data 752 illustrating various manners in which the first NDE data 740 may be projected through the second NDE data 752 and/or simulated model 754. A projection of the first NDE data 740 that results in an acceptable alignment on the second NDE data 752 and/or simulated model 754 may be chosen. In this manner, the location of the indication 742 on the second NDE data 752 and/or the simulated model 754 may be determined. It will be appreciated that FIGS. 39-42 and FIGS. 43A and 43B are merely exemplary to illustrate the process to align first NDE data to second NDE data and/or a simulated model associated with both the first and second NDE data. Thus, it will be appreciated that FIGS. 39-42 and FIGS. 43A and 43B may or may not be displayed consistent with embodiments of the invention, and as such the FIGS. 39-42 and FIGS. 43A and 43B are merely illustrated of the applicants' broader inventive concept.

Example 7

Figure 44:
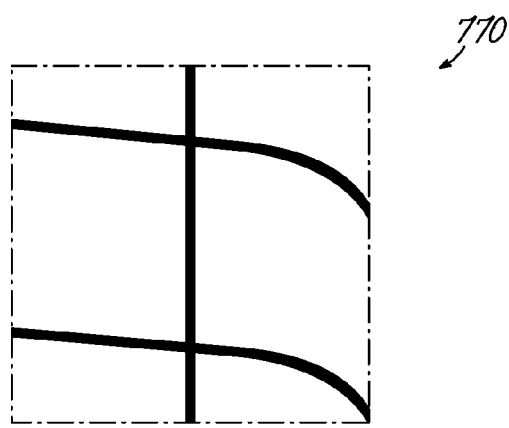
FIG. 44 is a display representation of at least a portion of a dataset of distorted NDE data consistent with embodiments of the invention.
Figure 45:
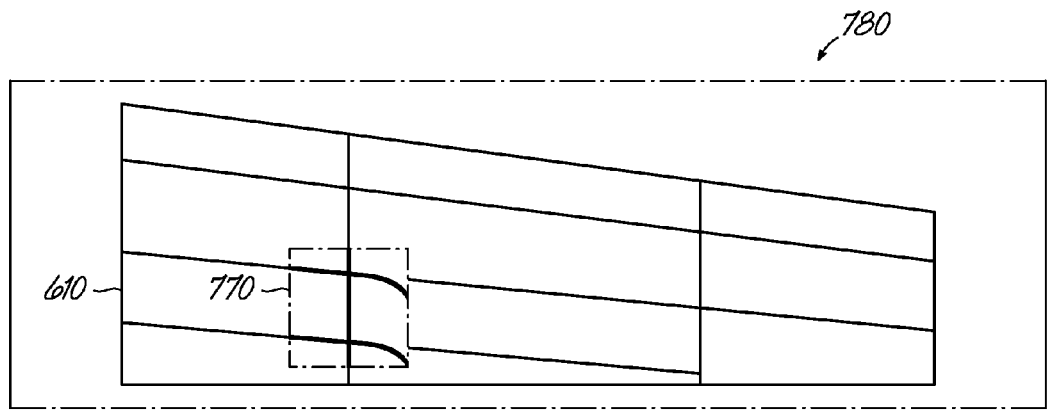
FIG. 45 is a display representation of the distorted NDE data of FIG. 44 aligned with and on the simulated model of FIG. 27.
Figure 46:
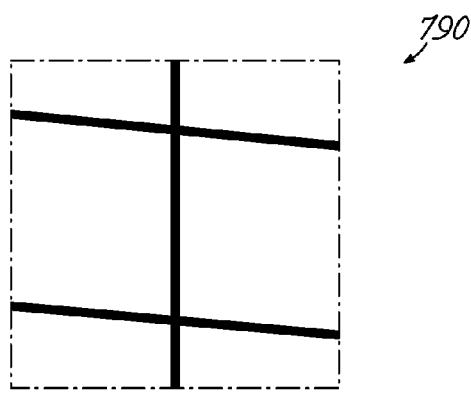
FIG. 46 is a display representation of the distorted NDE data of FIG. 44 after at least a portion thereof has been adjusted consistent with embodiments of the invention.
Figure 47:
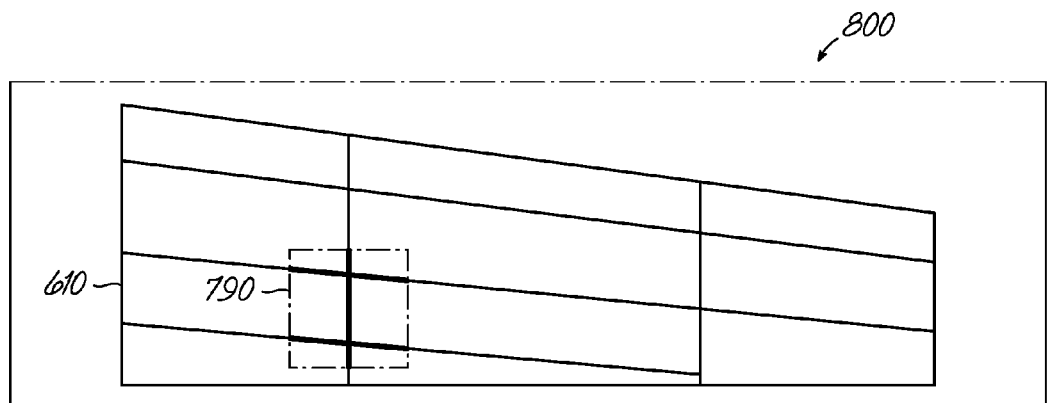
FIG. 47 is a display representation of the adjusted NDE data of FIG. 46 aligned with and on the simulated model of FIG. 27.

In some embodiments, it may be advantageous to distort at least a portion of captured NDE data. By way of example, FIG. 44 is a display representation of NDE data 770 and FIG. 45 is a display representation 780 the aligned NDE data 770 of FIG. 45 aligned with a simulated model 610 consistent with embodiments of the invention. However, it may be determined that the aligned NDE data 770 does not completely align with the simulated model 610. As such, and consistent with embodiments of the invention, at least a portion of the NDE data 770 may be determined to be locally distorted. As such, the local distortion may be analyzed to determine whether can be adjusted with a non-rigid alignment algorithm and/or a local deformation algorithm. The local distortion may then be adjusted. FIG. 46 is a display representation of NDE data that has had at least a portion adjust to account for local distortion 790 (e.g., "adjusted" NDE data 790). Specifically, FIG. 46 illustrates the NDE data 770 of FIG. 45 after it the local distortion thereof has been adjusted. It will be appreciated that the adjusted NDE data 790 may be re-aligned with the simulated model 610. FIG. 47 is a display representation 800 of the adjusted NDE data 790 aligned with the simulated model 610 consistent with embodiments of the invention.

While the present invention has been illustrated by a description of the various embodiments and the examples, and while these embodiments have been described in considerable detail, it is not the intention of the applicants to restrict or in any way limit the scope of the appended claims to such detail. Additional advantages and modifications will readily appear to those skilled in the art. For example, one having skill in the art will appreciate that multiple filters may be used without departing from the scope of the invention. Moreover, one having skill in the art will appreciate that a plurality of datasets of NDE data from a plurality of portions of a plurality of assets over a plurality of sessions may be filtered as well as searched without departing from the scope of the invention, and thus embodiments of the invention should not be limited to the filtering and searching examples disclosed herein.

Additionally, and regarding highlighting a lapse in coverage, one having ordinary skill will appreciate that the lapse in coverage may be alternatively indicated other than adjusting a color component of a display representation. For example, the lapse in coverage may indicated by circling or otherwise drawing a line around the boundary of an area of a display representation associated with missing coverage, applying a texture or pattern to an area of a display representation associated with missing coverage, or other manners in highlighting an area of a display representation associated with missing coverage. Moreover, and regarding determining missing coverage, one having ordinary skill will appreciate that "coverage" may refer to selective coverage or one or more portions of an asset. It may be advantageous to merely determine if specific parts of a portion of an asset are covered. Thus, "coverage" may refer to whether specific parts of a portion of an asset are associated with NDE data. For example, it may be advantageous to determine if specific fasteners associated with a wing of an airplane are each associated with NDE data. As such, "coverage" of the fasteners may include datasets of NDE data associated the fasteners and their immediate surroundings, but otherwise fail to include portions of the wing that are not salient to the coverage analysis. Thus, one having skill in the art will appreciate that determining coverage of a simulated model may include determining coverage of one or more distinct portions of the simulated model while ignoring other portions of the simulated model.

Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of managing non-destructive evaluation (NDE) data in a system of the type that includes at least one processing unit and a memory, the method comprising:
   receiving NDE data for at least a portion of an asset;
   receiving inspection information associated with the at least a portion of the asset;
   determining at least one alignment algorithm to align the NDE data to a simulated model of the at least a portion of the asset based upon at least one of the NDE data and the inspection information;
   automatically aligning the NDE data to the simulated model with the at least one alignment algorithm; and
   analyzing the aligned NDE data on the simulated model to determine coverage of the simulated model by the NDE data, wherein analyzing the aligned NDE data on the simulated model to determine the coverage of the simulated model by the NDE data includes determining whether a portion of the simulated model is associated with a corresponding portion of the NDE data, wherein coverage at a point is determined when a projection intersects both the aligned NDE data and the simulated model at the point.

2. The method of claim 1, further comprising:
   determining an area of at least a portion of the simulated model that is covered with the aligned NDE data.

3. The method of claim 2, further comprising:
   indicating a statistical measure of coverage of the simulated model with the aligned NDE data based at least in part upon the area that is covered.

4. The method of claim 2, further comprising:
   indicating a statistical measure of coverage of the at least a portion of the simulated model with the aligned NDE data based at least in part upon the area that is covered.

5. The method of claim 1, further comprising:
   determining an area of at least a portion of the simulated model that is not covered with the aligned NDE data.

6. The method of claim 5, further comprising:
   indicating a statistical measure of the lack of coverage of the simulated model with the aligned NDE data based at least in part upon the area that is not covered.

7. The method of claim 5, further comprising:
   indicating a statistical measure of the lack of coverage of the at least a portion of the simulated model with the aligned NDE data based at least in part upon the area that is not covered.

8. The method of claim 1, further comprising:
   determining whether the coverage of the simulated model satisfies a predetermined condition related to the coverage thereof.

9. The method of claim 1, further comprising:
   in response to user interaction with at least a second portion of the simulated model that is not associated with aligned NDE data, selectively determining at least one dataset of NDE data that should have been associated with that second portion.

10. The method of claim 1, further comprising:
    in response to user interaction with at least a second portion of the simulated model that is not associated with aligned NDE data, selectively determining information about at least one dataset of NDE data that should have been associated with that second portion.

11. The method of claim 1, wherein analyzing the aligned NDE data on the simulated model to determine the coverage of the simulated model by the NDE data includes:
    determining the location of a vertex of the simulated model; and
    determining whether a portion of the NDE data is aligned with the vertex of the simulated model.

12. The method of claim 1, wherein analyzing the aligned NDE data on the simulated model to determine the coverage of the simulated model by the NDE data includes:
    determining a statistical measure of the coverage of the simulated model by the NDE data.

13. The method of claim 1, wherein analyzing the aligned NDE data on the simulated model to determine the coverage of the simulated model by the NDE data includes:
    utilizing a floodfill algorithm to determine a boundary of at least a portion of the simulated model; and
    determining whether an area of the simulated model defined by the boundary is associated with at least a portion of the NDE data.

14. The method of claim 1, wherein analyzing the aligned NDE data on the simulated model to determine the coverage of the simulated model by the NDE data includes:
    detecting a feature associated with the simulated model; and
    determining whether the feature is associated with a corresponding feature of the NDE data.

15. The method of claim 1, wherein analyzing the aligned NDE data on the simulated model to determine the coverage of the simulated model by the NDE data includes:

determining a plurality of features associated with the simulated model; and determining whether the NDE data is associated with a corresponding number of plurality of features.

16. The method of claim 1, wherein analyzing the aligned NDE data on the simulated model to determine the coverage of the simulated model by the NDE data includes:

establishing a region of the simulated model to determine coverage thereof, the region defined by a boundary; and determining whether an area within the boundary of the region is associated with at least a portion of the NDE data.

17. The method of claim 1, wherein analyzing the aligned NDE data on the simulated model to determine the coverage of the simulated model by the NDE data includes:

establishing a boundary of a region of the simulated model to determine the coverage thereof; and determining whether the boundary of the region is associated with a corresponding boundary in the NDE data.

18. The method of claim 1, wherein analyzing the aligned NDE data on the simulated model to determine the coverage of the simulated model by the NDE data includes:

establishing a boundary of a region on the simulated model; and determining whether data associated with the boundary of the region is associated with corresponding data associated with a corresponding boundary of a region in the NDE data.

19. The method of claim 1, wherein automatically aligning the NDE data to the simulated model includes:

transforming a coordinate system of the NDE data to a coordinate system for the simulated model.

20. A method of managing non-destructive evaluation (NDE) data in a system of the type that includes at least one processing unit and a memory, the method comprising:

receiving NDE data for at least a portion of an asset;

receiving inspection information associated with the at least a portion of the asset;

determining at least one alignment algorithm to align the NDE data to a simulated model of the at least a portion of the asset based upon at least one of the NDE data and the inspection information;

automatically aligning the NDE data to the simulated model with the at least one alignment algorithm; and analyzing the aligned NDE data on the simulated model to determine coverage of the simulated model by the NDE data, wherein analyzing the aligned NDE data on the simulated model to determine the coverage of the simulated model by the NDE data includes determining a statistical measure of the coverage of the simulated model by the NDE data, wherein the statistical measure includes a degree of overlap statistic.

21. The method of claim 20, further comprising:

determining an area of at least a portion of the simulated model that is covered with the aligned NDE data.

22. The method of claim 20, further comprising:

determining an area of at least a portion of the simulated model that is not covered with the aligned NDE data; and indicating a statistical measure of the lack of coverage of the at least a portion of the simulated model with the aligned NDE data based at least in part upon the area that is not covered.

23. The method of claim 20, further comprising:

determining whether the coverage of the simulated model satisfies a predetermined condition related to the coverage thereof.

24. The method of claim 20, wherein analyzing the aligned NDE data on the simulated model to determine the coverage of the simulated model by the NDE data includes:

detecting a feature associated with the simulated model; and determining whether the feature is associated with a corresponding feature of the NDE data.

25. A method of processing non-destructive evaluation (NDE) data in a system of the type that includes at least one processing unit and a memory, the method comprising:

retrieving NDE data for at least a portion of an asset, the NDE data having previously been aligned to a simulated model of the at least a portion of the asset;

determining coverage of the simulated model by the NDE data, wherein determining the coverage of the simulated model by the NDE data includes determining whether a portion of the simulated model is associated with a corresponding portion of the NDE data, and wherein determining the coverage of the simulated model by the NDE data includes:

establishing a region of the simulated model to determine coverage thereof, the region defined by a boundary; and determining whether an area within the boundary of the region is associated with at least a portion of the NDE data.

26. The method of claim 25, wherein determining the coverage of the simulated model by the NDE data includes determining a statistical measure of the coverage of the simulated model by the NDE data.

27. A method of processing non-destructive evaluation (NDE) data in a system of the type that includes at least one processing unit and a memory, the method comprising:

retrieving first NDE data for at least a portion of an asset, the first NDE data having previously been aligned to a simulated model of the at least a portion of the asset;

retrieving second NDE data for the at least a portion of the asset, the second NDE data having previously been aligned to the simulated model, wherein the second NDE is for the portion of the asset at a different time from the first NDE data; and determining an indication of a potential problem associated with at least one of the first NDE data and the second NDE data, including determining a trend associated with the indication, wherein the trend is associated with a difference between the first NDE data and the second NDE data over time.

28. An apparatus, comprising:

at least one processing unit;

a memory; and program code resident in the memory and configured upon execution by the at least one processing unit to manage non-destructive evaluation (NDE) data by:

receiving NDE data for at least a portion of an asset;

receiving inspection information associated with the at least a portion of the asset;

determining at least one alignment algorithm to align the NDE data to a simulated model of the at least a portion of the asset based upon at least one of the NDE data and the inspection information;

automatically aligning the NDE data to the simulated model with the at least one alignment algorithm; and analyzing the aligned NDE data on the simulated model to determine coverage of the simulated model by the NDE data, wherein analyzing the aligned NDE data on the simulated model to determine the coverage of the simulated model by the NDE data includes determining whether a portion of the simulated model is associated with a corresponding portion of the NDE data, wherein analyzing the aligned NDE data on the simulated model to determine the coverage of the simulated model by the NDE data includes:

establishing a boundary of a region on the simulated model; and determining whether data associated with the boundary of the region is associated with corresponding data associated with a corresponding boundary of a region in the NDE data.

29. The apparatus of claim 28, wherein the program code is further configured to:

determine an area of at least a portion of the simulated model that is covered with the aligned NDE data.

30. The apparatus of claim 28, wherein the program code is further configured to:

determine an area of at least a portion of the simulated model that is not covered with the aligned NDE data; and indicate a statistical measure of the lack of coverage of the at least a portion of the simulated model with the aligned NDE data based at least in part upon the area that is not covered.

31. The apparatus of claim 28, wherein the program code is further configured to:

determine whether the coverage of the simulated model satisfies a predetermined condition related to the coverage thereof.

32. The apparatus of claim 28, wherein the program code is configured to analyze the aligned NDE data on the simulated model to determine the coverage of the simulated model by the NDE data by:

detecting a feature associated with the simulated model; and determining whether the feature is associated with a corresponding feature of the NDE data.

33. A program product, comprising:

a non-transitory computer readable medium; and program code stored on the non-transitory computer readable medium and configured upon execution by at least one processing unit to manage non-destructive evaluation (NDE) data by:

receiving NDE data for at least a portion of an asset;

receiving inspection information associated with the at least a portion of the asset;

determining at least one alignment algorithm to align the NDE data to a simulated model of the at least a portion of the asset based upon at least one of the NDE data and the inspection information;

automatically aligning the NDE data to the simulated model with the at least one alignment algorithm; and analyzing the aligned NDE data on the simulated model to determine coverage of the simulated model by the NDE data, wherein analyzing the aligned NDE data on the simulated model to determine the coverage of the simulated model by the NDE data includes determining a statistical measure of the coverage of the simulated model by the NDE data, wherein the statistical measure includes a variability of overlap over time.

34. The apparatus of claim 33, wherein the program code is further configured to:

determine an area of at least a portion of the simulated model that is covered with the aligned NDE data.

35. The apparatus of claim 33, wherein the program code is further configured to:

determine an area of at least a portion of the simulated model that is not covered with the aligned NDE data; and indicate a statistical measure of the lack of coverage of the at least a portion of the simulated model with the aligned NDE data based at least in part upon the area that is not covered.

36. The apparatus of claim 33, wherein the program code is further configured to:

determine whether the coverage of the simulated model satisfies a predetermined condition related to the coverage thereof.

37. The apparatus of claim 33, wherein the program code is configured to analyze the aligned NDE data on the simulated model to determine the coverage of the simulated model by the NDE data by:

detecting a feature associated with the simulated model; and determining whether the feature is associated with a corresponding feature of the NDE data.

* * * * *